US012796288B2

(12) United States Patent
Bang et al.

(10) Patent No.: US 12,796,288 B2
(45) Date of Patent: Nov. 10, 2026

(54) DISPLAY APPARATUS INCLUDING PERIPHERAL AREA POWER SUPPLY LINE

(71) Applicant: Samsung Display Co., Ltd., Yongin-si (KR)

(72) Inventors: Kiho Bang, Yongin-si (KR); Jongmin Lee, Yongin-si (KR); Jinsuk Lee, Yongin-si (KR); Kohei Ebisuno, Yongin-si (KR); Eunhye Kim, Yongin-si (KR); Eunae Jung, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 603 days.

(21) Appl. No.: 18/197,593

(22) Filed: May 15, 2023

(65) Prior Publication Data

US 2023/0380245 A1 Nov. 23, 2023

(30) Foreign Application Priority Data

May 17, 2022 (KR) ........................ 10-2022-0060447
Aug. 17, 2022 (KR) ........................ 10-2022-0102922

(51) Int. Cl.
*H10K 59/80* (2023.01)
*H10K 59/131* (2023.01)
(Continued)

(52) U.S. Cl.
CPC ......... *H10K 59/873* (2023.02); *H10K 59/131* (2023.02); *H10K 59/40* (2023.02);
(Continued)

(58) Field of Classification Search
CPC .. H10K 50/844; H10K 59/873; H10K 59/131; H10K 59/40; H10K 59/12; H10K 59/124; H10K 59/122; H10K 59/1213
See application file for complete search history.

(56) References Cited

U.S. PATENT DOCUMENTS 11,114,510 B2 * 9/2021 Gwon .................. G06F 3/0412
11,476,442 B2 10/2022 Bang et al.
(Continued)

FOREIGN PATENT DOCUMENTS

CN 210429887 U * 4/2020 ............ H10K 59/12
CN 215008275 U 12/2021
(Continued)

*Primary Examiner* — Ida M Soward
(74) *Attorney, Agent, or Firm* — Womble Bond Dickinson (US) LLP

(57) ABSTRACT

A display apparatus includes a substrate having a display area and a peripheral area, an inorganic insulating layer, a light-emitting diode in, an encapsulation layer including a first inorganic encapsulation layer, a second inorganic encapsulation layer on the first inorganic encapsulation layer, and an organic encapsulation layer between the first inorganic encapsulation layer and the second inorganic encapsulation layer, a dam arranged in the peripheral area, and a power supply line on the inorganic insulating layer in the peripheral area, wherein a portion of the power supply line overlaps the dam, the first inorganic encapsulation layer and the second inorganic encapsulation layer extend to the peripheral area and cover the portion of the power supply line, and an edge of the portion of the power supply line overlaps at least one conductive layer on the second inorganic encapsulation layer.

21 Claims, 30 Drawing Sheets

(51) Int. Cl.

| | |
|---|---|
| ***H10K 59/40*** | (2023.01) |
| *H10K 50/844* | (2023.01) |
| *H10K 59/12* | (2023.01) |
| *H10K 59/121* | (2023.01) |
| *H10K 59/122* | (2023.01) |
| *H10K 59/124* | (2023.01) |

(52) U.S. Cl.

CPC ........... *H10K 50/844* (2023.02); *H10K 59/12* (2023.02); *H10K 59/1213* (2023.02); *H10K 59/122* (2023.02); *H10K 59/124* (2023.02)

(56) References Cited

U.S. PATENT DOCUMENTS

| | | | | |
|---|---|---|---|---|
| 11,581,376 | B2 | 2/2023 | Bang et al. | |
| 2017/0179432 | A1 | 6/2017 | Visweswaran et al. | |
| 2019/0214446 | A1* | 7/2019 | Kim | H10D 86/411 |
| 2019/0229175 | A1 | 7/2019 | Lhee et al. | |
| 2019/0305072 | A1* | 10/2019 | Park | G09G 3/3225 |
| 2019/0319212 | A1* | 10/2019 | Park | H10K 59/121 |
| 2019/0355930 | A1* | 11/2019 | Lee | H10K 50/844 |
| 2020/0006461 | A1* | 1/2020 | Cho | H10K 59/1213 |
| 2020/0042123 | A1* | 2/2020 | Kim | G06F 3/0443 |
| 2020/0044193 | A1* | 2/2020 | Kim | H10K 50/844 |
| 2020/0073500 | A1* | 3/2020 | Jeong | G06F 3/0412 |
| 2020/0083314 | A1* | 3/2020 | Choi | H10K 59/1213 |
| 2020/0271983 | A1* | 8/2020 | Lee | G02B 1/11 |
| 2020/0287164 | A1 | 9/2020 | Choi et al. | |
| 2020/0310576 | A1* | 10/2020 | Bok | G06F 3/0412 |
| 2020/0321402 | A1* | 10/2020 | Jeon | G06F 3/04164 |
| 2020/0381508 | A1 | 12/2020 | Jeon | |
| 2020/0381653 | A1 | 12/2020 | Bang et al. | |
| 2021/0028241 | A1 | 1/2021 | Kim et al. | |
| 2021/0083033 | A1 | 3/2021 | Bang et al. | |
| 2021/0091320 | A1* | 3/2021 | Choi | G06F 1/1626 |
| 2021/0151707 | A1 | 5/2021 | Huang et al. | |
| 2021/0175292 | A1* | 6/2021 | Bang | G06F 3/0446 |
| 2021/0200358 | A1* | 7/2021 | Kim | G06F 3/04164 |
| 2021/0200361 | A1 | 7/2021 | Park et al. | |
| 2021/0265436 | A1* | 8/2021 | Jeon | H10K 59/131 |
| 2021/0273029 | A1 | 9/2021 | Bang et al. | |
| 2021/0376290 | A1 | 12/2021 | Zhang et al. | |
| 2022/0006041 | A1* | 1/2022 | Seo | H10K 50/15 |
| 2022/0187937 | A1* | 6/2022 | Jang | H10K 59/873 |

FOREIGN PATENT DOCUMENTS

| | | | | |
|---|---|---|---|---|
| EP | 3460622 | A2 * | 3/2019 | G06F 1/1637 |
| EP | 3477443 | B1 * | 7/2020 | G06F 3/0446 |
| KR | 10-2019-0090905 | A | 8/2019 | |
| KR | 10-2020-0137071 | A | 12/2020 | |
| KR | 10-2020-0139300 | A | 12/2020 | |
| KR | 10-2021-0011529 | A | 2/2021 | |
| KR | 10-2021-0107218 | A | 9/2021 | |
| KR | 10-2021-0109715 | A | 9/2021 | |

* cited by examiner

DISPLAY APPARATUS INCLUDING PERIPHERAL AREA POWER SUPPLY LINE

CROSS-REFERENCE TO RELATED APPLICATION

The present application claims priority to and the benefit of Korean Patent Application Nos. 10-2022-0060447, filed on May 17, 2022, and 10-2022-0102922, filed on Aug. 17, 2022, in the Korean Intellectual Property Office, the entire disclosures of each of which are incorporated herein by reference.

BACKGROUND

1. Field

Aspects of one or more embodiments relate to a display apparatus.

2. Description of the Related Art

Recently, the various uses of display apparatuses has become more diversified. In addition, as display apparatuses have become relatively thinner and lighter, their range of potential uses has gradually expanded.

Among display apparatuses, an organic light-emitting display apparatus has characteristics such as a relatively wide viewing angle, relatively high contrast, and a relatively fast response speed, and thus, organic light-emitting display apparatuses are in the limelight as next-generation display apparatuses.

Generally, an organic light-emitting display apparatus includes a thin-film transistor and an organic light-emitting diode as a display element over a substrate, and operates while the organic light-emitting diode emits light spontaneously. The organic light-emitting display apparatus is used as a display unit of miniaturized products, such as mobile phones, and used as a display unit of large-scale products, such as televisions.

The above information disclosed in this Background section is only for enhancement of understanding of the background and therefore the information discussed in this Background section does not necessarily constitute prior art.

SUMMARY

One or more embodiments include a display apparatus having a structure robust to moisture permeation from the outside of a display area and having improved reliability. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to one or more embodiments, a display apparatus includes a substrate having a display area and a peripheral area outside the display area, an inorganic insulating layer arranged in the display area and the peripheral area, a light-emitting diode arranged in the display area, an encapsulation layer on the light-emitting diode and including a first inorganic encapsulation layer, a second inorganic encapsulation layer on the first inorganic encapsulation layer, and an organic encapsulation layer between the first inorganic encapsulation layer and the second inorganic encapsulation layer, a dam arranged in the peripheral area and surrounding the display area, and a power supply line on the inorganic insulating layer in the peripheral area, wherein a portion of the power supply line overlaps the dam, the first inorganic encapsulation layer and the second inorganic encapsulation layer extend to the peripheral area and cover the portion of the power supply line, and an edge of the portion of the power supply line overlaps at least one conductive layer on the second inorganic encapsulation layer.

According to some embodiments, the edge of the portion of the power supply line may overlap the at least one conductive layer between the dam and an edge of the substrate.

According to some embodiments, the power supply line may have a triple-layered structure including a first sub-layer, a third sub-layer on the first sub-layer, and a second sub-layer between the first sub-layer and the third sub-layer, wherein the first sub-layer and the third sub-layer may include a same material.

According to some embodiments, the first sub-layer and the third sub-layer of the power supply line may include titanium, and the second sub-layer of the power supply line may include aluminum.

According to some embodiments, the third sub-layer of the power supply line may include a tip protruding laterally from a point where a side surface and an upper surface of the second sub-layer meet each other.

According to some embodiments, the at least one conductive layer may overlap the tip of the power supply line.

According to some embodiments, the display apparatus may further include a touch sensor layer on the encapsulation layer, where the touch sensor layer may include a protective layer, a first touch conductive layer on the protective layer, a first touch insulating layer covering the first touch conductive layer, a second touch conductive layer on the first touch insulating layer, and a second touch insulating layer covering the second touch conductive layer.

According to some embodiments, the at least one conductive layer may include a first conductive layer, wherein the first conductive layer may include a same material as the first touch conductive layer or the second touch conductive layer.

According to some embodiments, the at least one conductive layer may include a first conductive layer and a second conductive layer on the first conductive layer, wherein the first conductive layer may include a same material as the first touch conductive layer, and the second conductive layer may include a same material as the second touch conductive layer.

According to some embodiments, the second conductive layer may be in direct contact with the first conductive layer.

According to some embodiments, at least one of the protective layer, the first touch insulating layer, and the second touch insulating layer may extend to the peripheral area and may be above the portion of the power supply line covered by the first inorganic encapsulation layer and the second inorganic encapsulation layer.

According to some embodiments, the edge of the portion of the power supply line may include protrusion patterns protruding in a direction crossing a direction in which the portion of the power supply line extends in a plan view.

According to some embodiments, the at least one conductive layer may be continuously arranged to overlap an upper surface of the portion of the power supply line, a side surface corresponding to the edge of the portion of the power supply line, and an upper surface of the inorganic insulating layer located below the portion of the power supply line.

According to one or more embodiments, a display apparatus includes a substrate having a display area and a peripheral area outside the display area, an inorganic insulating layer arranged in the display area and the peripheral area, a light-emitting diode arranged in the display area, an encapsulation layer on the light-emitting diode and including a first inorganic encapsulation layer, a second inorganic encapsulation layer on the first inorganic encapsulation layer, and an organic encapsulation layer between the first inorganic encapsulation layer and the second inorganic encapsulation layer, and a conductive line on the peripheral area, wherein the first inorganic encapsulation layer and the second inorganic encapsulation layer pass an edge of the organic encapsulation layer in the peripheral area and cover a portion of the conductive line, the first inorganic encapsulation layer in the peripheral area is in direct contact with a portion of the conductive line and a portion of the inorganic insulating layer, and an edge of the portion of the conductive line in the peripheral area overlaps at least one conductive layer on the second inorganic encapsulation layer.

According to some embodiments, the conductive line may include a power supply line.

According to some embodiments, the display apparatus may further include a dam arranged in the peripheral area, and a bank arranged in the peripheral area, the bank being spaced apart from the dam, wherein the edge of the portion of the conductive line may overlap the at least one conductive layer between the dam and the bank.

According to some embodiments, the conductive line may have a triple-layered structure including a first sub-layer, a third sub-layer on the first sub-layer, and a second sub-layer between the first sub-layer and the third sub-layer, wherein the first sub-layer and the third sub-layer may include a same material.

According to some embodiments, the first sub-layer and the third sub-layer of the conductive line may include titanium, and the second sub-layer of the conductive line may include aluminum.

According to some embodiments, the third sub-layer of the conductive line may include a tip protruding laterally from a point where a side surface and an upper surface of the second sub-layer meet each other.

According to some embodiments, the display apparatus may further include a touch sensor layer on the encapsulation layer, where the touch sensor layer may include a protective layer, a first touch conductive layer on the protective layer, a first touch insulating layer covering the first touch conductive layer, a second touch conductive layer on the first touch insulating layer, and a second touch insulating layer covering the second touch conductive layer.

According to some embodiments, the at least one conductive layer may include a first conductive layer, wherein the first conductive layer may include a same material as the first touch conductive layer or the second touch conductive layer.

According to some embodiments, the at least one conductive layer may include a first conductive layer and a second conductive layer on the first conductive layer, wherein the first conductive layer may include a same material as the first touch conductive layer, and the second conductive layer may include a same material as the second touch conductive layer.

According to some embodiments, at least one of the protective layer, the first touch insulating layer, and the second touch insulating layer may extend to the peripheral area and may be above the portion of the conductive line covered by the first inorganic encapsulation layer and the second inorganic encapsulation layer.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
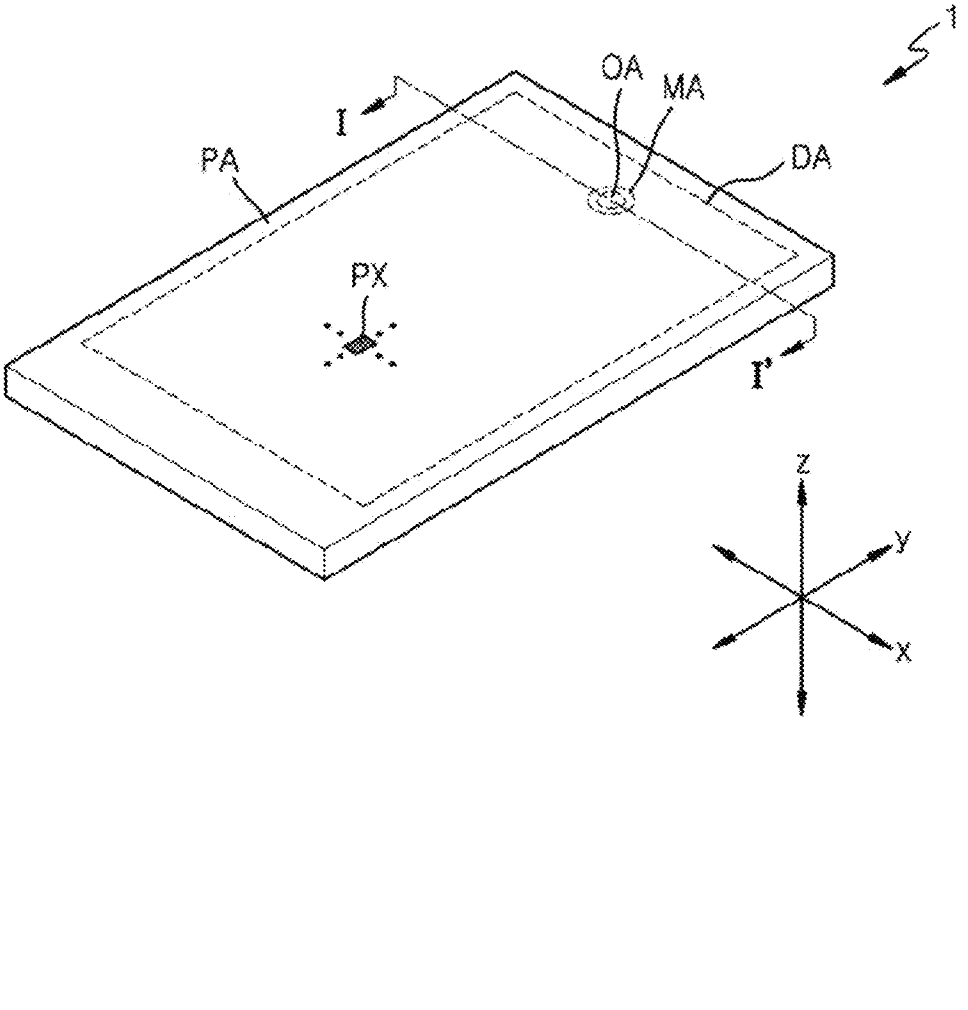
FIG. 1 is a schematic perspective view of a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the specification, the phrase "A and/or B" denotes A, B, or A and B. In addition, the phrase "at least one of A and B" denotes A, B, or A and B.

As used herein, when a wiring is referred to as "extending in a first direction or a second direction," it means that the wiring not only extends in a straight line shape but also extends in a zigzag or in a curve in the first direction or the second direction.

As used herein, "in a plan view" means that an objective portion is viewed from above, and "in a cross-sectional view" means that a cross-section of an objective portion taken vertically is viewed from a lateral side. As used herein, "overlapping" includes overlapping "in a plan view" and "in a cross-sectional view."

Hereinafter, embodiments of the disclosure are described in detail with reference to the accompanying drawings. When description is made with reference to the drawings, like reference numerals are used for like or corresponding elements.

FIG. 1 is a schematic perspective view of a display apparatus 1 according to some embodiments.

According to some embodiments, the display apparatus 1 may display a moving image or a still image and may be used as a display screen of various products, for example, a portable electric apparatus, such as a mobile phone, a smartphone, a tablet personal computer (PC), a mobile communication terminal, a personal digital assistant, an e-book terminal, a portable multimedia player (PMP), a navigation device, or an ultra mobile PC (UMPC), a television (TV), a laptop, a monitor, a billboard, an Internet of things (IoT) device, and the like.

Also, according to some embodiments, the display apparatus 1 may be used in a wearable device, such as a smartwatch, a watch phone, an eyewear display, or a head-mounted display (HMD). Also, according to some embodiments, the display apparatus 1 may be used as a display screen in an instrument cluster of a vehicle, a center Information display (CID) mounted on a center fascia or a dashboard of a vehicle, a room mirror display replacing a side-view mirror of a vehicle, or a car headrest monitor provided for rear-seat entertainment. For convenience of description, FIG. 1 illustrates that the display apparatus 1 is used as a smartphone.

Referring to FIG. 1, the display apparatus 1 may include an opening area OA and a display area DA surrounding the opening area OA. The display apparatus 1 may include an intermediate area MA positioned between the opening area OA and the display area DA, and a peripheral area PA positioned outside the display area DA, for example, surrounding the display area DA. The intermediate area MA may have a closed-loop shape completely surrounding the opening area OA in a plan view.

The opening area OA may be located inside the display area DA. According to some embodiments, the opening area OA may be arranged at an upper center of the display area DA, as shown in FIG. 1. Alternatively, the opening area OA may be arranged in various ways, such as located on the upper left side of the display area DA or located on the upper right side of the display area DA. FIG. 1 illustrates an example in which one opening area OA is arranged. However, according to some embodiments, a plurality of opening areas OA may be provided.

Although it is illustrated in FIG. 1 that the display area DA has a substantially rectangular shape, embodiments according to the present disclosure are not limited thereto. The display area DA may have various shapes, such as a circle, an ellipse, and a polygon.

The display area DA may be an area where an image is displayed, and a plurality of sub-pixels PX may be arranged in the display area DA. Each sub-pixel PX may include a display element, such as an organic light-emitting diode. Each sub-pixel PX may emit, for example, red, green, blue, or white light.

The display area DA may provide a certain image by using light emitted from the sub-pixels PX. In the present specification, the sub-pixel PX may be defined as an emission area where any one of red, green, blue, and white light is emitted, as described above. The peripheral area PA may be an area where no sub-pixels PX are arranged and no images are provided.

Hereinafter, an organic light-emitting display apparatus is described as an example of the display apparatus 1 according to some embodiments. However, the display apparatus 1 is not limited thereto. For example, the display apparatus 1 may be a display apparatus, such as an inorganic light-emitting display apparatus (or an inorganic electroluminescence (EL) display apparatus) or a quantum dot light-emitting display apparatus. For example, an emission layer of a display element included in the display apparatus 1 may include an organic material or an inorganic material. Quantum dots may be located in a path of light emitted from the emission layer.

Figure 2:
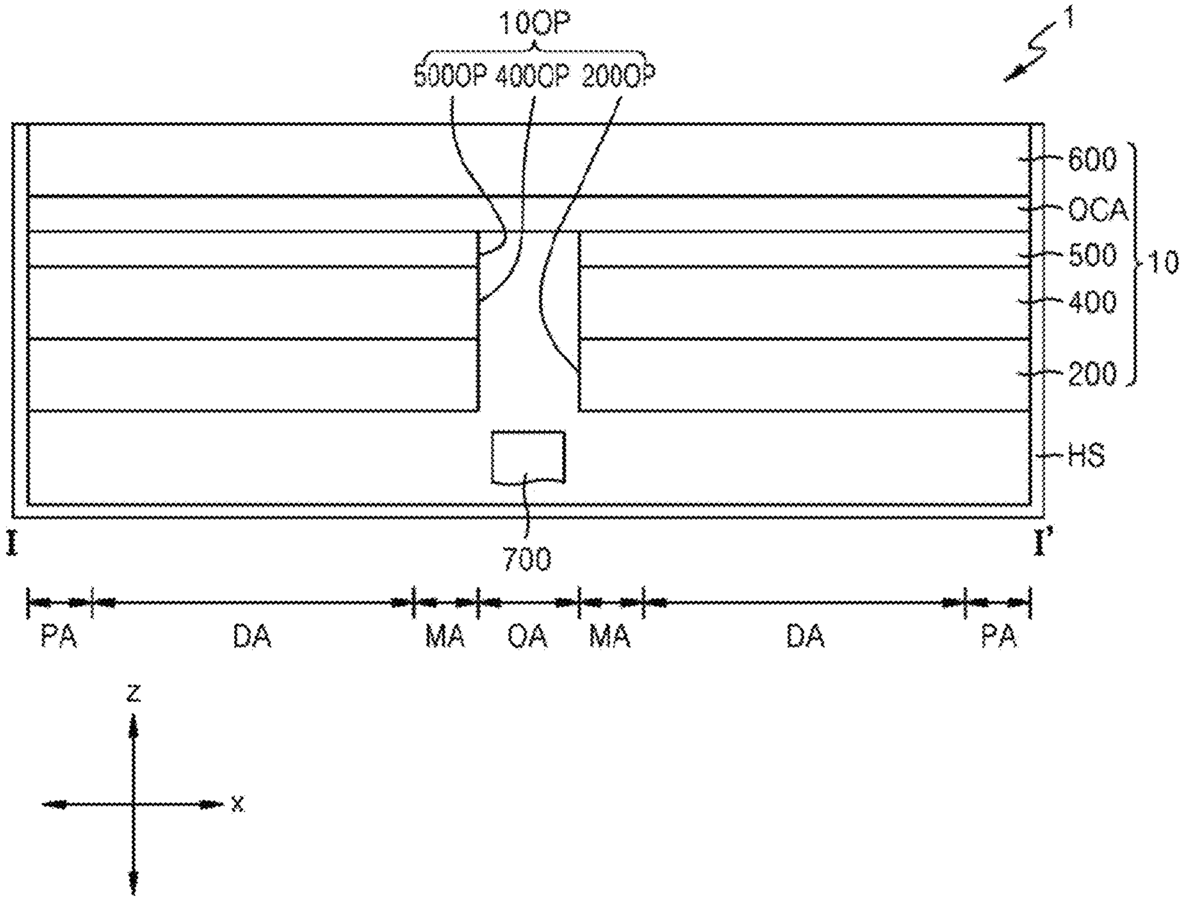
FIG. 2 is a schematic cross-sectional view of a display apparatus according to some embodiments, taken along the line I-I' of FIG. 1.

FIG. 2 is a schematic cross-sectional view of a display apparatus 1 according to some embodiments, taken along the line I-I' of FIG. 1.

Referring to FIG. 2, the display apparatus 1 may include a display panel 10 and a component 700. According to some embodiments, the component 700 may be located under the display panel 10 and may at least partially overlap the opening area OA. The display panel 10 and the component 700 may be accommodated in a housing HS.

The display panel 10 may include an image-generating layer 200, a touch sensor layer 400, an optical functional layer 500, and a cover window 600.

The image-generating layer 200 may include display elements emitting light to display an image. Each of the display elements may include a light-emitting diode, for example, an organic light-emitting diode including an organic emission layer.

The touch sensor layer 400 may acquire coordinate information according to an external input, for example, a touch event. The touch sensor layer 400 may include a sensing electrode or a touch electrode and trace lines connected to the sensing electrode. The touch sensor layer 400 may be located on the image-generating layer 200. The touch sensor layer 400 may sense an external input by using a mutual capacitance method and/or a self-capacitance method.

The touch sensor layer 400 may be directly formed on the image-generating layer 200 or may be separately formed and then coupled to the image-generating layer 200 through an adhesive layer, such as an optical clear adhesive (OCA). For example, the touch sensor layer 400 may be continuously formed after a process of forming the image-generating layer 200. In this case, the adhesive layer may not be arranged between the touch sensor layer 400 and the image-generating layer 200. FIG. 2 illustrates an example in which the touch sensor layer 400 is arranged between the image-generating layer 200 and the optical functional layer 500. However, according to some embodiments, the touch sensor layer 400 may be located on the optical functional layer 500.

The optical functional layer 500 may include an anti-reflection layer. The anti-reflection layer may reduce the reflectance of light (external light) incident toward the display panel 10 from the outside through the cover window 600. The anti-reflection layer may include a retarder and a polarizer. According to some embodiments, the anti-reflection layer may include a black matrix and color filters. The color filters may be arranged by considering the color of light emitted from each of the light-emitting diodes of the image-generating layer 200.

In order to improve the transmittance of the opening area OA, the display panel 10 may include an opening 10OP passing through some of the layers constituting the display panel 10. The opening 10OP may include openings 200OP, 400OP, and 500OP passing through the image-generating layer 200, the touch sensor layer 400, and the optical functional layer 500, respectively. The opening 200OP of the image-generating layer 200, the opening 400OP of the touch sensor layer 400, and the opening 500OP of the optical functional layer 500 may overlap one another to form the opening 10OP of the display panel 10.

The cover window 600 may be located on the optical functional layer 500. The cover window 600 may be coupled to the optical functional layer 500 through an adhesive layer, such as an OCA therebetween. The cover window 600 may cover the opening 200OP of the image-generating layer 200, the opening 400OP of the touch sensor layer 400, and the opening 500OP of the optical functional layer 500. According to some embodiments, the OCA and/or the cover window 600 may also include an opening.

The cover window 600 may include a glass material or a plastic material. The glass material may include ultra-thin glass. The plastic material may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

The opening area OA may be a type of component area (e.g., a sensor area, a camera area, or a speaker area) in which the component 700 for adding various functions to the display apparatus 1 is located.

The component 700 may include an electronic element. For example, the component 700 may be an electronic element using light or sound. For example, the electronic element may include a sensor that uses light, such as an infrared sensor, a camera that captures an image by receiving light, a sensor that measures a distance or recognizes a fingerprint by outputting and sensing light or sound, a small lamp that outputs light, a speaker that outputs sound, or the like. An electronic element using light may use light of various wavelength bands, such as visible light, infrared light, and ultraviolet light. The opening area OA corresponds to an area through which light and/or sound output from the component 700 to the outside or propagating from the outside toward the electronic element may pass.

Figure 3:
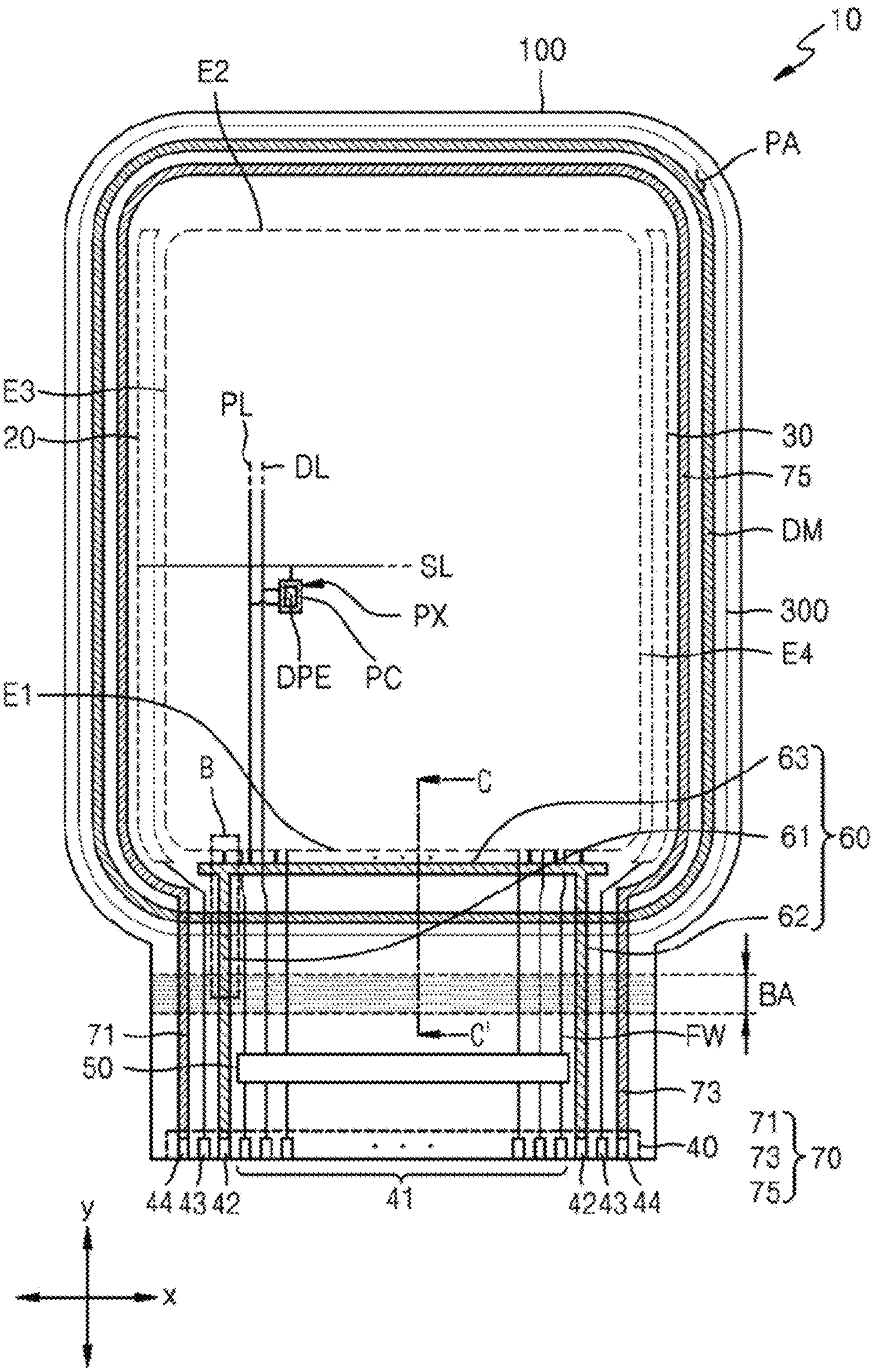
FIG. 3 is a schematic plan view of a display panel according to some embodiments.

FIG. 3 is a schematic plan view of a display panel 10 according to some embodiments.

Referring to FIG. 3, the display panel 10 may include first and second scan drivers 20 and 30, a terminal portion 40, a data driver 50, and a power supply line, which are located on a substrate 100. The power supply line may include a driving voltage supply line 60 and a common voltage supply line 70.

The substrate 100 may include a display area DA and a peripheral area PA outside the display area DA. A portion of the peripheral area PA may extend in one side (e.g., in a y direction). The terminal portion 40, the data driver 50, the driving voltage supply line 60, and the like may be arranged in the peripheral area PA that extends. According to some embodiments, the width, in an x direction, of the peripheral area PA that extends may be less than the width of the display area DA in the x direction.

The substrate 100 may include a bending area BA in which a portion of the peripheral area PA that extends bends. As the peripheral area PA that extends is folded with respect to the bending area BA, the peripheral area PA that extends may partially overlap the display area DA. Through this structure, the peripheral area PA that extends may not be viewed by a user, or even though the peripheral area PA that extends is viewed by a user, a viewed area may be reduced.

A plurality of sub-pixels PX may be arranged in the display area DA. Each of the sub-pixels PX may be implemented by a display element DPE, such as an organic light-emitting diode. Each sub-pixel PX may emit, for example, red, green, blue, or white light.

Each of the sub-pixel circuits PC driving the sub-pixels PX in the display area DA may be connected to a signal line or a voltage line configured to control on/off, luminance, and the like of the display element DPE, for example, a light-emitting diode. For example, FIG. 3 illustrates, as signal lines, a scan line SL extending in a first direction (e.g., the x direction) and a data line DL extending in a second direction (e.g., the y direction), and illustrates a driving voltage line PL as a voltage line.

Each of the sub-pixel circuits PC driving the sub-pixels PX may be electrically connected to external circuits arranged in the peripheral area PA. The first and second scan drivers 20 and 30, the terminal portion 40, the data driver 50, the driving voltage supply line 60, and the common voltage supply line 70 may be arranged in the peripheral area PA.

The first scan driver 20 and the second scan driver 30 may each generate a scan signal and transmit the scan signal to each sub-pixel circuit PC through a scan line SL. According to some embodiments, one of the first scan driver 20 and the second scan driver 30 may apply an emission control signal to each sub-pixel circuit PC through an emission control line. According to some embodiments as illustrated in FIG. 3, a structure in which the first and second scan drivers 20 and 30 are arranged on both sides of the display area DA is illustrated. However, according to some embodiments, scan drivers may be arranged only on one side of the display area DA. The second scan driver 30 may be arranged symmetrically with the first scan driver 20 with respect to the display area DA.

The data driver 50 may generate a data signal and transmit the data signal to each sub-pixel circuit PC through a data line DL. The data driver 50 may be arranged on one side of the display area DA and may be arranged in the extended peripheral area PA below (e.g., the y direction) the display area DA. FIG. 2 illustrates an example in which the data driver 50 is located on the substrate 100. However, according to some embodiments, the data driver 50 may be provided on a flexible printed circuit board connected to the terminal portion 40.

The terminal portion 40 is arranged at one end of the substrate 100 and includes a plurality of terminals 41, 42, 43, and 44. The terminal portion 40 may be exposed without being covered by an insulating layer and electrically connected to a controller, such as a flexible printed circuit board or an integrated circuit (IC) chip. Control signals of the controller may be respectively provided to the first and second scan drivers 20 and 30, the terminal portion 40, the data driver 50, the driving voltage supply line 60, and the common voltage supply line 70 through the terminal portion 40.

The driving voltage supply line 60 may be arranged in the peripheral area PA. The driving voltage supply line 60 may be configured to provide a driving voltage ELVDD to each sub-pixel PX. According to some embodiments, the driving voltage supply line 60 may include a first driving voltage supply line 61, a second driving voltage supply line 62, and a third driving voltage supply line 63. The third driving voltage supply line 63 may extend in the first direction (e.g., the x direction), and the first and second driving voltage supply lines 61 and 62 may extend in the second direction (e.g., the y direction). As an example, the third driving voltage supply line 63 may be arranged along a first edge E1 of the display area DA. According to some embodiments, the first driving voltage supply line 61, the second driving voltage supply line 62, and the third driving voltage supply line 63 may be integrally provided. As an example, the driving voltage supply line 60 may have a 'Π'(pi) shape as one body. However, the disclosure is not limited thereto.

The driving voltage supply line 60 may be arranged in the peripheral area PA and connected to the plurality of driving voltage lines PL extending to the display area DA in the second direction (e.g., the y direction). As an example, the third driving voltage supply line 63 may be connected to the driving voltage line PL crossing the display area DA in the second direction (e.g., the y direction).

The common voltage supply line 70 may be arranged in the peripheral area PA and configured to provide a common voltage ELVSS to each sub-pixel PX. The common voltage supply line 70 may include a first common voltage supply line 71 and a second common voltage supply line 73 arranged adjacent to the first edge E1 of the display area DA. The first common voltage supply line 71 and the second common voltage supply line 73 may each extend in the second direction (e.g., the y direction). The first common voltage supply line 71 may be spaced apart from the second common voltage supply line 73 (e.g., the y direction) in the first direction (e.g., the x direction) crossing the second direction (e.g., the y direction). The first common voltage supply line 71 and the second common voltage supply line 73 may be respectively arranged on two opposite sides of the first edge E1 of the display area DA. However, the disclosure is not limited thereto. The common voltage supply line may further include a third common voltage supply line arranged between the first common voltage supply line 71 and the second common voltage supply line 73. In the case where the common voltage supply line 70 includes the third common voltage supply line arranged between the first common voltage supply line 71 and the second common voltage supply line 73, a current density may be reduced and heat emission may be suppressed upon application of a current compared to the case where only the first common voltage supply line 71 and the second common voltage supply line 73 are provided.

The first common voltage supply line 71 may be connected to the second common voltage supply line 73 by a body portion 75 extending along a second edge E2, a third edge E3, and a fourth edge E4 of the display area DA. According to some embodiments, the first common voltage supply line 71, the second common voltage supply line 73, and the body portion 75 may be integrally formed.

A dam DM may be arranged in the peripheral area PA. The dam DM may be arranged to surround the outer block of the display area DA. The dam DM may be arranged outside the common voltage supply line 70, or arranged to partially overlap the common voltage supply line 70.

An encapsulation layer 300 may be arranged in the display area DA to cover the sub-pixels PX, and a portion of the encapsulation layer 300 may extend to the peripheral area PA. The encapsulation layer 300 has a multi-layered structure including at least one organic encapsulation layer and at least one inorganic encapsulation layer. The dam DM may prevent or reduce instances of an organic encapsulation layer-forming material included in the encapsulation layer 300, diffusing to the edge of the substrate 100, and restrict a forming position of the organic encapsulation layer.

Figure 4:
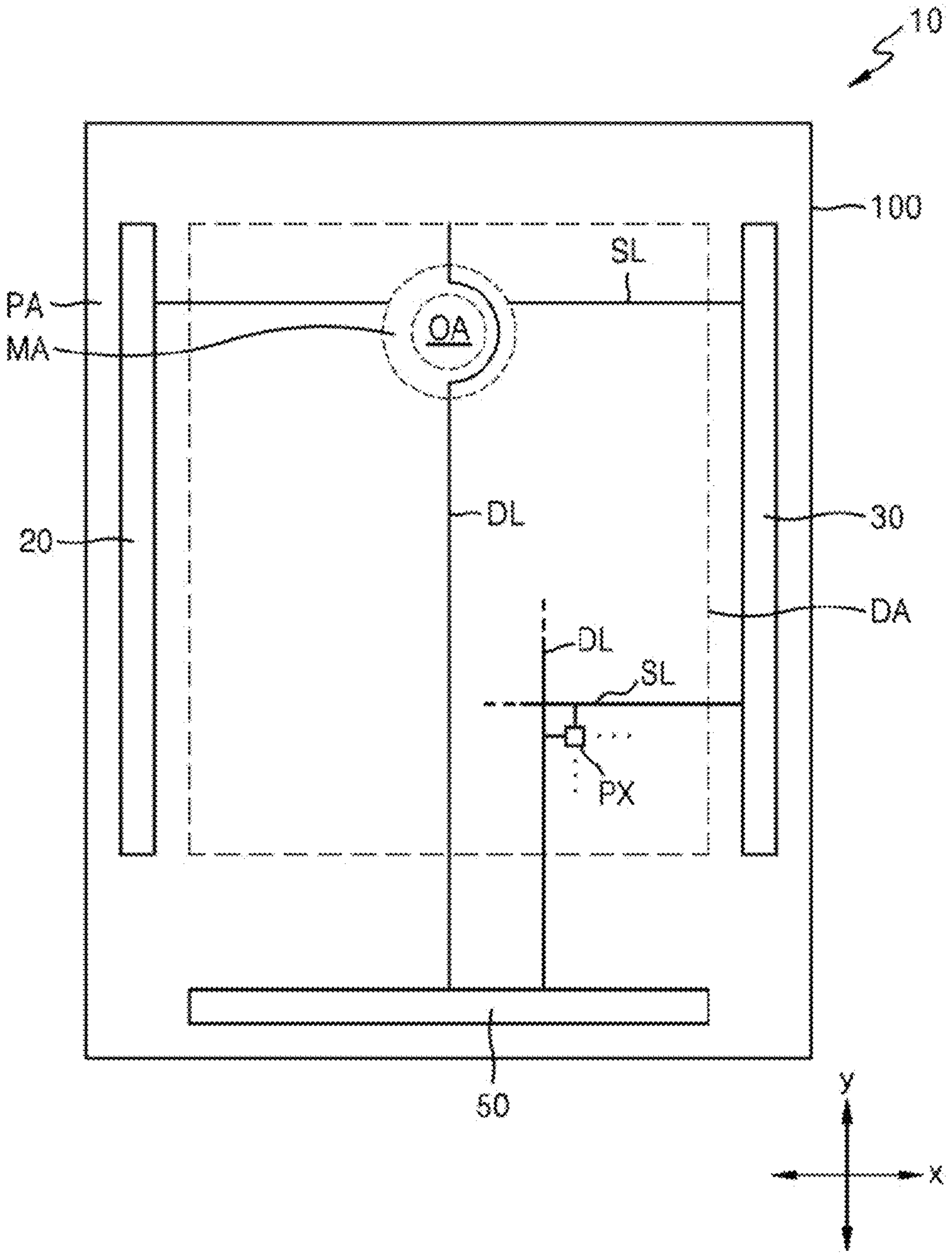
FIG. 4 is a schematic plan view of a display panel according to some embodiments.

FIG. 4 is a schematic plan view of a display panel 10 according to some embodiments.

Referring to FIG. 4, according to some embodiments, the display panel 10 may include an opening area OA, a display area DA, an intermediate area MA, and a peripheral area PA.

As described above, a first scan driver 20 and a second scan driver 30 may be arranged on both sides of the display area DA therebetween. In this case, a sub-pixel PX arranged on the left side with respect to the opening area OA may be connected to the first scan driver 20 arranged on the left side, and a sub-pixel PX arranged on the right side with respect to the opening area OA may be connected to the second scan driver 30 arranged on the right side.

The intermediate area MA may surround the opening area OA. The intermediate area MA is an area in which a display element, such as a light-emitting diode, is not arranged, and signal lines providing signals to the sub-pixels PX provided around the opening area OA may pass through the intermediate area MA. For example, data lines DL and/or scan lines SL may cross the display area DA, and portions of the data lines DL and/or the scan lines SL may detour in the intermediate area MA along the edge of the opening 10OP of the display panel 10 formed in the opening area OA. According to some embodiments, FIG. 4 illustrates an example in which the data lines DL cross the display area DA in the y direction and some data lines DL detour to partially surround the opening area OA in the intermediate area MA. The scan lines SL may cross the display area DA in the x direction and may be spaced apart from each other with the opening area OA therebetween. In other words, the scan lines SL arranged in the same row may be disconnected (or separated) with the opening area OA therebetween.

Figure 5:
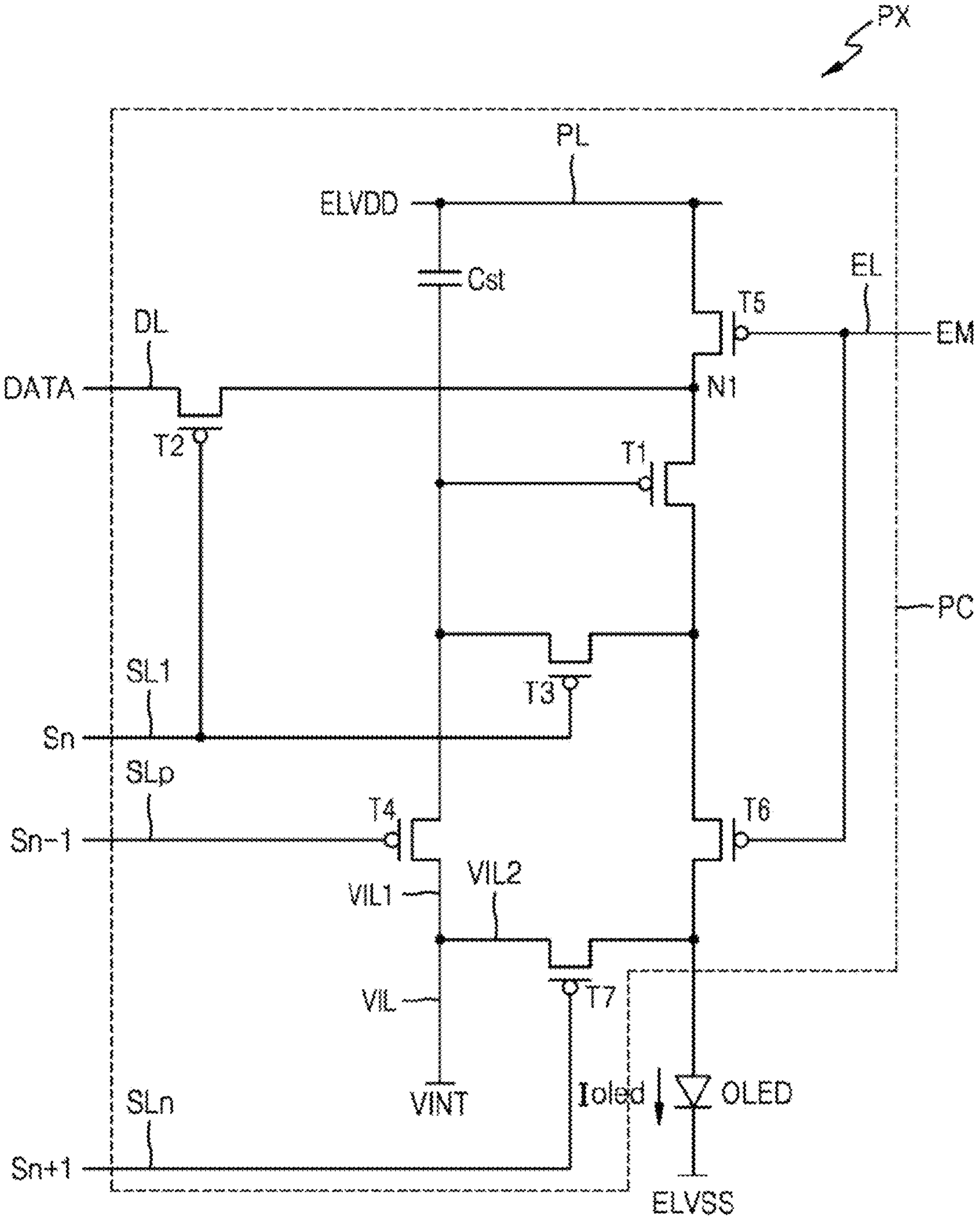
FIG. 5 is an equivalent circuit diagram illustrating a display element of a display apparatus and a sub-pixel circuit electrically connected to the display element, according to some embodiments.
Figure 6:
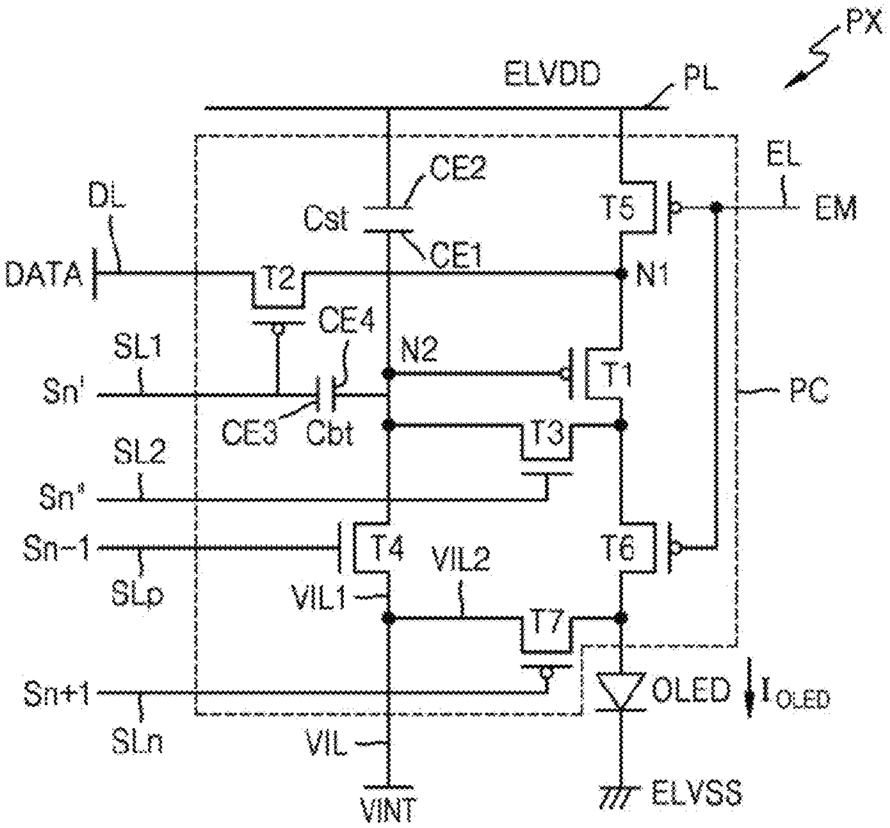
FIG. 6 is an equivalent circuit diagram illustrating a display element of a display apparatus and a sub-pixel circuit electrically connected to the display element, according to some embodiments.

FIGS. 5 and 6 are equivalent circuit diagrams each illustrating a display element of a display apparatus and a sub-pixel circuit electrically connected to the display element, according to some embodiments.

Referring to FIG. 5, one sub-pixel PX may include a sub-pixel circuit PC and an organic light-emitting diode OLED that is a display element electrically connected to the sub-pixel circuit PC.

For example, the sub-pixel circuit PC may include a plurality of thin-film transistors T1 to T7 and a capacitor Cst. According to some embodiments, the plurality of thin-film transistors T1 to T7 may include a driving transistor T1, a switching transistor T2, a compensation transistor T3, a first initialization transistor T4, an operation control transistor T5, an emission control transistor T6, and a second initialization transistor T7. However, the disclosure is not limited thereto.

The organic light-emitting diode OLED may include a sub-pixel electrode and an opposite electrode. The sub-pixel electrode of the organic light-emitting diode OLED may be connected to the driving transistor T1 via the emission control transistor T6 to receive a driving current, and the opposite electrode may be provided with a common voltage ELVSS. The organic light-emitting diode OLED may generate light having luminance corresponding to the driving current.

According to some embodiments, all of the plurality of thin-film transistors T1 to T7 may be PMOS transistors. The plurality of thin-film transistors T1 to T7 may include amorphous silicon or polycrystalline silicon.

Signal lines may include a first scan line SL1, a previous scan line SLp, a subsequent scan line SLn, an emission control line EL, and a data line DL. However, the disclosure is not limited thereto. The first scan line SL1 may be configured to transmit a first scan signal Sn. The previous scan line SLp may be configured to transmit a previous scan signal Sn−1 to the first initialization transistor T4. The subsequent scan line SLn may be configured to transmit a subsequent scan signal Sn+1 to the second initialization transistor T7. The emission control line EL may be configured to transmit an emission control signal EM to the operation control transistor T5 and the emission control transistor T6. The data line DL may be configured to transmit a data signal DATA.

A driving voltage line PL may be configured to transmit a driving voltage ELVDD to the driving transistor T1, and an initialization voltage line VIL may be configured to transmit an initialization voltage VINT for initializing the driving transistor T1 and the organic light-emitting diode OLED to the sub-pixel PX. For example, a first initialization voltage line VIL1 may be configured to transmit the initialization voltage VINT to the first initialization transistor T4, and a second initialization voltage line VIL2 may be configured to transmit the initialization voltage VINT to the second initialization transistor T7.

A driving gate electrode of the driving transistor T1 may be connected to the capacitor Cst, one of a source region and a drain region of the driving transistor T1 may be connected to the driving voltage line PL via the operation control transistor T5 through a first node N1, and the other of the source region and the drain region of the driving transistor T1 may be electrically connected to the sub-pixel electrode of the organic light-emitting diode OLED via the emission control transistor T6. The driving transistor T1 may be configured to receive the data signal DATA according to a switching operation of the switching transistor T2 and supply a driving current Ioled to the organic light-emitting diode OLED.

A switching gate electrode of the switching transistor T2 may be connected to the first scan line SL1 configured to transmit the first scan signal Sn, one of a source region and a drain region of the switching transistor T2 may be connected to the data line DL, and the other of the source region and the drain region of the switching transistor T2 may be connected to the driving transistor T1 through the first node N1 and connected to the driving voltage line PL via the operation control transistor T5. The switching transistor T2 may be configured to be turned on according to the first scan signal Sn received through the first scan line SL1 and transfer the data signal DATA, which is transmitted through the data line DL, to the driving transistor T1 through the first node N1.

A compensation gate electrode of the compensation transistor T3 may be connected to the first scan line SL1. One of a source region and a drain region of the compensation transistor T3 may be connected to the sub-pixel electrode of the organic light-emitting diode OLED via the emission control transistor T6. The other of the source region and the drain region of the compensation transistor T3 may be connected to the capacitor Cst and the driving gate electrode of the driving transistor T1. The compensation transistor T3 may be configured to be turned on according to the first scan signal Sn received through the first scan line SL1 and diode-connect the driving transistor T1.

A first initialization gate electrode of the first initialization transistor T4 may be connected to the previous scan line SLp. One of a source region and a drain region of the first initialization transistor T4 may be connected to the first initialization voltage line VIL1. The other of the source region and the drain region of the first initialization transistor T4 may be connected to a first capacitor electrode CE1 of the capacitor Cst and the driving gate electrode of the driving transistor T1. The first initialization transistor T4 may be configured to be turned on according to the previous scan signal Sn−1 received through the previous scan line SLp and transfer the initialization voltage VINT to the driving gate electrode of the driving transistor T1 to initialize the voltage of the driving gate electrode of the driving transistor T1.

An operation control gate electrode of the operation control transistor T5 may be connected to the emission control line EL, one of a source region and a drain region of the operation control transistor T5 may be connected to the driving voltage line PL, and the other may be connected to the driving transistor T1 and the switching transistor T2 through the first node N1.

An emission control gate electrode of the emission control transistor T6 may be connected to the emission control line EL, one of a source region and a drain region of the emission control transistor T6 may be connected to the driving transistor T1 and the compensation transistor T3, and the other of the source region and the drain region of the emission control transistor T6 may be electrically connected to the sub-pixel electrode of the organic light-emitting diode OLED.

The operation control transistor T5 and the emission control transistor T6 may be simultaneously (or concurrently) turned on according to the emission control signal EM received through the emission control line EL, and thus, the driving voltage ELVDD may be transferred to the organic light-emitting diode OLED to allow the driving current Ioled to flow through the organic light-emitting diode OLED.

A second initialization gate electrode of the second initialization transistor T7 may be connected to the subsequent scan line SLn, one of a source region and a drain region of the second initialization transistor T7 may be connected to the sub-pixel electrode of the organic light-emitting diode OLED, and the other of the source region and the drain region of the second initialization transistor T7 may be connected to the second initialization voltage line VIL2 to receive the initialization voltage VINT. The second initialization transistor T7 may be configured to be turned on according to the subsequent scan signal Sn+1 received through the subsequent scan line SLn and initialize the sub-pixel electrode of the organic light-emitting diode OLED. The subsequent scan line SLn may be the same as the first scan line SL1. In this case, the relevant scan line may be configured to transmit the same electric signal with a time difference, and thus, may function as the first scan line SL1 and as the subsequent scan line SLn. In some embodiments, the second initialization transistor T7 may be omitted.

The capacitor Cst may be connected to the driving voltage line PL and the driving gate electrode of the driving transistor T1 and store and maintain a voltage corresponding to a voltage difference between both ends of the capacitor Cst, thereby maintaining a voltage applied to the driving gate electrode of the driving transistor T.

Detailed operations of the sub-pixel circuit PC and the organic light-emitting diode OLED, which is a display element, according to some embodiments are described below.

During an initialization period, when a previous scan signal Sn−1 is supplied through the previous scan line SLp, the first initialization transistor T4 is turned on according to the previous scan signal Sn−1, and the driving transistor T1 may be initialized by the initialization voltage VINT supplied from the first initialization voltage line VIL1.

During a data programming period, when a first scan signal Sn is supplied through the first scan line SL1, the switching transistor T2 and the compensation transistor T3 may be turned on in response to the first scan signal Sn. In this case, the driving transistor T1 may be diode-connected and forward-biased by the compensation transistor T3 that is turned on. Then, a compensation voltage (DATA+Vth (Vth has a (−) value)) may be applied to the driving gate electrode of the driving transistor T1, wherein the compensation voltage (DATA+Vth) is obtained by subtracting a threshold voltage Vth of the driving transistor T1 from a data signal DATA supplied from the data line DL. The driving voltage ELVDD and the compensation voltage (DATA+Vth) are respectively applied to two opposite ends of the capacitor Cst, and charge corresponding to a difference between voltages of the two opposite ends may be stored in the capacitor Cst.

During an emission period, the operation control transistor T5 and the emission control transistor T6 may be turned on according to an emission control signal En supplied from the emission control line EL. The driving current Ioled corresponding to a voltage difference between the voltage of the driving gate electrode of the driving transistor T1 and the driving voltage ELVDD may be generated, and the driving current Ioled may be supplied to the organic light-emitting diode OLED through the emission control transistor T6.

Referring to FIG. 6, a sub-pixel circuit PC of the sub-pixel PX may include a plurality of thin-film transistors T1-T7, a first capacitor Cst, a second capacitor Cbt, and an organic light-emitting diode OLED that is a display element.

Some of the plurality of thin-film transistors T1 to T7 may be n-channel MOSFET (NMOS) transistors, and others may be p-channel MOSFET (PMOS) transistors. For example, as shown in FIG. 6, among the plurality of thin-film transistors T1 to T7, a compensation transistor T3 and a first initialization transistor T4 may be NMOS transistors, and the rest may be PMOS transistors. Alternatively, among the plurality of thin-film transistors T1 to T7, the compensation transistor T3, the first initialization transistor T4, and a second initialization transistor T7 may be NMOS transistors, and the rest may be PMOS transistors. Alternatively, all of the plurality of thin-film transistors T1 to T7 may be NMOS transistors. The plurality of thin-film transistors T1 to T7 may include amorphous silicon or polycrystalline silicon. If necessary, each of the NMOS transistors may include an oxide semiconductor.

Signal lines may include a first scan line SL1 configured to transmit a first scan signal Sn', a second scan line SL2 configured to transmit a second scan signal Sn", a previous scan line SLp configured to transmit a previous scan signal Sn−1 to the first initialization transistor T4, an emission control line EL configured to transmit an emission control signal EM to an operation control transistor T5 and an emission control transistor T6, a subsequent scan line SLn configured to transmit a subsequent scan signal Sn+1 to the second initialization transistor T7, and a data line DL configured to transmit a data signal DATA.

A driving transistor T1 may be connected to a driving voltage line PL via the operation control transistor T5 and may be electrically connected to the organic light-emitting diode OLED via the emission control transistor T6. The driving transistor T1 may be configured to receive the data signal DATA according to a switching operation of a switching transistor T2 and supply a driving current Ioled to the organic light-emitting diode OLED.

The switching transistor T2 may be connected to the first scan line SL1 and the data line DL and may be connected to the driving voltage line PL via the operation control transistor T5. The switching transistor T2 may be configured to be turned on according to the first scan signal Sn' received through the first scan line SL1 and transfer the data signal DATA, which is transmitted through the data line DL, to the first node N1.

The compensation transistor T3 may be connected to the second scan line SL2 and may be connected to the organic light-emitting diode OLED via the emission control transistor T6. The compensation transistor T3 may be configured to be turned on according to the second scan signal Sn" received through the second scan line SL2 and diode-connect the driving transistor T1 to thereby compensate the threshold voltage of the driving transistor T1.

The first initialization transistor T4 may be connected to the previous scan line SLp and the first initialization voltage line VIL1, and may be configured to be turned on according to the previous scan signal Sn−1 received through the previous scan line SLp and transfer the initialization voltage VINT from the first initialization voltage line VIL1 to a gate electrode of the driving transistor T1 to initialize the voltage of the gate electrode of the driving transistor T1.

The operation control transistor T5 and the emission control transistor T6 may be connected to the emission control line EL, and may be configured to be simultaneously (or concurrently) turned on according to the emission control signal EM received through the emission control line EL and form a current path so that a driving current IDLED may flow from the driving voltage line PL to the organic light-emitting diode OLED.

The second initialization transistor T7 may be connected to the subsequent scan line SLn and the second initialization voltage line VIL2, and may be configured to be turned on according to the subsequent scan signal Sn+1 received through the subsequent scan line SLn and transfer the initialization voltage VINT from the second initialization voltage line VIL2 to the organic light-emitting diode OLED to initialize the organic light-emitting diode OLED. The second initialization transistor T7 may be omitted.

The first capacitor Cst may include a first capacitor electrode CE1 and a second capacitor electrode CE2. The first capacitor electrode CE1 may be connected to the gate electrode of the driving transistor T1, and the second capacitor electrode CE2 may be connected to the driving voltage line PL. The first capacitor Cst may maintain a voltage applied to the gate electrode of the driving transistor T1 by storing and maintaining a voltage corresponding to a voltage difference between the driving voltage line PL and the gate electrode of the driving transistor T1.

The second capacitor Cbt may include a third capacitor electrode CE3 and a fourth capacitor electrode CE4. The third capacitor electrode CE3 may be connected to the first scan line SL1 and a gate electrode of the switching transistor T2. The fourth capacitor electrode CE4 may be connected to the gate electrode of the driving transistor T1 and the first capacitor electrode CE1 of the first capacitor Cst. The second capacitor Cbt is a boosting capacitor, and when the first scan signal Sn of the first scan line SL1 has a voltage for turning off the switching transistor T2, the second capacitor Cbt may increase the voltage of the second node N2 to clearly express a black gradation.

According to some embodiments, at least one of the plurality of transistors T1 to T7 may include a semiconductor layer including oxide, and the rest may include a semiconductor layer including amorphous silicon or polycrystalline silicon.

For example, a first thin-film transistor that directly affects the brightness of the display apparatus 1 may include a semiconductor layer including polycrystalline silicon having high reliability, thereby realizing a high-resolution display apparatus.

Because an oxide semiconductor has high carrier mobility and low leakage current, a voltage drop may not be large even though a driving time is long. That is, because a color change of an image according to a voltage drop is not large even during low-frequency driving, low-frequency driving may be possible.

As described above, because an oxide semiconductor has an advantage of a small leakage current, at least one of the compensation transistor T3 and the first initialization transistor T4 connected to the gate electrode of the driving transistor T1 may employ an oxide semiconductor to thereby prevent or reduce leakage current flowing to the gate electrode of the driving transistor T1 and reduce power consumption.

The sub-pixel circuit PC is not limited to the number and circuit design of thin-film transistors and capacitors described with reference to FIGS. 5 and 6, and the number and circuit design may be variously changed.

Figure 7:
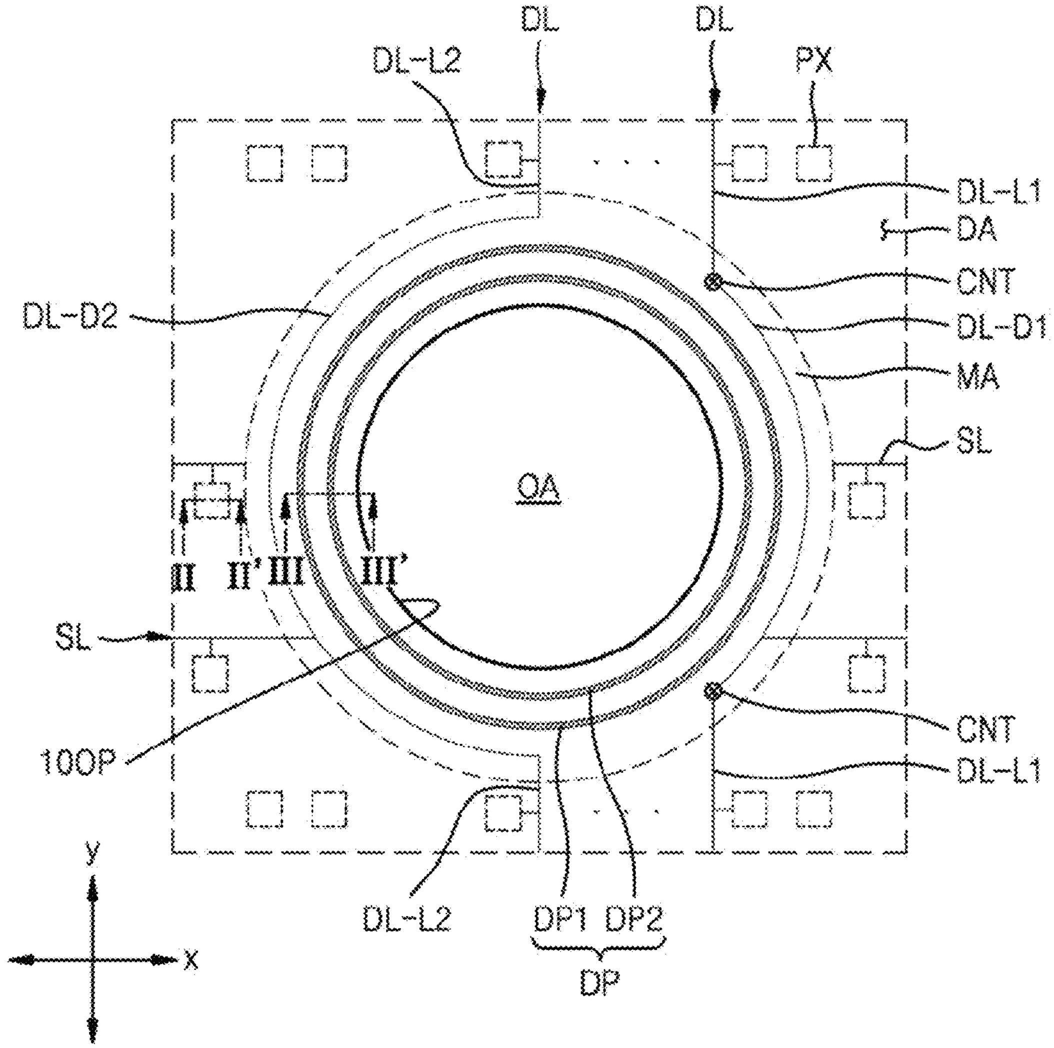
FIG. 7 is a schematic plan view of a portion of a display panel according to some embodiments.

FIG. 7 is a schematic plan view of a portion of a display panel according to some embodiments.

Referring to FIG. 7, sub-pixels PX adjacent to an opening area OA may be arranged to be spaced apart from each other with respect to the opening area OA in a plan view. The sub-pixels PX may be arranged to be vertically spaced apart from each other with respect to the opening area OA, or may be arranged to be spaced apart from each other in the left and right directions with respect to the opening area OA. Each of the sub-pixels PX uses red, green, or and blue light emitted from a light-emitting diode, and the positions of the sub-pixels PX shown in FIG. 7 correspond to the positions of the light-emitting diodes, respectively. Accordingly, the fact that the sub-pixels PX are arranged to be spaced apart from each other with respect to the opening area OA in a plan view may indicate that the light-emitting diodes are arranged to be spaced apart from each other with respect to the opening area OA in a plan view. For example, in a plan view, the light-emitting diodes may be arranged to be vertically spaced apart from each other with respect to the opening area OA, or may be arranged to be spaced apart from each other in the left and right directions with respect to the opening area OA.

Among signal lines supplying signals to a sub-pixel circuit connected to the light-emitting diode of each sub-pixel PX, signal lines adjacent to the opening area OA may detour the opening area OA and/or an opening 10OP. A detour portion DL-D1 of at least one data line DL among data lines DL may be formed on a different layer from an extension portion DL-L1 crossing a display area DA, and the detour portion DL-D1 of the data line DL and the extension portion DL-L1 may be connected to each other through a contact hole CNT. A detour portion DL-D2 of at least one data line DL among the data lines DL may be located on the same layer as an extension portion DL-L2 and may be formed integrally with the extension portion DL-L2.

Although FIG. 7 illustrates an example in which a scan line SL detours the opening area OA and/or the opening 10OP in an intermediate area MA, the disclosure is not limited thereto. According to some embodiments, the scan line SL may be separated or disconnected with respect to the opening area OA. In this case, a scan line SL arranged on the left side of the opening area OA may receive a signal from the first scan driver 20 arranged on the left side of the display area DA, as described above with reference to FIG. 4, and a scan line SL arranged on the right side of the opening area OA may receive a signal from the second scan driver 30 arranged on the right side of the display area DA, described above with reference to FIG. 4.

Partition walls DP may be located between an area, in which the data lines DL detour in an intermediate area MA, and the opening area OA. In a plan view, each of the partition walls DP may have a closed-loop shape surrounding the opening area OA, and the partition walls DP may be arranged to be spaced apart from each other.

Figure 8:
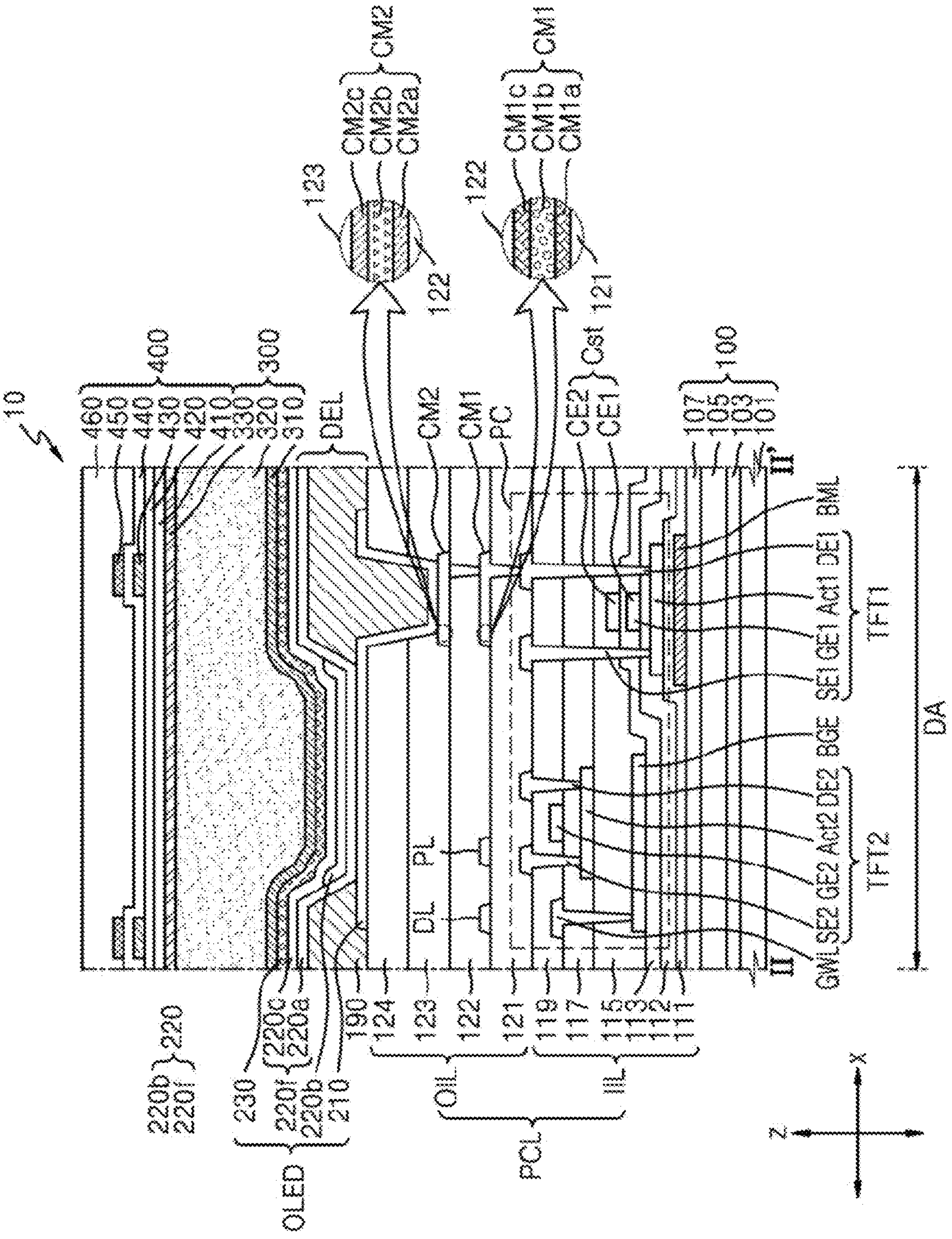
FIG. 8 is a schematic cross-sectional view of a portion of a display panel according to some embodiments, taken along the line III-III' of FIG. 7.

FIG. 8 is a schematic cross-sectional view of a portion of a display panel 10 according to some embodiments, taken along the line II-II' of FIG. 7.

Referring to a display area DA of FIG. 8, the display panel 10 may include a substrate 100, a pixel circuit layer PCL, a display element layer DEL, an encapsulation layer 300, and a touch sensor layer 400.

The substrate 100 may include a glass material or polymer resin. According to some embodiments, the substrate 100 may have a structure in which a base layer including polymer resin and a barrier layer including an inorganic insulating material, such as silicon oxide or silicon nitride, are alternately stacked. For example, the substrate 100 may include a first base layer 101, a first barrier layer 103, a second base layer 105, and a second barrier layer 107 sequentially stacked. The first base layer 101 and the second base layer 105 may include polymer resin, and the first barrier layer 103 and the second barrier layer 107 may include an inorganic insulating material. The polymer resin may include polyethersulfone, polyarylate, polyether imide, polyethylene naphthalate, polyethylene terephthalate, polyphenylene sulfide, polyimide, polycarbonate, cellulose triacetate, cellulose acetate propionate, or the like.

The pixel circuit layer PCL may be located on the substrate 100. The pixel circuit layer PCL may include a sub-pixel circuit PC, an inorganic insulating layer IIL, and an organic insulating layer OIL. According to some embodiments, the inorganic insulating layer IIL may include a buffer layer 111, a first gate insulating layer 112, a second gate insulating layer 113, a first inorganic insulating layer 115, a second inorganic insulating layer 117, and an interlayer insulating layer 119. According to some embodiments, the organic insulating layer OIL may include a first organic insulating layer 121, a second organic insulating layer 122, a third organic insulating layer 123, and a fourth organic insulating layer 124.

The sub-pixel circuit PC may include a plurality of transistors and a capacitor, as described above with reference to FIGS. 5 and 6. In this regard, FIG. 8 illustrates a first thin-film transistor TFT1, a second thin-film transistor TFT2, and a capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The capacitor Cst may include a first capacitor electrode CE1 and a second capacitor electrode CE2.

The buffer layer 111 may be located on the substrate 100. The buffer layer 111 may reduce or block penetration of foreign materials, moisture, or external air from the bottom of the substrate 100. The buffer layer 111 may include an inorganic material, such as silicon oxide, silicon oxynitride, or silicon nitride, and may include a single layer or multiple layers including the aforementioned material.

The first semiconductor layer Act1 may include a silicon semiconductor. The first semiconductor layer Act1 may include polycrystalline silicon. Alternatively, the first semiconductor layer Act1 may include amorphous silicon. In some embodiments, the first semiconductor layer Act1 may include an oxide semiconductor, an organic semiconductor, or the like. The first semiconductor layer Act1 may include a channel region, and a drain region and a source region respectively arranged on both sides of the channel region. The first gate electrode GE1 may overlap the channel region.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), titanium (Ti), or the like, and may include multiple layers or a single layer including the conductive material.

The first gate insulating layer 112 may be arranged between the first semiconductor layer Act1 and the first gate electrode GE1. Accordingly, the first semiconductor layer Act1 may be insulated from the first gate electrode GE1. The first gate insulating layer 112 may include an inorganic insulating material, such as silicon oxide, silicon nitride, silicon oxynitride, aluminum oxide, titanium oxide, tantalum oxide, hafnium oxide, and/or zinc oxide.

The second gate insulating layer 113 may cover the first gate electrode GE1. Similar to the first gate insulating layer 112, the second gate insulating layer 113 may include an inorganic insulating material, such as silicon oxide, silicon nitride, silicon oxynitride, aluminum oxide, titanium oxide, tantalum oxide, hafnium oxide, and/or zinc oxide.

The second capacitor electrode CE2 may be located on the second gate insulating layer 113. The second capacitor electrode CE2 may overlap the first gate electrode GE1 thereunder. In this case, the second capacitor electrode CE2 and the first gate electrode GE1 may overlap each other with the second gate insulating layer 113 therebetween to form the capacitor Cst. That is, the first gate electrode GE1 of the first thin-film transistor TFT1 may function as the first capacitor electrode CE1 of the capacitor Cst.

In this way, the capacitor Cst and the first thin-film transistor TFT1 may be formed to overlap each other. In some embodiments, the capacitor Cst may be formed not to overlap the first thin-film transistor TFT1.

The second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the aforementioned material.

The first inorganic insulating layer 115 may cover the second capacitor electrode CE2. The first inorganic insulating layer 115 may include silicon oxide, silicon nitride, silicon oxynitride, aluminum oxide, titanium oxide, tantalum oxide, hafnium oxide, zinc oxide, or the like. The first inorganic insulating layer 115 may include a single layer or multiple layers including the aforementioned inorganic insulating material.

The second semiconductor layer Act2 may be located on the first inorganic insulating layer 115. According to some embodiments, the second semiconductor layer Act2 may include a channel region, and a source region and a drain region respectively arranged on both sides of the channel region. The second semiconductor layer Act2 may include an oxide semiconductor. For example, the second semiconductor layer Act2 may include a Zn oxide-based material, such as Zn oxide, In—Zn oxide, Ga—In—Zn oxide, or the like. Alternatively, the second semiconductor layer Act2 may include an In—Ga—Zn—O (IGZO), In—Sn—Zn—O (ITZO), or In—Ga—Sn—Zn—O (IGTZO) semiconductor in which metals, such as indium (In), gallium (Ga), and tin (Sn), are contained in zinc oxide (ZnO).

The source region and the drain region of the second semiconductor layer Act2 may be formed by controlling the carrier concentration of the oxide semiconductor to make the oxide semiconductor conductive. For example, the source region and the drain region of the second semiconductor layer Act2 may be formed by increasing the carrier concentration of the oxide semiconductor through plasma treatment using a hydrogen-based gas, a fluorine-based gas, or a combination thereof.

The second inorganic insulating layer 117 may cover the second semiconductor layer Act2. The second inorganic insulating layer 117 may be arranged between the second semiconductor layer Act2 and the second gate electrode GE2. According to some embodiments, the second inorganic insulating layer 117 may be entirely located on the substrate 100. According to some embodiments, the second inorganic insulating layer 117 may be patterned according to the shape of the second gate electrode GE2. The second inorganic insulating layer 117 may include silicon oxide, silicon nitride, silicon oxynitride, aluminum oxide, titanium oxide, tantalum oxide, hafnium oxide, zinc oxide, or the like. The second inorganic insulating layer 117 may include a single layer or multiple layers including the aforementioned inorganic insulating material.

The second gate electrode GE2 may be located on the second inorganic insulating layer 117. The second gate electrode GE2 may overlap the second semiconductor layer Act2. The second gate electrode GE2 may overlap the channel region of the second semiconductor layer Act2. The second gate electrode GE2 may include a conductive material including Mo, Al, Cu, Ti, or the like, and may include multiple layers or a single layer including the conductive material.

The interlayer insulating layer 119 may cover the second gate electrode GE2. The interlayer insulating layer 119 may include silicon oxide, silicon nitride, silicon oxynitride, aluminum oxide, titanium oxide, tantalum oxide, hafnium oxide, zinc oxide, or the like. The interlayer insulating layer 119 may include a single layer or multiple layers including the aforementioned inorganic insulating material.

The first source electrode SE1 and the first drain electrode DE1 may be located on the interlayer insulating layer 119. The first source electrode SE1 and the first drain electrode DE1 may be connected to the first semiconductor layer Act1. The first source electrode SE1 and the first drain electrode DE1 may be connected to the first semiconductor layer Act1 through contact holes of the insulating layers.

The second source electrode SE2 and the second drain electrode DE2 may be located on the interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through contact holes of the insulating layers.

The first source electrode SE1, the first drain electrode DE1, the second source electrode SE2, and the second drain electrode DE2 may each include a material having good conductivity. The first source electrode SE1, the first drain electrode DE1, the second source electrode SE2, and the second drain electrode DE2 may each include a conductive material including Mo, Al, Cu, Ti, or the like, and may include multiple layers or a single layer including the conductive material. According to some embodiments, the first source electrode SE1, the first drain electrode DE1, the second source electrode SE2, and the second drain electrode DE2 may each have a multi-layered structure including Ti/Al/Ti layers.

The first thin-film transistor TFT1 including the first semiconductor layer Act1 including a silicon semiconductor may have high reliability. For example, the first thin-film transistor TFT1 may be the driving transistor T1 in FIG. 6. In this case, a display panel 10 having high quality may be realized.

Because an oxide semiconductor has high carrier mobility and low leakage current, a voltage drop may not be large even though a driving time is long. By employing an oxide semiconductor in at least one of the transistors other than the driving transistor T1, leakage current may be prevented or reduced and power consumption may be relatively reduced. For example, the second thin-film transistor TFT2 may be the compensation transistor T3 in FIG. 6.

A lower gate electrode BGE may be located under the second semiconductor layer Act2. According to some embodiments, the lower gate electrode BGE may be arranged between the second gate insulating layer 113 and the first inorganic insulating layer 115. According to some embodiments, the lower gate electrode BGE may receive a gate signal. In this case, the second thin-film transistor TFT2 may have a double gate electrode structure in which gate electrodes are located above and below the second semiconductor layer Act2.

According to some embodiments, a gate wiring line GWL may be arranged between the second inorganic insulating layer 117 and the interlayer insulating layer 119. According to some embodiments, the gate wiring line GWL may be electrically connected to the lower gate electrode BGE through a contact hole provided in the first inorganic insulating layer 115 and the second inorganic insulating layer 117.

According to some embodiments, a back metal layer BML may be arranged between the substrate 100 and the sub-pixel circuit PC. According to some embodiments, the back metal layer BML may overlap the first thin-film transistor TFT1. A constant voltage may be applied to the back metal layer BML. As the back metal layer BML is located under the first thin-film transistor TFT1, the first thin-film transistor TFT1 may be less affected by ambient interference signals, and thus, reliability may be improved.

The first organic insulating layer 121 may be arranged to cover the first source electrode SE1, the first drain electrode DE1, the second source electrode SE2, and the second drain electrode DE2. The first organic insulating layer 121 may include an organic material. For example, the first organic insulating layer 121 may include an organic insulating material, such as a general-purpose commercial polymer, such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a blend thereof.

A first connection electrode CM1, a data line DL, and a driving voltage line PL may be located on the first organic insulating layer 121. In this case, the first connection electrode CM1 may be connected to the first drain electrode DE1 or the first source electrode SE1 through a contact hole of the first organic insulating layer 121.

The first connection electrode CM1, the data line DL, and the driving voltage line PL may each include a material having good conductivity. The first connection electrode CM1 may include a conductive material including Mo, Al, Cu, Ti, or the like, and may include multiple layers or a single layer including the conductive material. According to some embodiments, the first connection electrode CM1 may have a triple-layered structure including Ti/Al/Ti layers, that is, a first layer CM1*a*, a second layer CM1*b*, and a third layer CM1*c*.

FIG. 8 illustrates an example in which the data line DL and the driving voltage line PL are arranged on the same layer (e.g., the first organic insulating layer 121). However, according to some embodiments, the data line DL and the driving voltage line PL may be located on different layers.

The second organic insulating layer 122 may be arranged to cover the first connection electrode CM1, the data line DL, and the driving voltage line PL. The second organic insulating layer 122 may include an organic material. For example, the second organic insulating layer 122 may include an organic insulating material, such as acrylic, benzocyclobutene (BCB), polyimide, or hexamethyldisiloxane (HMDSO).

The second connection electrode CM2 may be located on the second organic insulating layer 122. In this case, the second connection electrode CM2 may be electrically connected to the first connection electrode CM1 through a contact hole defined in the second organic insulating layer 122.

The second connection electrode CM2 may include a material having good conductivity. The second connection electrode CM2 may include a conductive material including, for example, Mo, Al, Cu, Ti, or the like. The second connection electrode CM2 may include multiple layers or a single layer including the conductive material. According to some embodiments, the second connection electrode CM2 may have a triple-layered structure including Ti/Al/Ti layers, that is, a first layer CM2*a*, a second layer CM2*b*, and a third layer CM2*c*.

The third organic insulating layer 123 and the fourth organic insulating layer 124 may be arranged to cover the second connection electrode CM2. The third organic insulating layer 123 and the fourth organic insulating layer 124 may each include an organic material. For example, the third organic insulating layer 123 and the fourth organic insulating layer 124 may each include an organic insulating material, such as acrylic, BCB, polyimide, or HMDSO.

Although FIG. 8 illustrates an example in which the pixel circuit layer PCL includes the first organic insulating layer 121, the second organic insulating layer 122, the third organic insulating layer 123, and the fourth organic insulating layer 124, the disclosure is not limited thereto. For example, at least one of the first organic insulating layer 121, the second organic insulating layer 122, the third organic insulating layer 123, and the fourth organic insulating layer 124 may be omitted.

The display element layer DEL may be located on the pixel circuit layer PCL. The display element layer DEL may include, for example, an organic light-emitting diode OLED as a display element.

The organic light-emitting diode OLED may be electrically connected to the sub-pixel circuit PC. The organic light-emitting diode OLED may be electrically connected to the sub-pixel circuit PC to implement the sub-pixel PX. The organic light-emitting diode OLED may include a sub-pixel electrode 210, an emission layer 220*b*, a functional layer 220*f*, and an opposite electrode 230.

The sub-pixel electrode 210 may be located on the fourth organic insulating layer 124. The sub-pixel electrode 210 may be electrically connected to the second connection electrode CM2 through a contact hole provided in the third organic insulating layer 123 and the fourth organic insulating layer 124.

The sub-pixel electrode 210 may include a reflective layer including Ag, Mg, Al, Pt, Pd, Au, Ni, Nd, Ir, Cr, or a compound thereof. Alternatively, the sub-pixel electrode 210 may further include a conductive oxide layer on and/or under the aforementioned reflective layer. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). According to some embodiments, the sub-pixel electrode 210 may have a triple-layered structure including ITO/Ag/ITO layers.

A first bank layer 190 may be located on the sub-pixel electrode 210. A first opening exposing at least a portion of the sub-pixel electrode 210 may be defined in the first bank layer 190. A central portion of the sub-pixel electrode 210 may be exposed through the first opening defined in the first bank layer 190. The first opening may define an emission area of light emitted from the organic light-emitting diode OLED.

The first bank layer 190 may include an organic insulating material. According to some embodiments, the first bank layer 190 may include an inorganic insulating material, such as silicon nitride, silicon oxynitride, or silicon oxide. According to some embodiments, the first bank layer 190 may include an organic insulating material and an inorganic insulating material. According to some embodiments, the first bank layer 190 may include a light-blocking material and may be provided in black. The light-blocking material may include carbon black, carbon nanotubes, resin or paste including black dye, metal particles (e.g., nickel, aluminum, molybdenum, or an alloy thereof), metal oxide particles (e.g., chromium oxide), metal nitride particles (e.g., chromium nitride), or the like. When the first bank layer 190 includes a light-blocking material, reflection of external light by metal structures located under the first bank layer 190 may be reduced.

The emission layer 220*b* may be located on the sub-pixel electrode 210. The emission layer 220*b* may overlap the first opening of the sub-pixel electrode 210. The emission layer 220*b* may include a low molecular or high molecular material and may emit red, green, blue, or white light. According to some embodiments, the emission layer 220*b* may be patterned to correspond to each of the plurality of sub-pixel electrodes 210. In some embodiments, the emission layer 220*b* may be integrally formed over the plurality of sub-pixel electrodes 210.

The functional layer 220*f* may include at least one of a first functional layer 220*a* between the sub-pixel electrode 210 and the emission layer 220*b* and a second functional layer 220*c* between the emission layer 220*b* and the opposite electrode 230.

According to some embodiments, the first functional layer 220*a* may include a hole injection layer (HIL) and/or a hole transport layer (HTL). The second functional layer 220*c* may include an electron transport layer (ETL) and/or an electron injection layer (EIL). According to some embodiments, the functional layer 220*f* may be arranged to entirely cover the display area DA.

The opposite electrode 230 may be located on the emission layer 220*b*. The opposite electrode 230 may include a conductive material having a low work function. For example, the opposite electrode 230 may include a (semi) transparent layer including Ag, Mg, Al, Pt, Pd, Au, Ni, Nd, Ir, Cr, lithium (Li), Ca, or an alloy thereof Alternatively, the opposite electrode 230 may further include a layer including ITO, IZO, ZnO, or $In_2O_3$ on the (semi)transparent layer including the aforementioned material. According to some embodiments, the opposite electrode 230 may be arranged to entirely cover the display area DA.

The encapsulation layer 300 may be located on the opposite electrode 230. The encapsulation layer 300 may include at least one inorganic encapsulation layer and at least one organic encapsulation layer. According to some embodiments, the encapsulation layer 300 may include a first inorganic encapsulation layer 310, a second inorganic encapsulation layer 330, and an organic encapsulation layer 320 therebetween.

Each of the first inorganic encapsulation layer 310 and the second inorganic encapsulation layer 330 may include at least one inorganic insulating material. The at least one inorganic insulating material may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. Examples of the polymer-based material may include acrylic resin, epoxy-based resin, polyimide, polyethylene, and the like. The organic encapsulation layer 320 may include acrylic resin, such as polymethyl methacrylate or polyacrylic acid. The organic encapsulation layer 320 may be formed by curing a monomer or applying a polymer.

The touch sensor layer 400 may be located on the encapsulation layer 300. The touch sensor layer 400 may include a protective layer 410, a first touch insulating layer 420, a first touch conductive layer 430, a second touch insulating layer 440, a second touch conductive layer 450, and a third touch insulating layer 460.

The protective layer 410 may protect the encapsulation layer 300. For example, the protective layer 410 may prevent or reduce the occurrence of cracks in at least one of the first inorganic encapsulation layer 310 and the second inorganic encapsulation layer 330. The first touch insulating layer 420 may be located on the protective layer 410.

The protective layer 410 and the first touch insulating layer 420 may each include an inorganic insulating material. The protective layer 410 may include, for example, aluminum oxide, titanium oxide, tantalum oxide, hafnium oxide, zinc oxide, silicon oxide, silicon nitride, and/or silicon oxynitride. The protective layer 410 and the first touch insulating layer 420 may each have a single-layered or multi-layered structure including the aforementioned inorganic insulating material. According to some embodiments, one of the protective layer 410 and the first touch insulating layer 420 may be omitted. For example, the first touch insulating layer 420 may be omitted.

The first touch conductive layer 430 may be located on the first touch insulating layer 420. The first touch conductive layer 430 may include a conductive material. The first touch conductive layer 430 may include, for example, at least one of Mo, Al, Cu, and Ti. According to some embodiments, the first touch conductive layer 430 may have a multi-layered structure including Ti/Al/Ti layers.

The second touch insulating layer 440 may be arranged to cover the first touch conductive layer 430. The second touch insulating layer 440 may include an inorganic insulating material and/or an organic insulating material. The inorganic insulating material may include silicon oxide, silicon nitride, and/or silicon oxynitride, and the organic insulating material may include an acrylic or imide-based organic material.

The second touch conductive layer 450 may be located on the second touch insulating layer 440. The second touch insulating layer 440 may have a contact hole, and the second touch conductive layer 450 may be electrically connected to the first touch conductive layer 430 through the contact hole. The second touch conductive layer 450 may include a conductive material. The second touch conductive layer 450 may include, for example, at least one of Mo, Al, Cu, and Ti. According to some embodiments, the second touch conductive layer 450 may have a multi-layered structure including Ti/Al/Ti layers.

The third touch insulating layer 460 may be arranged to cover the second touch conductive layer 450. A top surface of the third touch insulating layer 460 may be flat. The third touch insulating layer 460 may include an organic material. According to some embodiments, the third touch insulating layer 460 may include a polymer-based material. The aforementioned polymer-based material may be transparent. For example, the third touch insulating layer 460 may include silicone-based resin, acrylic resin, epoxy-based resin, polyimide, polyethylene, or the like. The third touch insulating layer 460 may include an inorganic material.

Figure 9:
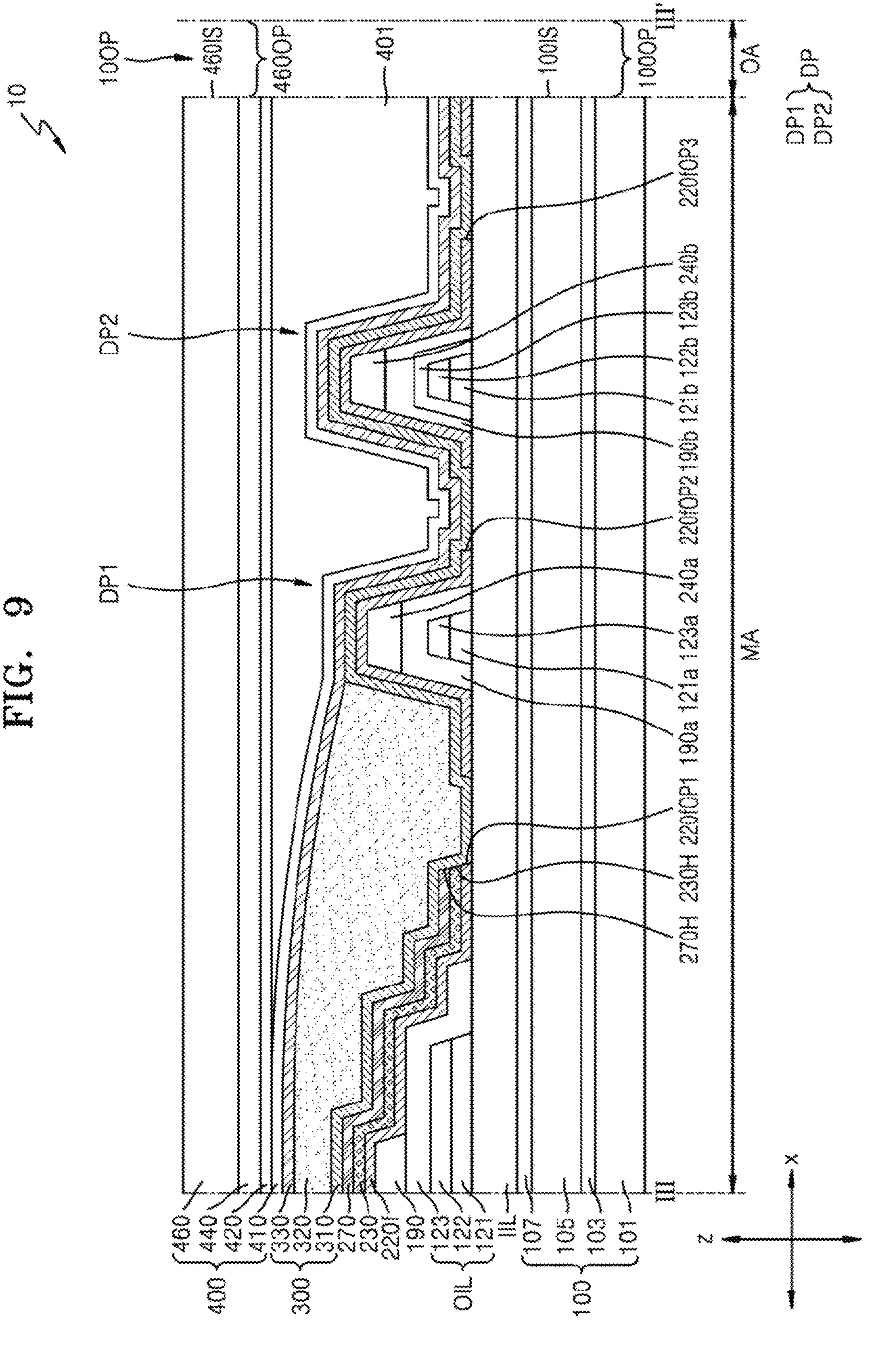
FIG. 9 is a schematic cross-sectional view of a portion of a display panel according to some embodiments, taken along the line III-III' of FIG. 7.

FIG. 9 is a schematic cross-sectional view of a portion of a display panel 10 according to some embodiments, taken along the line III-III' of FIG. 7. For example, FIG. 9 is a view for explaining components arranged in the intermediate area MA, and in FIG. 9, the same reference numerals as those in FIG. 8 refer to the same members as those in FIG. 8, and thus, redundant descriptions thereof are omitted.

Referring to FIG. 9, a first base layer 101, a first barrier layer 103, a second base layer 105, and a second barrier layer 107 of a substrate 100 may be sequentially located. For example, the first base layer 101, the first barrier layer 103, the second base layer 105, and the second barrier layer 107 may be sequentially located in a direction from the display area DA (see FIG. 8) toward the opening area OA.

An inorganic insulating layer IIL may be located on the substrate 100. The inorganic insulating layer IIL may be arranged in the display area DA and may extend from the display area DA to the intermediate area MA. For example, the inorganic insulating layer IIL may include the buffer layer 111 (see FIG. 8), the first gate insulating layer 112 (see FIG. 8), the second gate insulating layer 113 (see FIG. 8), the first inorganic insulating layer 115 (see FIG. 8), the second inorganic insulating layer 117 (see FIG. 8), and the interlayer insulating layer 119 (see FIG. 8). However, in the intermediate area MA, at least one of the buffer layer 111, the first gate insulating layer 112, the second gate insulating layer 113, the first inorganic insulating layer 115, the second inorganic insulating layer 117, and the interlayer insulating layers 119 may be omitted.

An organic insulating layer OIL may be located on the inorganic insulating layer IIL. The organic insulating layer OIL may be arranged in the display area DA and may extend from the display area DA to the intermediate area MA. For example, the organic insulating layer OIL may include a first organic insulating layer 121, a second organic insulating layer 122, and a third organic insulating layer 123. According to some embodiments, the third organic insulating layer 123 may cover ends (or side surfaces) of the first organic insulating layer 121 and the second organic insulating layer 122. However, the disclosure is not limited thereto. For example, the third organic insulating layer 123 may expose ends (or side surfaces) of the first organic insulating layer 121 and the second organic insulating layer 122.

A first bank layer 190 may be located on the third organic insulating layer 123. The first bank layer 190 may be arranged in the display area DA and may extend from the display area DA to the intermediate area MA.

An end of each of the first organic insulating layer 121, the second organic insulating layer 122, the third organic insulating layer 123, and the first bank layer 190, which extend from the display area DA to the intermediate area MA, may be located in the intermediate area MA and may be spaced apart from partition walls DP to be described below.

The partition walls DP may be arranged in the intermediate area MA. For example, the partition wall DP may include a first partition wall DP1 and a second partition wall DP2, which are spaced apart from each other. The first partition wall DP1 and the second partition wall DP2 may be located on the upper surface of the inorganic insulating layer K. Although FIG. 9 illustrates an example in which two partition walls DP are arranged in the intermediate area MA, the disclosure is not limited thereto. Various modifications may be made, such as one partition wall or two or more partition walls being arranged in the intermediate area MA.

Referring to FIGS. 7 and 9, the first partition wall DP1 may be located between the display area DA and the opening area OA, and the second partition wall DP2 may be located between the first partition wall DP1 and the opening area OA. That is, the second partition wall DP2 may be located closer to the opening area OA than the first partition wall DP1.

The first partition wall DP1 may include a portion 121*a* of the first organic insulating layer 121, a portion 123*a* of the third organic insulating layer 123, a portion 190*a* of the first bank layer 190, and a portion 240*a* of a spacer. The second partition wall DP2 may include a portion 121*b* of the first organic insulating layer 121, a portion 122*b* of the second organic insulating layer 122, a portion 123*b* of the third organic insulating layer 123, a portion 190*b* of the first bank layer 190, and a portion 240*b* of the spacer. According to some embodiments, each of the first partition wall DP1 and the second partition wall DP2 may further include portions of other layers, or some of the aforementioned layers may be omitted.

According to some embodiments, because the first partition wall DP1 includes four layers and the second partition wall DP2 includes five layers, the height of the second partition wall DP2 may be greater than that of the first partition wall DP1. That is, the height of the second partition wall DP2 from the upper surface of the inorganic insulating layer IIL may be greater than that of the first partition wall DP1 from the upper surface of the inorganic insulating layer K.

The functional layer 220*f* may be arranged in the display area DA, and at least a portion of the functional layer 220*f* may extend from the display area DA to the intermediate area MA. The functional layer 220*f* may include at least one of the first functional layer 220*a* and the second functional layer 220*c* described above with reference to FIG. 8.

According to some embodiments, the functional layer 220*f* may be disconnected in the intermediate area MA. That is, the functional layer 220*f* may include at least one opening 220*f*OP1, 220*f*OP2, and 220*f*OP3 positioned in the intermediate area MA.

The at least one opening 220*f*OP1, 220*f*OP2, and 220*f*OP3 of the functional layer 220*f* may be located on the inorganic insulating layer IIL. For example, the functional layer 220*f* may be located on the upper surface of the inorganic insulating layer IIL, and the upper surface of the inorganic insulating layer IIL may be exposed through the at least one opening 220*f*OP1, 220*f*OP2, and 220*f*OP3 defined in the functional layer 220*f*.

According to some embodiments, the functional layer 220*f* may include a first opening 220*f*OP1, a second opening 220*f*OP2, and a third opening 220*f*OP3. According to some embodiments, the first opening 220*f*OP1 may be located between the display area DA (see FIG. 8) and the first partition wall DP1, the second opening 220*f*OP2 may be located between the first partition wall DP1 and the second partition wall DP1, and the third opening 220*f*OP3 may be located between the second partition wall DP2 and the opening area OA. However, the disclosure is not limited thereto. The first opening 220*f*OP1 and the second opening 220*f*OP2 may be located between the display area DA (see FIG. 8) and the first partition wall DP1, and the third opening 220*f*OP3 may be located between the second partition wall DP2 and the opening areas OA. Also, the first opening 220*f*OP1 may be located between the display area DA (see FIG. 8) and the first partition wall DP1 and the second opening 220*f*OP2 and the third opening 220*f*OP3 may be located between the second partition wall DP2 and the opening area OA, and various modifications may be made.

In addition, although FIG. 9 illustrates an example in which three openings are defined in the functional layer 220*f*, one opening, two openings, or four or more openings may be defined in the functional layer 220*f* and various modifications may be made.

As at least one opening 220*f*OP1, 220*f*OP2, and 220*f*OP3 is defined in the functional layer 220*f*, penetration (or diffusion) of oxygen or moisture in the vicinity of the opening area OA into a light-emitting diode of the display area DA may be prevented or reduced.

An opposite electrode 230 and a capping layer 270 may be arranged in the display area DA, and at least portions of the opposite electrode 230 and the capping layer 270 may extend from the display area DA to the intermediate area MA. The capping layer 270 may be located on the opposite electrode 230 and may protect the opposite electrode 230. The capping layer 270 may include an inorganic insulating material. The capping layer 270 may include, for example, aluminum oxide, titanium oxide, tantalum oxide, hafnium oxide, zinc oxide, silicon oxide, silicon nitride, and/or silicon oxynitride.

According to some embodiments, the opposite electrode 230 and the capping layer 270 may be disconnected in the intermediate area MA. The opposite electrode 230 and the capping layer 270 may respectively include holes 230H and 270H corresponding to the opening area OA. The holes 230H and 270H respectively defined in the opposite electrode 230 and the capping layer 270 may be located in the intermediate area MA. At least a portion of the functional layer 220*f* and/or the inorganic insulating layer IIL may be exposed through the holes 230H and 270H respectively defined in the opposite electrode 230 and the capping layer 270.

As shown in FIG. 9, the area of the hole 230H defined in the opposite electrode 230 may be greater than that of the opening area OA. As the area of the hole 230H defined in the opposite electrode 230 is greater than that of the opening area OA, penetration (or diffusion) of oxygen or moisture in the vicinity of the opening area OA into a light-emitting diode of the display area DA may be prevented or reduced.

Also, the area of the hole 270H defined in the capping layer 270 may be greater than that of the opening area OA. As the area of the hole 270H defined in the capping layer 270 is greater than that of the opening area OA, penetration (or diffusion) of oxygen or moisture in the vicinity of the opening area OA into a light-emitting diode of the display area DA may be prevented or reduced.

An encapsulation layer 300 may be arranged in the intermediate area MA. The encapsulation layer 300 may be arranged in the display area DA, and at least a portion of the encapsulation layer 300 may extend from the display area DA to the intermediate area MA. According to some embodiments, the encapsulation layer 300 may include a first inorganic encapsulation layer 310, an organic encapsulation layer 320, and a second inorganic encapsulation layer 330, which are sequentially stacked.

The organic encapsulation layer 320 may be formed by applying a monomer and then curing the monomer, and thus, the flow of the monomer forming the organic encapsulation layer 320 may be controlled by the first and second partition walls DP1 and DP2. That is, as the first partition wall DP1 and/or the second partition wall DP2 are arranged in the intermediate area MA, the flow of the monomer forming the organic encapsulation layer 320 toward the opening area OA may be prevented or reduced. For example, an end of the organic encapsulation layer 320 may be located at one side of the first partition wall DP1 and/or the second partition wall DP2.

As the end of the organic encapsulation layer 320 is located at one side of the first partition wall DP1 and/or the second partition wall DP2, the first inorganic encapsulation layer 310 and the second inorganic encapsulation layer 330 may directly contact each other on the upper surfaces of the first partition wall DP1 and/or the second partition wall DP2.

The encapsulation layer 300 may overlap at least one opening 220*f*OP1, 220*f*OP2, and 220*f*OP3 defined in the functional layer 220*f*. The first inorganic encapsulation layer 310, the organic encapsulation layer 320, and the second inorganic encapsulation layer 330 of the encapsulation layer 300 may overlap the first opening 220*f*OP1 defined in the functional layer 220*f*.

According to some embodiments, the first inorganic encapsulation layer 310 may be directly located on (or in contact with) the upper surface of the inorganic insulating layer IIL, at least a portion of which is exposed by the first opening 220*f*OP1 defined in the functional layer 220*f*. In addition, according to some embodiments, the first inorganic encapsulation layer 310 may be directly located on (or in contact with) the upper surface of the inorganic insulating layer IIL, at least a portion of which is exposed by the second opening 220*f*OP2 and the third opening 220*f*OP3 defined in the functional layer 220*f*.

A touch sensor layer 400 may be arranged in the intermediate area MA. The touch sensor layer 400 may be arranged in the display area DA, and at least a portion of the touch sensor layer 400 may extend from the display area DA to the intermediate area MA. According to some embodiments, the touch sensor layer 400 may include a protective layer 410, a first touch insulating layer 420, a second touch insulating layer 440, and a third touch insulating layer 460, which are sequentially stacked. Each of the protective layer 410, the first touch insulating layer 420, the second touch insulating layer 440, and the third touch insulating layer 460 may extend from the display area DA to the intermediate area MA. However, the protective layer 410 and/or the first touch insulating layer 420 may be omitted.

A planarization layer 401 may be arranged to cover the intermediate area MA. The planarization layer 401 may prevent or reduce a step difference between the display area DA and the intermediate area MA. The planarization layer 401 may be located only in the intermediate area MA to have a width reaching both edges. One edge of the planarization layer 401 may face an opening 10OP of the display panel 10, and the other edge may be adjacent to the display area DA.

A portion of the planarization layer 401 adjacent to the display area DA may overlap a portion of the organic encapsulation layer 320 while covering the edge of the organic encapsulation layer 320, and the second inorganic encapsulation layer 330 and the protective layer 410 may be located between the organic encapsulation layer 320 and the planarization layer 401 in a thickness direction (a z direction) of the display panel 10. In the intermediate area MA, the protective layer 410 and the first touch insulating layer 420 may be spaced apart from each other in the thickness direction (the z direction) by the planarization layer 401 therebetween. However, the disclosure is not limited thereto. In some embodiments, the planarization layer 401 may be omitted. In this case, the protective layer 410 and the first touch insulating layer 420 may be in direct contact with each other in the intermediate area MA.

Referring to the opening area OA, the display panel 10 may include the opening 10OP. The opening 10OP of the display panel 10 may include openings of components constituting the display panel 10. For example, the opening 10OP of the display panel 10 may include an opening 100OP of the substrate 100, an opening of the planarization layer 401, an opening 460OP of the third touch insulating layer 460, and the like.

The openings of the components constituting the display panel 10 may be simultaneously (or concurrently) formed. Accordingly, an inner surface 100IS of the substrate 100, which defines the opening 100OP of the substrate 100, and an inner surface 460IS of the third touch insulating layer 460, which defines the opening 460OP of the third touch insulating layer 460, may be located on the same vertical line.

Figure 10A:
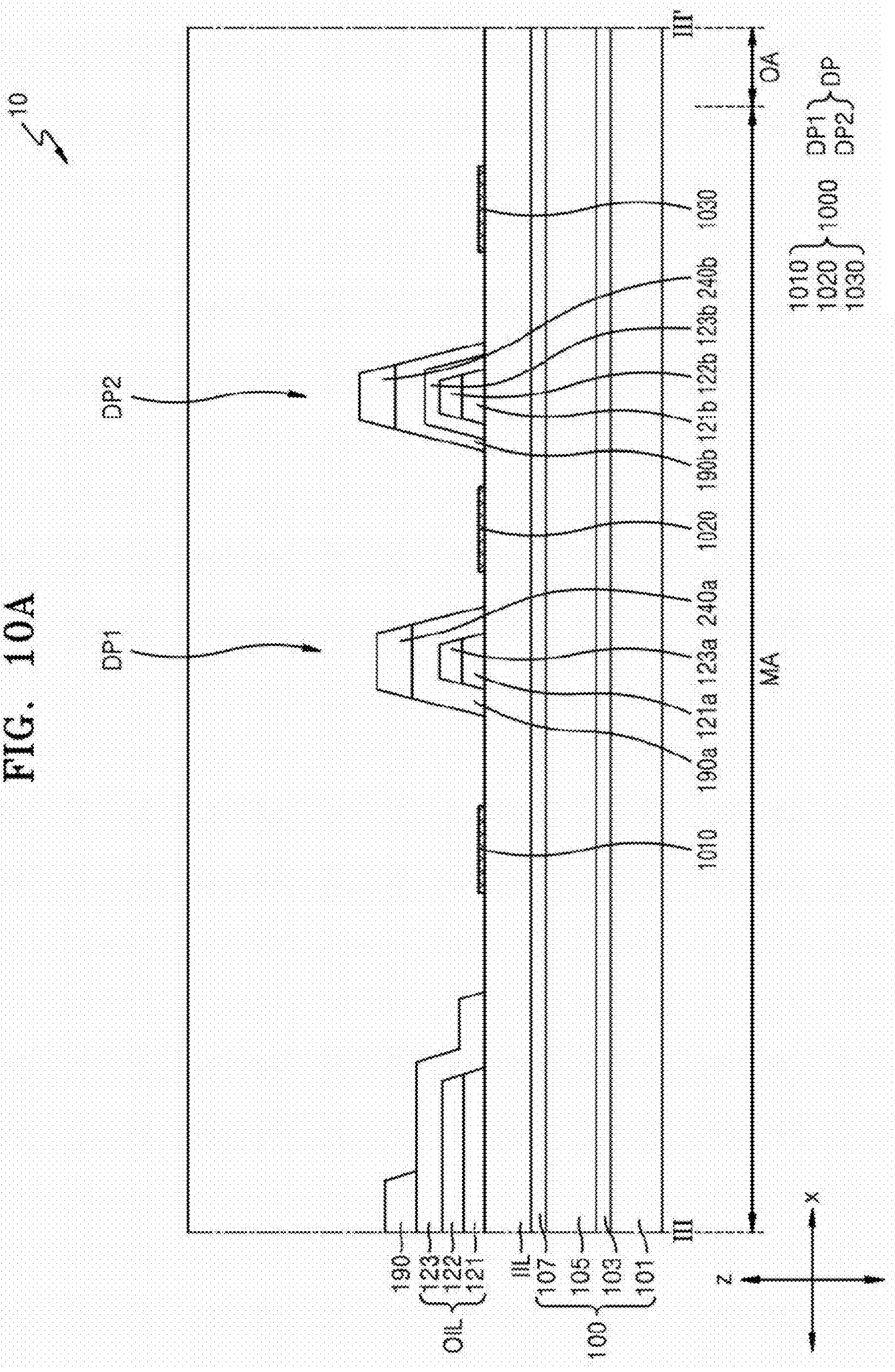
FIGS. 10A, 10D, 10E, 10F, and 10G are cross-sectional views illustrating a process of manufacturing a display panel according to an embodiment.
Figure 10B:
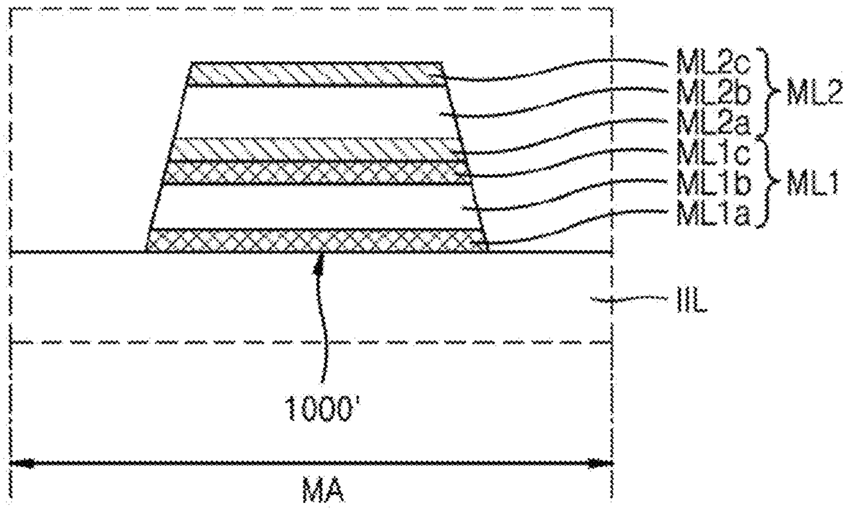
FIGS. 10B and 10C are cross-sectional views illustrating a process of forming a sacrificial layer of FIG. 10A.
Figure 10C:
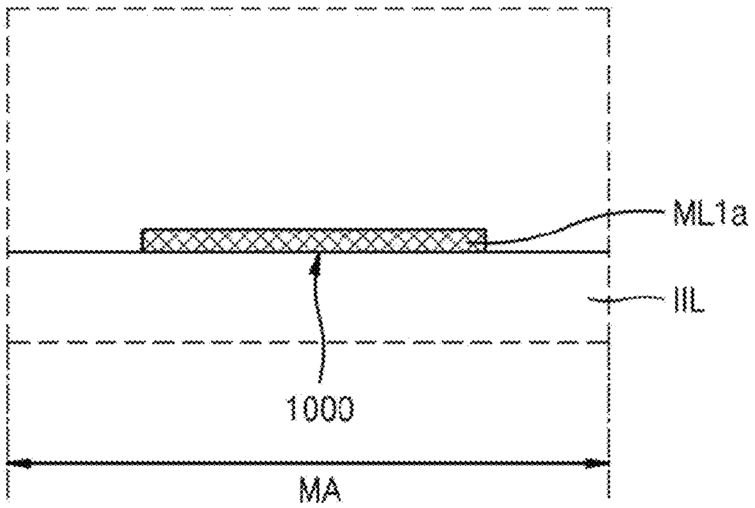

FIGS. 10A, 10D, 10E, 10F, and 10G are cross-sectional views illustrating a process of manufacturing a display panel 10 according to some embodiments, and FIGS. 10B and 10C are cross-sectional views illustrating a process of forming a sacrificial layer 1000 of FIG. 10A.

Referring to FIG. 10A, the sacrificial layer 1000 may be formed in an intermediate area MA. The sacrificial layer 1000 may be formed on an inorganic insulating layer IIL.

According to some embodiments, the sacrificial layer 1000 may include a plurality of separate portions. For example, the sacrificial layer 1000 may include a first portion 1010, a second portion 1020, and a third portion 1030. According to some embodiments, the first portion 1010 of the sacrificial layer 1000 may be arranged between ends of first to third organic insulating layers 121, 122, and 123 and a first partition wall DP1. The second portion 1020 may be arranged between the first partition wall DP1 and a second partition wall DP2. The third portion 1030 may be arranged between the second partition wall DP2 and an opening area OA.

Referring to FIGS. 10B and 10C, the sacrificial layer 1000 may be formed by forming a preliminary sacrificial layer 1000' and then performing an etching process to remove a portion of the preliminary sacrificial layer 1000'.

First, the preliminary sacrificial layer 1000' may be formed on the inorganic insulating layer IIL. The preliminary sacrificial layer 1000' may be a layer in which at least one metal layer is stacked. For example, the preliminary sacrificial layer 1000' may include a first metal layer ML1 and a second metal layer ML2, which are sequentially stacked. The first metal layer ML1 may be located on the inorganic insulating layer IIL and may include a first sub-layer ML1*a*, a second sub-layer ML1*b*, and a third sub-layer ML1*c*, which are sequentially stacked. The second metal layer ML2 may be located on the first metal layer ML1 and may include a first sub-layer ML2*a*, a second sub-layer ML2*b*, and a third sub-layer ML2*c*, which are sequentially stacked.

At least one metal layer included in the preliminary sacrificial layer 1000' may be formed in the same process as at least one of the metal layers arranged in the pixel circuit layer PCL described with reference to FIG. 8. For example, the first metal layer ML1 of the preliminary sacrificial layer 1000' may be formed, in the same process, together with the first connection electrode CM1, the data line DL, and/or the driving voltage line PL. For example, the first metal layer ML1 may include a first sub-layer ML1*a*, a second sub-layer ML1*b*, and a third sub-layer ML1*c*, which form a triple-layered structure including Ti/Al/Ti layers. Also, the second metal layer ML2 may be formed in the same process as the second connection electrode CM2. For example, the second metal layer ML2 may include a first sub-layer ML2*a*, a second sub-layer ML2*b*, and a third sub-layer ML2*c*, which form a triple-layered structure including Ti/Al/Ti layers. However, the disclosure is not limited thereto. According to some embodiments, the first metal layer ML1 or the second metal layer ML2 may be formed, in the same process, together with a metal layer arranged between the third organic insulating layer 123 and the fourth organic insulating layer 124.

Thereafter, a portion of the preliminary sacrificial layer 1000' may be removed. For example, in the preliminary sacrificial layer 1000', the second metal layer ML2, and the third sub-layer ML1*c* and/or the second sub-layer ML1*b* of the first metal layer ML1 may be removed.

A portion of the preliminary sacrificial layer 1000' may be removed by an etching process, for example, a dry etching process and/or a wet etching process. For example, the second metal layer ML2, which has a triple-layered structure including Ti/Al/Ti layers, and the third sub-layer ML1*c* of the first metal layer ML1, which corresponds to a Ti layer, may be removed by dry etching. The second sub-layer ML1*b* corresponding to an Al layer may be removed by wet etching.

The dry etching process may be performed as an additional process after forming the second connection electrode CM2 described with reference to FIG. 8, or may be performed in the process of forming a metal layer arranged between the second organic insulating layer 122 and the third organic insulating layer 123. In addition, the wet etching process may be performed as an additional process after forming the second connection electrode CM2 described with reference to FIG. 8, or may be performed in the process of forming the sub-pixel electrode 210.

As a portion of the preliminary sacrificial layer 1000' is removed, the sacrificial layer 1000 may be formed. According to some embodiments, the sacrificial layer 1000 may include only the first sub-layer ML1*a* corresponding to a Ti layer. Alternatively, the sacrificial layer 1000 may include a first sub-layer ML1*a* and a second sub-layer ML1*b*, which form a double-layered structure including Ti/Al layers.

Figure 10D:
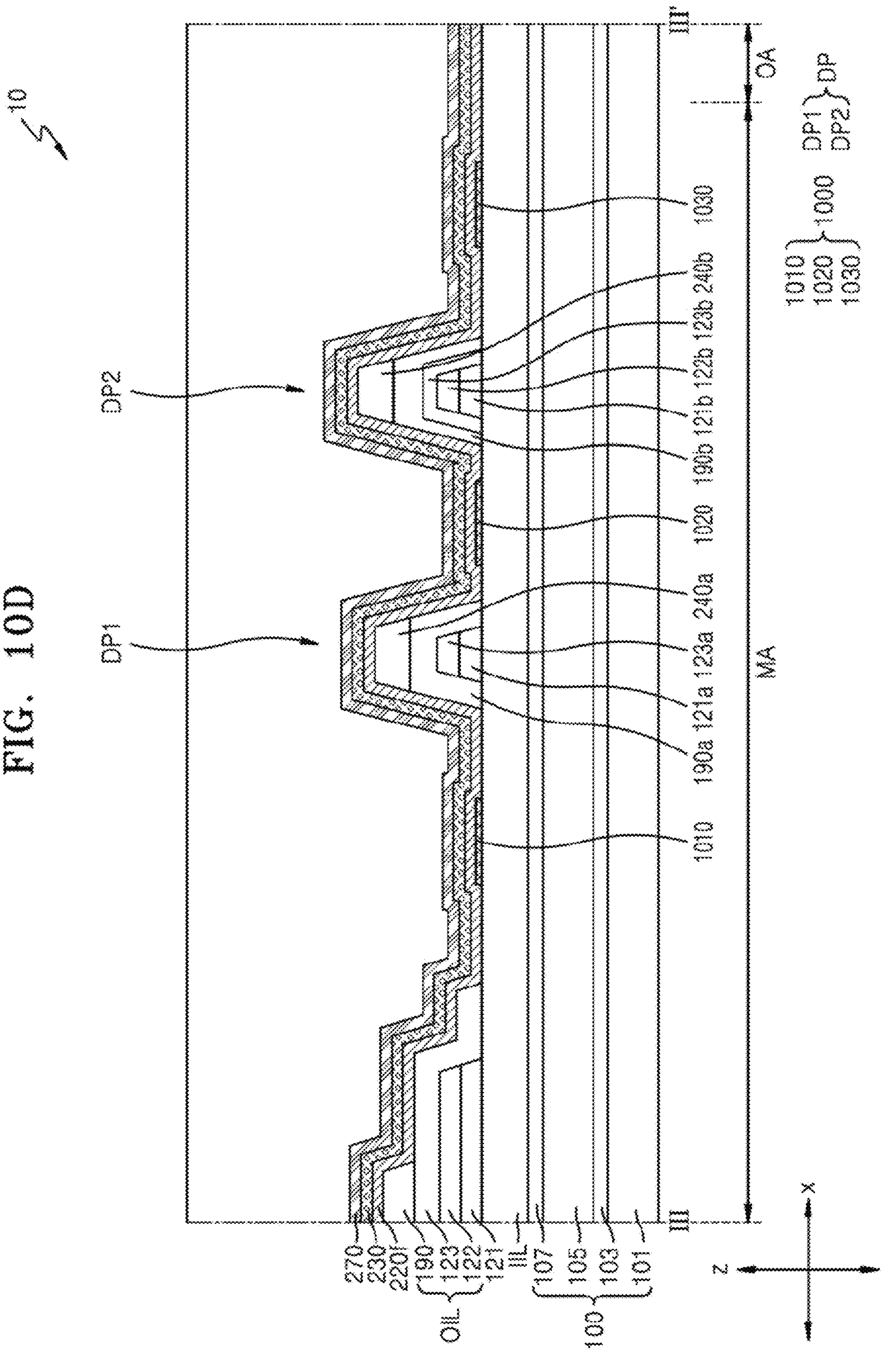

Referring to FIG. 10D, a functional layer 220*f* and an opposite electrode 230 of a light-emitting diode may be formed on the substrate 100 on which the sacrificial layer 1000 and the partition wall DP are formed. The functional layer 220*f* and the opposite electrode 230 may be formed by thermal evaporation. Thereafter, a capping layer 270 may be formed. As described with reference to FIG. 9, the functional layer 220*f*, the opposite electrode 230, and the capping layer 270 may be formed to entirely cover the substrate 100. The functional layer 220*f*, the opposite electrode 230, and the capping layer 270 may also be located on the first and second partition walls DP1 and DP2.

When the functional layer 220*f* and the opposite electrode 230, which are common layers, entirely cover the upper surface of the substrate 100, cracks may occur or moisture may flow into the light-emitting diode. In order to prevent or reduce this phenomenon, in the intermediate area MA, a portion of the functional layer 220*f* (e.g., portions of the first and second functional layers 220*a* and 220*c* (see FIG. 8)) and a portion of the opposite electrode 230 may be removed. To this end, a laser may be irradiated to the substrate 100.

The laser may be irradiated in a direction from the lower surface of the substrate 100 toward the upper surface of the substrate 100. The laser may be irradiated a plurality of times, and when the laser is irradiated a plurality of times, the type, output, and/or irradiation range of the laser may be changed. In some embodiments, the output of the laser may be set based on a band gap of the opposite electrode 230. The diameter of a laser beam may be determined by the width of the sacrificial layer 1000. During a laser lift-off process, the sacrificial layer 1000 may be heated to a certain temperature by absorbing the laser, and layers located on the sacrificial layer 1000 may be removed together with the sacrificial layer 1000.

Figure 10E:
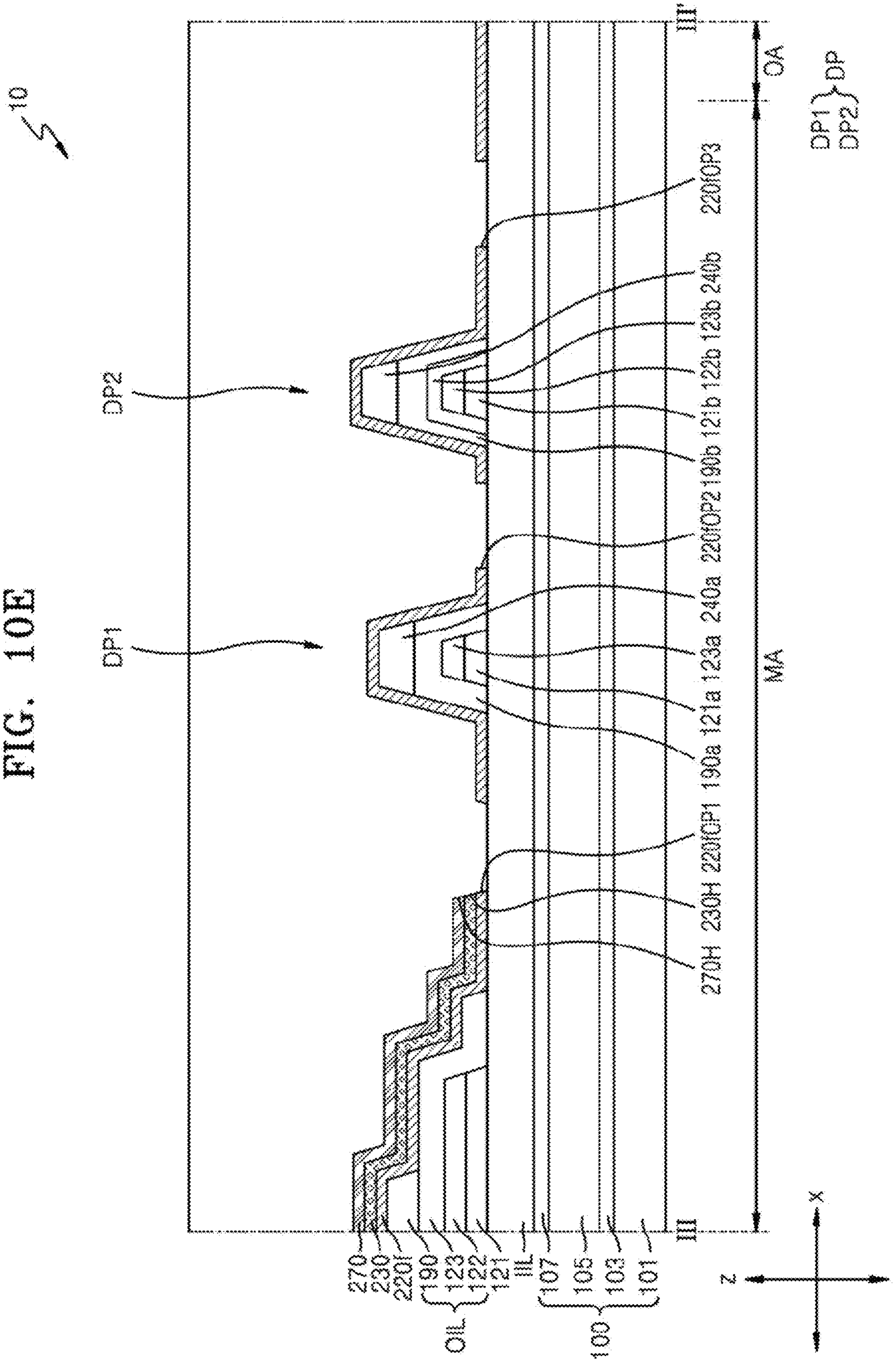

Referring to FIG. 10E, a portion of the functional layer 220*f* may be removed by a laser. In this regard, FIG. 10E shows the openings 220*f*OP1, 220*f*OP2, and 220*f*OP3 formed while a portion of the functional layer 220*f* positioned in the intermediate area MA is removed.

Also, a portion of the opposite electrode 230 positioned in the intermediate area MA and a portion of the capping layer 270 positioned in the intermediate area MA may be removed by a laser. In this regard, FIG. 10E shows the hole 230H of the opposite electrode 230 and the hole 270H of the capping layer 270, formed while the portion of the opposite electrode 230 positioned in the intermediate area MA and the portion of the capping layer 270 positioned in the intermediate area MA are removed. Each of the hole 230H of the opposite electrode 230 and the hole 270H of the capping layer 270 may be a single hole positioned in the intermediate area MA. The hole 230H of the opposite electrode 230 and the hole 270H of the capping layer 270 may be formed to occupy most of the opening area OA and the intermediate area MA.

Figure 10F:
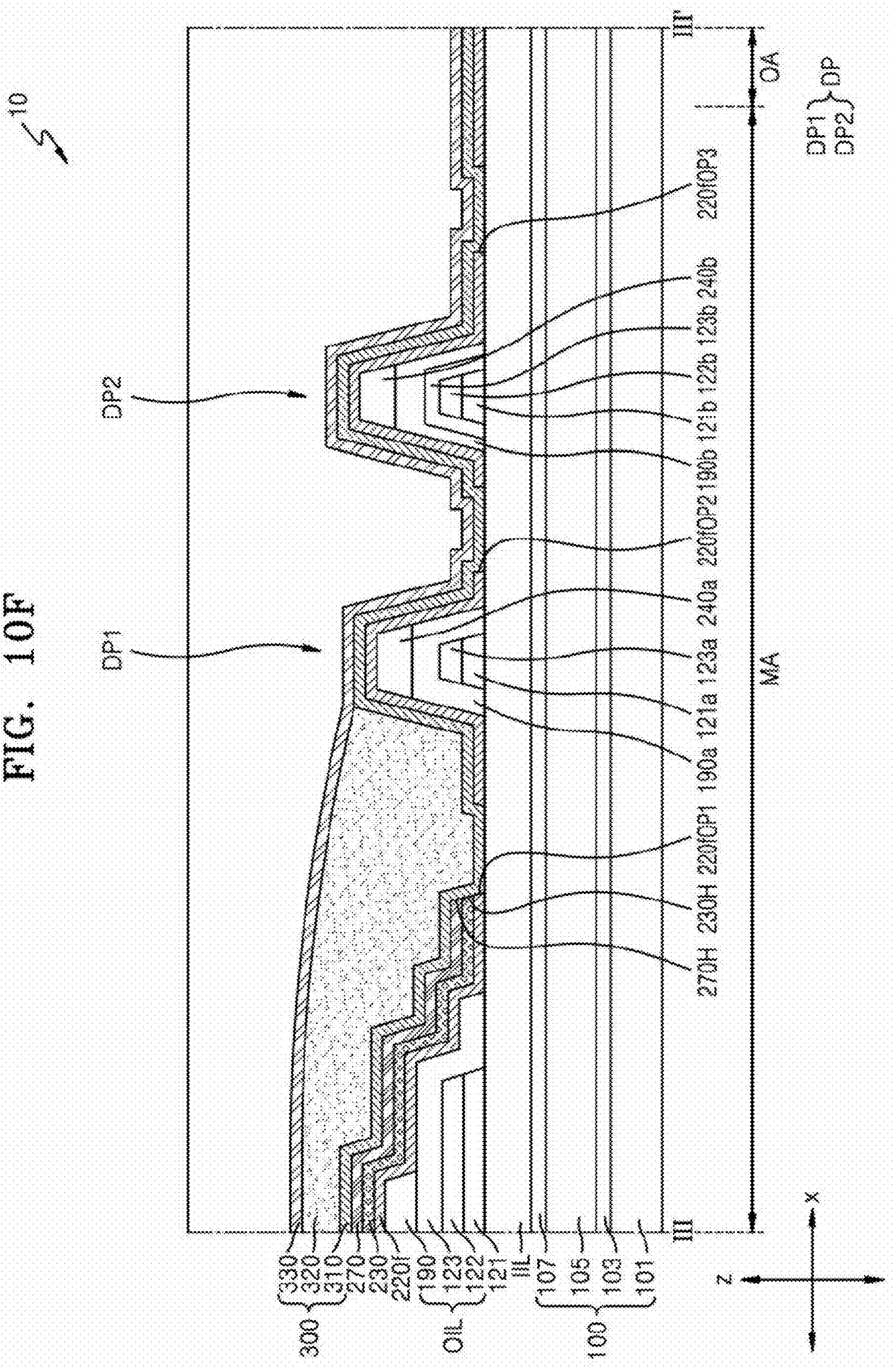

Referring to FIG. 10F, an encapsulation layer 300 may be formed on the substrate 100 on which the structure described with reference to FIG. 10E is formed.

A first inorganic encapsulation layer 310 of the encapsulation layer 300 may be formed to entirely cover the substrate 100. The first inorganic encapsulation layer 310 may be formed by a chemical vapor deposition method or the like. Because the sacrificial layer 1000 is removed in the laser lift-off process described above, the first inorganic encapsulation layer 310 may be in direct contact with the upper surface of the inorganic insulating layer IIL exposed by openings 220*f*OP1, 220*f*OP2, and 220*f*OP3 of the functional layer 220*f*, for example, with the upper surface of an interlayer insulating layer 119.

An organic encapsulation layer 320 may be formed by applying a monomer through an inkjet method or the like and then curing the monomer. The organic encapsulation layer 320 may include a resin formed while the monomer is cured. The specific material of the organic encapsulation layer 320 is the same as described above.

A second inorganic encapsulation layer 330 may be formed on the organic encapsulation layer 320 and may be formed by a chemical vapor deposition method and the like, like the first inorganic encapsulation layer 310. The second inorganic encapsulation layer 330 may directly contact the first inorganic encapsulation layer 310 in a portion of the intermediate area MA, in which the organic encapsulation layer 320 is not formed, and the opening area OA. For example, the second inorganic encapsulation layer 330 may directly contact the first inorganic encapsulation layer 310 between the edge of the organic encapsulation layer 320 and the opening area OA, thereby further reducing or preventing the possibility of moisture permeation.

Figure 10G:
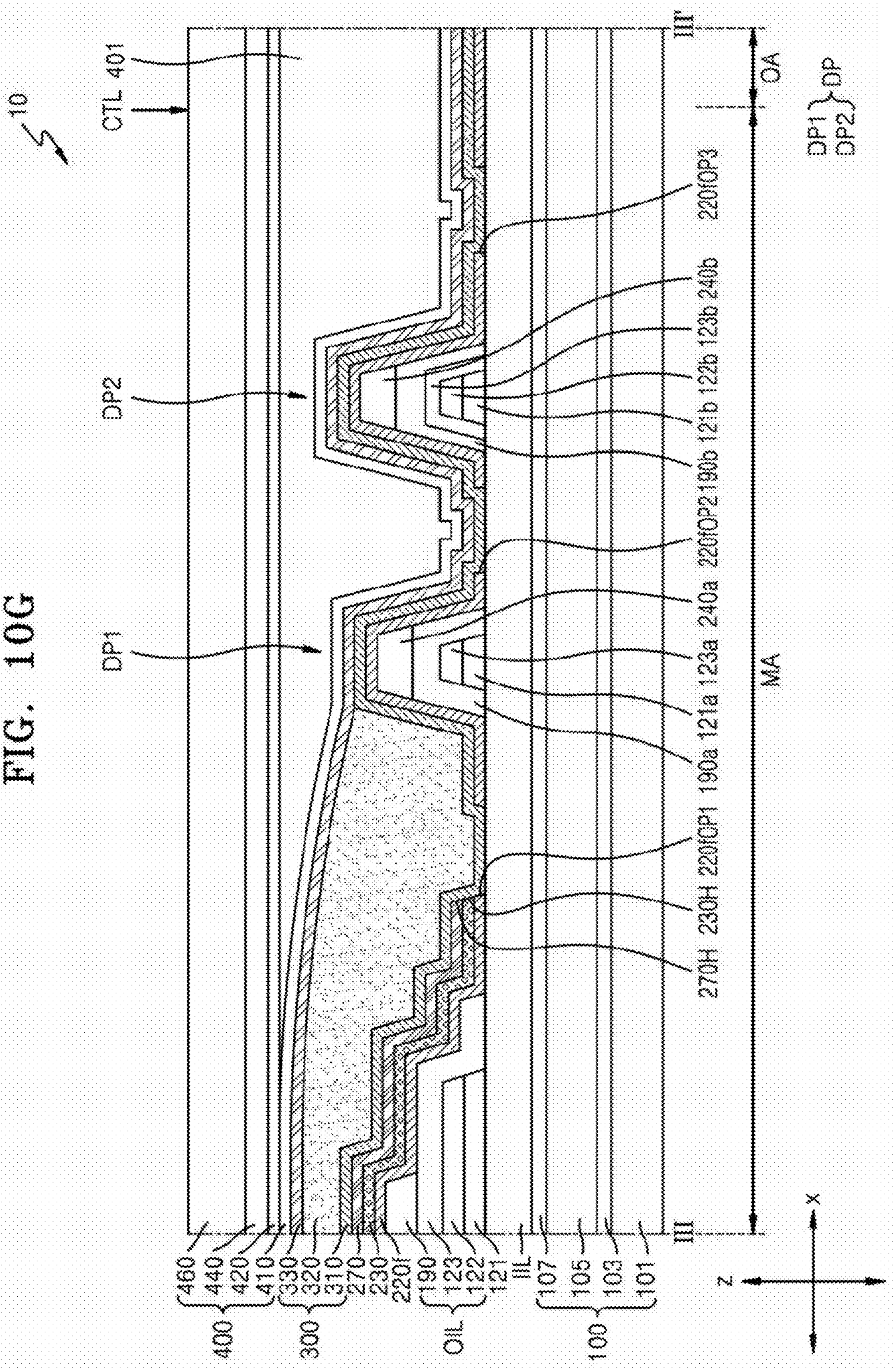

Referring to FIG. 10G, a protective layer 410, a first touch insulating layer 420, a second touch insulating layer 440, and/or a third touch insulating layer 460 of a touch sensor layer 400 may be sequentially formed on the encapsulation layer 300. A planarization layer 401 may be further formed between the protective layer 410 and the first touch insulating layer 420 of the touch sensor layer 400.

Thereafter, when the opening area OA is cut along a cutting line CTL by a cutting method using a laser beam or the like, the display panel 10 may include an opening 10OP (see FIG. 9) formed in an opening area OA.

Figure 11:
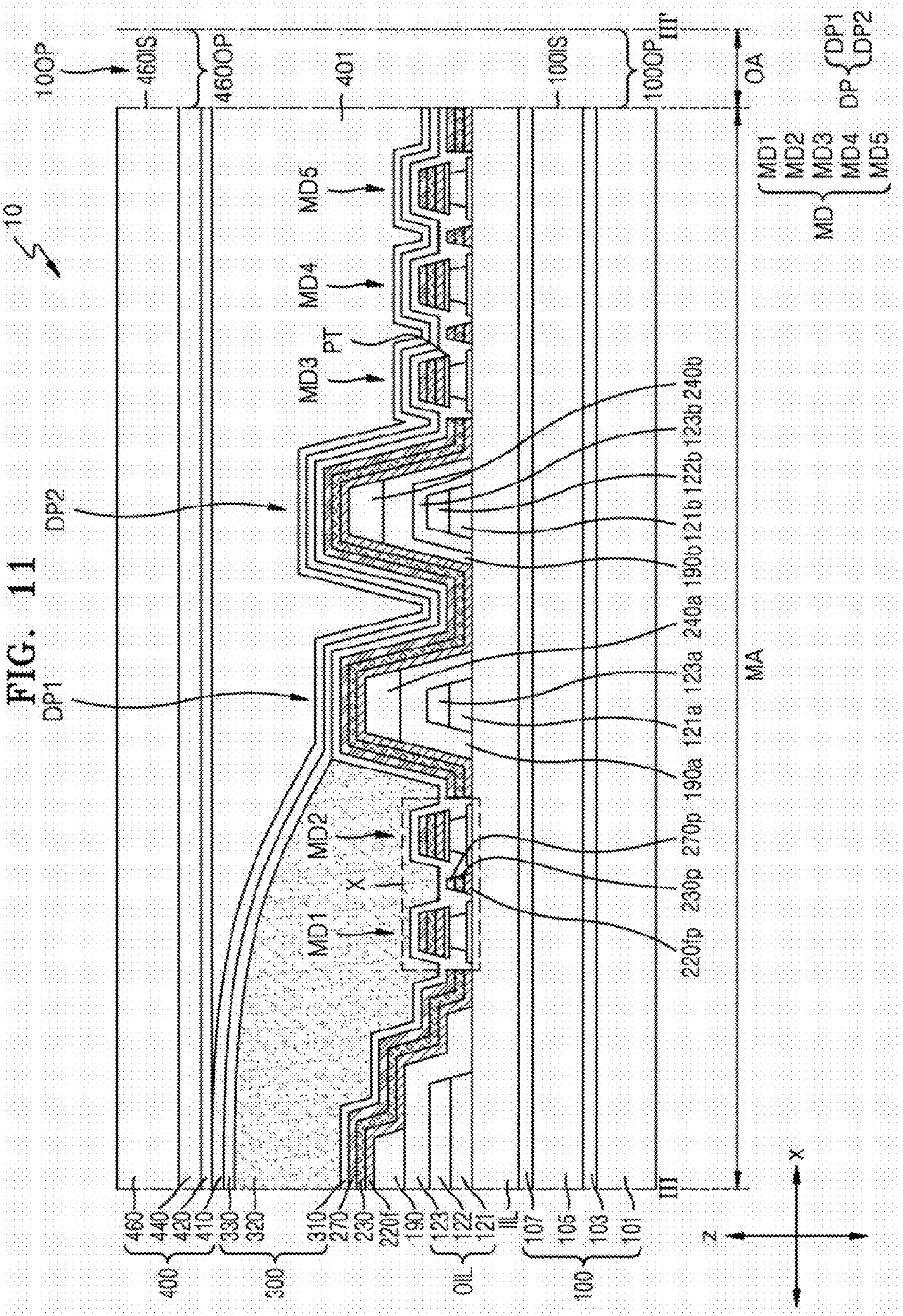
FIG. 11 is a schematic cross-sectional view of a portion of a display panel according to another embodiment.
Figure 12:
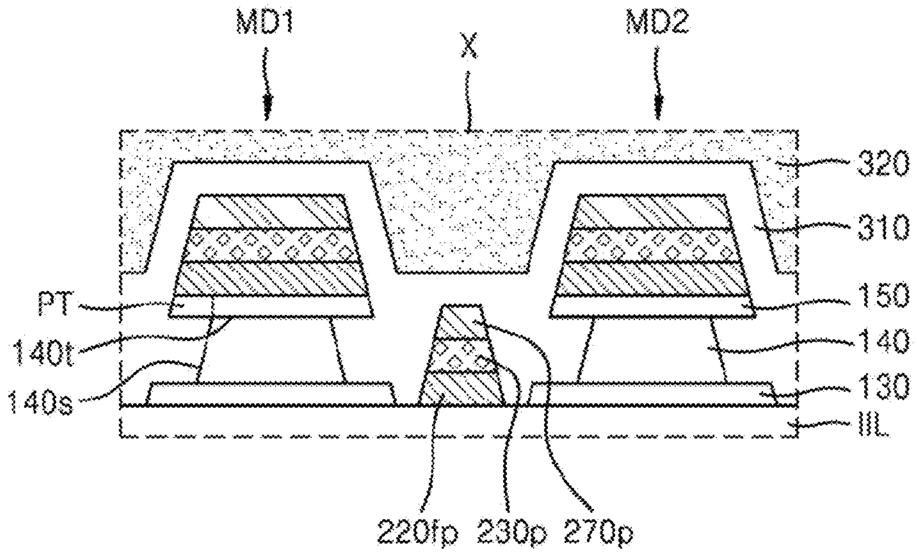
FIG. 12 is an enlarged cross-sectional view of a portion X of FIG. 11.

FIG. 11 is a schematic cross-sectional view of a portion of a display panel 10 according to some embodiments, and FIG. 12 is an enlarged cross-sectional view of a portion X of FIG. 11. FIG. 11 is a view for explaining components arranged in an intermediate area MA, and in FIG. 11, the same reference numerals as those in FIGS. 8 and 9 refer to the same members as those in FIG. 8, and thus, redundant descriptions thereof are omitted.

Referring to the intermediate area MA of FIGS. 11 and 12, an inorganic insulating layer IIL may be located on a substrate 100. According to some embodiments, the substrate 100 may include a first base layer 101, a first barrier layer 103, a second base layer 105, and a second barrier layer 107. The inorganic insulating layer IIL may include, for example, the buffer layer 111 (see FIG. 8), the first gate insulating layer 112 (see FIG. 8), the second gate insulating layer 113 (see FIG. 8), the first inorganic insulating layer 115 (see FIG. 8), the second inorganic insulating layer 117 (see FIG. 8), and the interlayer insulating layer 119 (see FIG. 8).

An organic insulating layer OIL may be located on the inorganic insulating layer IIL. The organic insulating layer OIL may include, for example, a first organic insulating layer 121, a second organic insulating layer 122, and a third organic insulating layer 123. A first bank layer 190 may be located on the organic insulating layer OIL.

An end of each of the first organic insulating layer 121, the second organic insulating layer 122, the third organic insulating layer 123, and the first bank layer 190, which extend from the display area DA to the intermediate area MA, may be located in the intermediate area MA and may be spaced apart from partition walls DP to be described below.

Separators MD and the partition walls DP may be arranged in the intermediate area MA. The partition walls DP may include a first partition wall DP1 and a second partition wall DP2, which are arranged to be spaced apart from each other. The first partition wall DP1 may include a portion 121*a* of the first organic insulating layer 121, a portion 123*a* of the third organic insulating layer 123, a portion 190*a* of the first bank layer 190, and a portion 240*a* of a spacer. The second partition wall DP2 may include a portion 121*b* of the first organic insulating layer 121, a portion 122*b* of the second organic insulating layer 122, a portion 123*b* of the third organic insulating layer 123, a portion 190*b* of the first bank layer 190, and a portion 240*b* of the spacer.

The separators MD may include a first separator MD1, a second separator MD2, a third separator MD3, a fourth separator MD4, and a fifth separator MD5, which are arranged to be spaced apart from each other. However, the disclosure is not limited thereto. Six or more separators MD may be provided in the intermediate area MA. For example, eight separators MD may be arranged in the intermediate area MA. Each of the first to fifth separators MD1, MD2, MD3, MD4, and MD5 may be arranged along the periphery of an opening area OA and may have a closed loop shape surrounding the opening area OA in a plan view.

The separator MD may have a structure in which a first metal pattern layer 130, a second metal pattern layer 140, and a third metal pattern layer 150 are sequentially stacked. The first metal pattern layer 130 and the third metal pattern layer 150 of the separator MD may include the same material. The second metal pattern layer 140 may include a material that is different from that of the first metal pattern layer 130 and the third metal pattern layer 150.

The separator MD may include the same material as one of the metal layers located on the pixel circuit layer PCL. According to some embodiments, the separator MD may be located on the same layer (e.g., the second organic insulating layer 122) as the second connection electrode CM2 described with reference to FIG. 8, and may include the same material as the second connection electrode CM2. For example, the first metal pattern layer 130, the second metal pattern layer 140, and the third metal pattern layer 150 of the separator MD may include the same material as the first layer CM2*a*, the second layer CM2*b*, and the third layer CM2*c* of the second connection electrode CM2, respectively. For example, the first metal pattern layer 130 and the third metal pattern layer 150 may include Ti, and the second metal pattern layer 140 may include Al. However, the disclosure is not limited thereto. According to some embodiments, the separator MD may include the same material as a metal layer arranged between the third organic insulating layer 123 and the fourth organic insulating layer 124.

As shown in FIGS. 11 and 12, the separator MD may be formed such that the width of the third metal pattern layer 150 on the second metal pattern layer 140 is greater than the width of an upper surface 140*t* of the second metal pattern layer 140. In other words, in cross-section, the third metal pattern layer 150 may include a pair of tips PT protruding to both sides from a point where a side surface 140*s* and the top surface 140*t* of the second metal pattern layer 140 meet each other.

An organic material layer included in the light-emitting diode, for example, the functional layer 220*f*, may be disconnected in the intermediate area MA. The functional layer 220*f* may include the first functional layer 220*a* (see FIG. 8) and the second functional layer 220*c* (see FIG. 8). The functional layer 220*f* may be disconnected or separated by the tips PT of the separators MD.

Moisture or oxygen near the opening area OA of the display panel 10 may be diffused to a light-emitting diode of the display area DA (see FIG. 8), and the functional layer 220*f* that is continuously formed may function as a diffusion path for the moisture. However, as shown in FIG. 11, because the functional layer 220*f* in the intermediate area MA is disconnected by the tips PT of the first to fifth separators MD1, MD2, MD3, MD4, and MD5, moisture or oxygen may be prevented from proceeding to the light-emitting diode.

Also, the opposite electrode 230 and the capping layer 270 may be disconnected in the intermediate area MA. In this regard, FIG. 11 illustrates an example in which the opposite electrode 230 and the capping layer 270 are disconnected or separated by the first to fifth separators MD1, MD2, MD3, MD4, and MD5.

For example, as the functional layer 220*f*, the opposite electrode 230, and the capping layer 270 placed on the tips PT of the first separator MD1 and the second separator MD2 are disconnected or separated, a portion 220*fp* of the functional layer 220*f*, a portion 230*p* of the opposite electrode 230, and a portion 270*p* of the capping layer 270 may be located on the upper surface of the inorganic insulating layer IIL between the first separator MD1 and the second separator MD2. Similarly, also on the upper surface of the inorganic insulating layer IIL between the third separator MD3 and the fourth separator MD4 and between the fourth separator MD4 and the fifth separator MD5, the portion 220*fp* of the functional layer 220*f*, the portion 230*p* of the opposite electrode 230, and the portion 270*p* of the capping layer 270, which are separated by the tips PT, may be located.

The first inorganic encapsulation layer 310 of the encapsulation layer 300 may continuously cover the separators MD and the partition walls DP arranged in the intermediate area MA. The organic encapsulation layer 320 may cover some of the separators MD, for example, the first separator MD1 arranged between the first partition wall DP1 and the second partition wall DP2. The second inorganic encapsulation layer 330 on the organic encapsulation layer 320 may entirely cover the intermediate area MA.

When the organic encapsulation layer 320 is formed, the flow of a monomer may be controlled by the separator MD and the partition wall PD. For example, an end of the organic encapsulation layer 320 may be located at one side of the first partition wall DP1 and/or the second partition wall DP2. The first inorganic encapsulation layer 310 and the second inorganic encapsulation layer 330 may directly contact each other on the upper surfaces of the first partition wall DP1 and/or the second partition wall DP2.

A portion of the touch sensor layer 400 may extend from the display area DA to the intermediate area MA. In this regard, FIG. 11 shows a structure in which the protective layer 410, the first touch insulating layer 420, the second touch insulating layer 440, and the third touch insulating layer 460 extend to the intermediate area MA. According to some embodiments, a planarization layer 401 may be further arranged between the protective layer 410 and the first touch insulating layer 420. The planarization layer 401 may be arranged only in the intermediate area MA.

Referring to the opening area OA, the display panel 10 includes an opening 10OP. The opening 10OP of the display panel 10 may include openings of components constituting the display panel 10. For example, the opening 10OP of the display panel 10 may include an opening 100OP of the substrate 100 and an opening 460OP of the third touch insulating layer 460.

An inner surface 100IS of the substrate 100, which defines the opening 100OP of the substrate 100, and an inner surface 460IS of the third touch insulating layer 460, which defines the opening 460OP of the third touch insulating layer 460, may be located on the same vertical line.

Figure 13A:
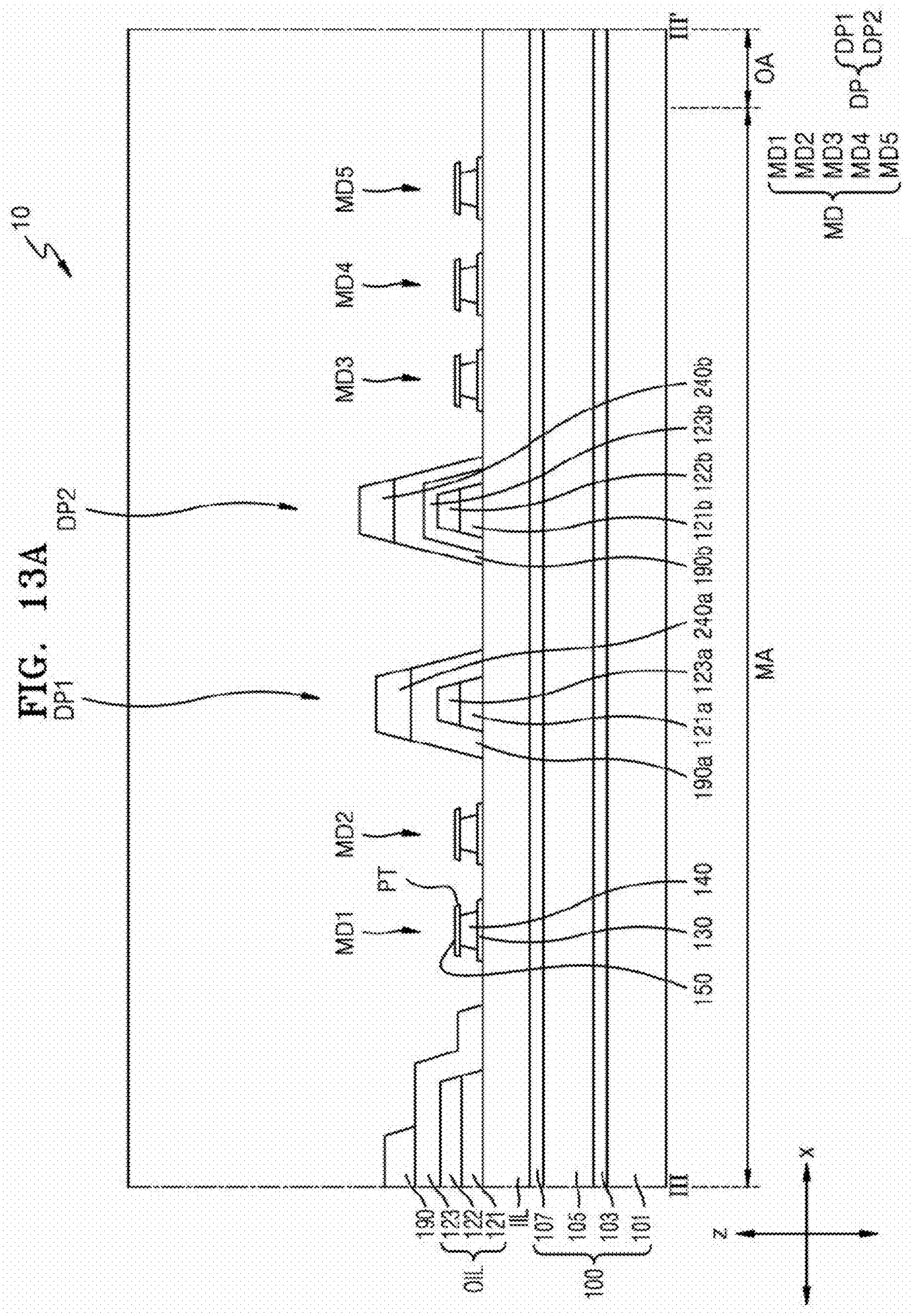
FIGS. 13A, 13D, and 13E are cross-sectional views illustrating a process of manufacturing a display panel according to another embodiment.
Figure 13B:
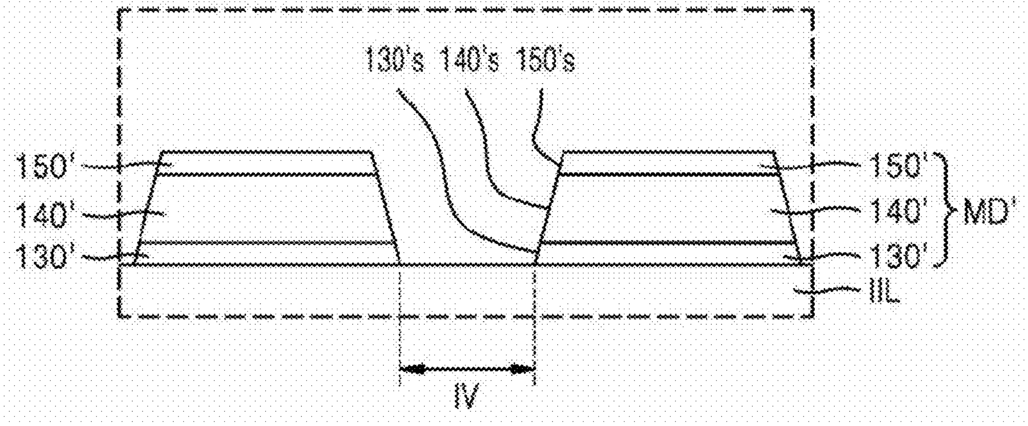
FIGS. 13B and 13C are cross-sectional views illustrating a process of forming a separator of FIG. 13A.
Figure 13C:
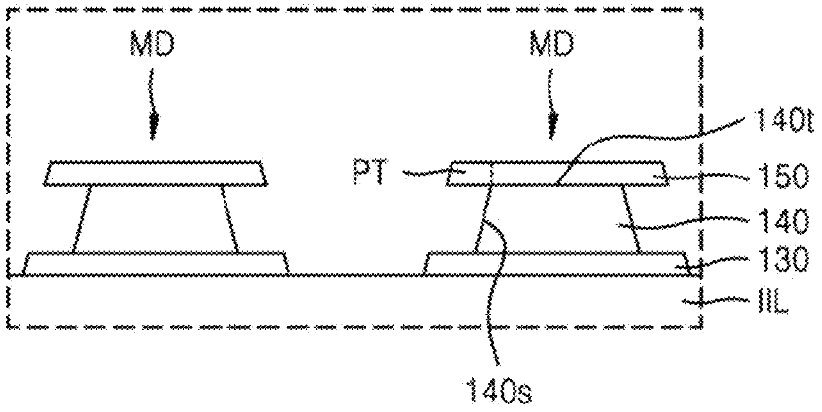
Figure 13D:
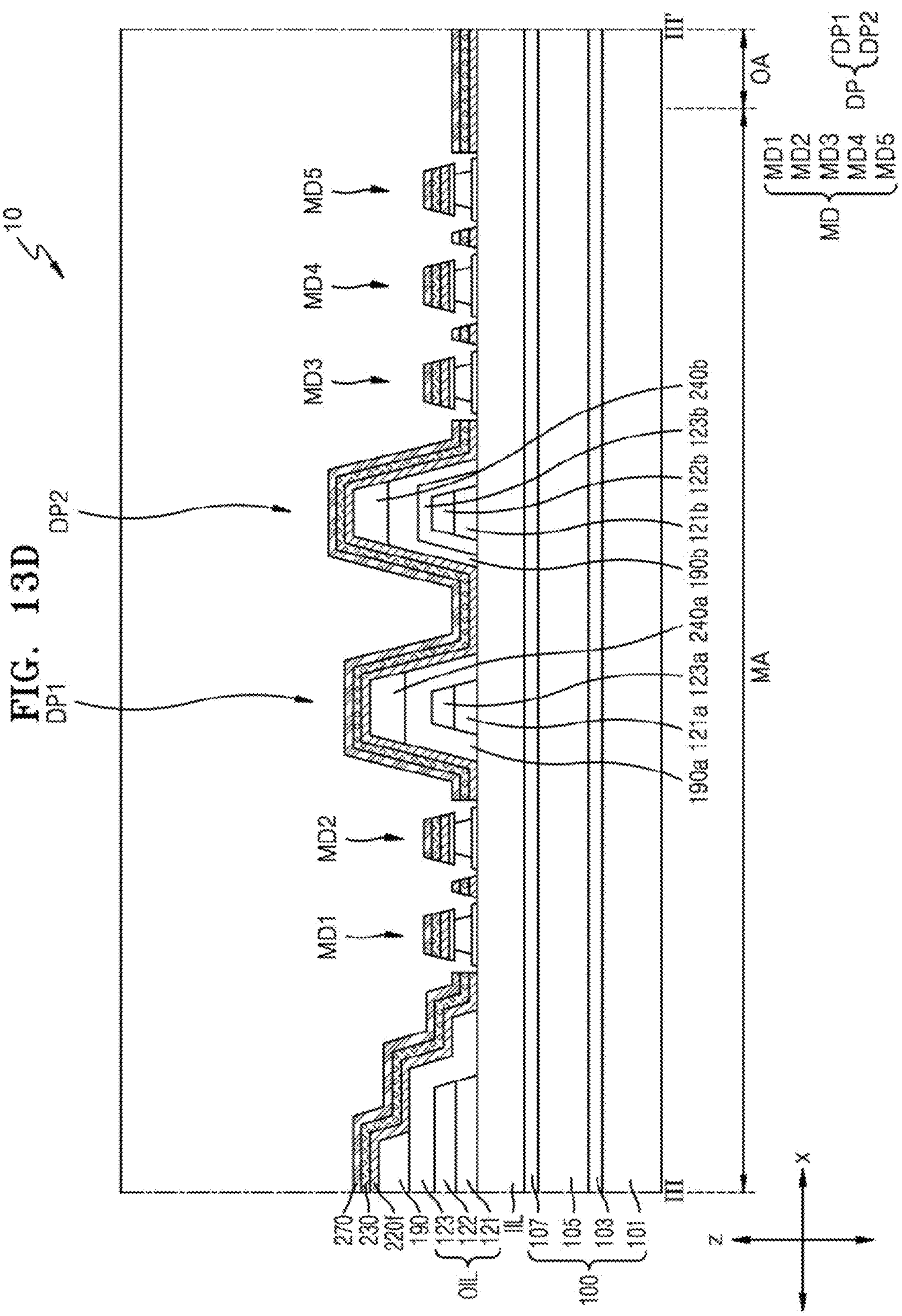
Figure 13E:
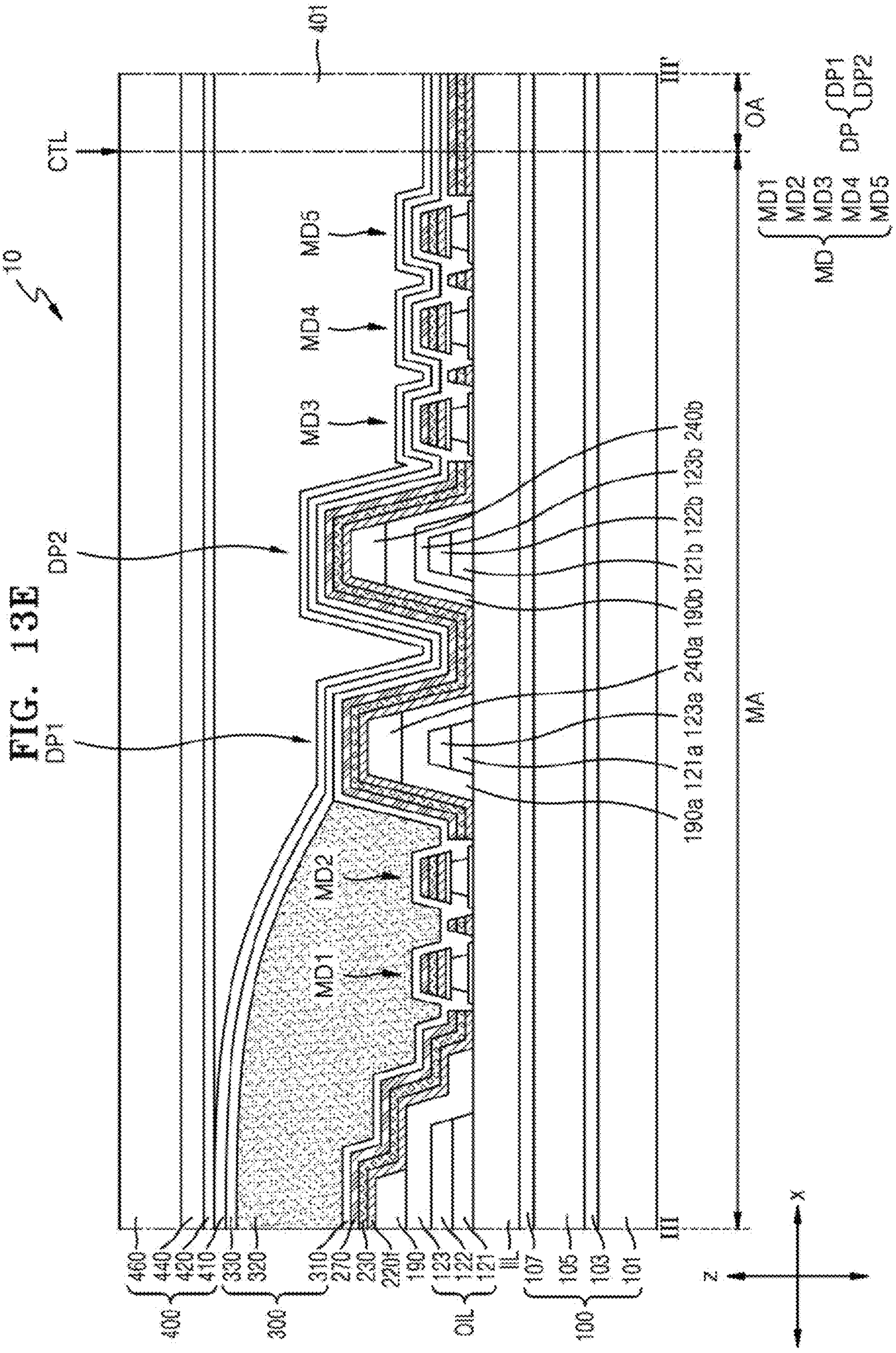

FIGS. 13A, 13D, and 13E are cross-sectional views illustrating a process of manufacturing a display panel 10 according to some embodiments, and FIGS. 13B and 13C are cross-sectional views illustrating a process of forming a separator of FIG. 13A.

Referring to FIG. 13A, separators MD and first and second partition walls DP1 and DP2 may be formed in an intermediate area MA. First to fifth separators MD1, MD2, MD3, MD4, and MD5 and the first and second partition walls DP1 and DP2 may be formed on an inorganic insulating layer K. According to some embodiments, the first separator MD1 and the second separator MD2 may be arranged between a display area DA and the first partition wall DP1. The third separator MD3, the fourth separator MD4, and the fifth separator MD5 may be arranged between the second partition wall DP2 and an opening area OA.

Referring FIGS. 13B and 13C, each of the separators MD may be formed by forming a preliminary separator MD' and then removing a portion of the preliminary separator MD'.

First, the preliminary separator MD' may be formed on the inorganic insulating layer IIL. The preliminary separator MD' may include a first preliminary metal pattern layer 130', a second preliminary metal pattern layer 140', and a third preliminary metal pattern layer 150'. The first preliminary metal pattern layer 130', the second preliminary metal pattern layer 140', and the third preliminary metal pattern layer 150' may be arranged to overlap one another. The preliminary separator MD' may be spaced apart from a neighboring preliminary separator MD' at a certain interval IV.

The preliminary separator MD' may be formed in the same process as one of the metal layers located on the pixel circuit layer PCL described with reference to FIG. 8. For example, the preliminary separator MD' may be formed together with the second connection electrode CM2 in the same process. For example, the first preliminary metal pattern layer 130', the second preliminary metal pattern layer 140', and the third preliminary metal pattern layer 150' of the preliminary separator MD' may include the same material as the first layer CM2*a*, the second layer CM2*b*, and the third layer CM2*c* of the second connection electrode CM2, respectively. According to some embodiments, the first preliminary metal pattern layer 130' and the third preliminary metal pattern layer 150' may include Ti, and the second preliminary metal pattern layer 140' may include Al.

An end (or side surface) 130's of the first preliminary metal pattern layer 130', an end (or side surface) 140's of the second preliminary metal pattern layer 140', and an end (or side surface) 150's of the third preliminary metal pattern layer 150' may be exposed to the outside without being covered by insulating layers.

Referring to FIG. 13C, a portion of the preliminary separator MD' may be removed. For example, portions of the first to third preliminary metal pattern layers 130', 140', and 150' of the preliminary separator MD' may be removed. An operation of removing the portion of the preliminary separator MD' may be performed by an etching process, for example, a wet etching process. According to some embodiments, the etching process may be performed in the process of forming the sub-pixel electrode 210 described with reference to FIG. 8.

In the etching process, the separator MD may be formed as a portion of the preliminary separator MD' is removed. For example, the first metal pattern layer 130 may be formed as the exposed end (or side surface) 130's of the first preliminary metal pattern layer 130' is partially removed. The second metal pattern layer 140 may be formed as the exposed end (or side surface) 140's of the second preliminary metal pattern layer 140' is partially removed. The third metal pattern layer 150 may be formed as the exposed end (or side surface) 150's of the third preliminary metal pattern layer 150' is partially removed.

The material of the second preliminary metal pattern layer 140' may include a material having an etch selectivity different from those of the first preliminary metal pattern layer 130' and the third preliminary metal pattern layer 150'. By an etchant used in the etching process contains, the second preliminary metal pattern layer 140' including, for example, Al may be over-etched compared to the first preliminary metal pattern layer 130' and the third preliminary metal pattern layer 150', which include, for example, Ti. Accordingly, a structure in which the third metal pattern layer 150 of the separator MD has a tip PT may be formed.

Referring to FIG. 13D, a functional layer **220*f* and an opposite electrode 230 of a light-emitting diode may be formed on the substrate 100 on which the separators MD and the partition walls DP are formed. Thereafter, a capping layer 270 may be formed. The functional layer 220*f*, the opposite electrode 230, and the capping layer 270 may also be formed in the intermediate area MA. The functional layer 220*f*, the opposite electrode 230, and the capping layer 270 may also be located on the first to fifth separators MD1, MD2, MD3, MD4, and MD5 and the first and second partition walls DP1 and DP2. Each of the functional layer 220*f*, the opposite electrode 230, and the capping layer 270 may be disconnected or separated by tips PT of the first to fifth separators MD1, MD2, MD3, MD4, and MD5**.

Referring to FIG. 13E, an encapsulation layer 300 and a touch sensor layer 400 may be formed. A first inorganic encapsulation layer 310 of the encapsulation layer 300 has relatively excellent step coverage, and thus may continuously cover an upper surface of the inorganic insulating layer IIL exposed between the first to fifth separators MD1, MD2, MD3, MD4, and MD5, and lower surfaces of the tips PT of the first to fifth separators MD1, MD2, MD3, MD4, and MD5. The first inorganic encapsulation layer 310 may also continuously cover side surfaces and upper surfaces of the first and second partition walls DP1 and DP2. A second inorganic encapsulation layer 330 may be formed on an organic encapsulation layer 320. The second inorganic encapsulation layer 330 may directly contact the first inorganic encapsulation layer 310 in a portion of the intermediate area MA, in which the organic encapsulation layer 320 is not formed, and the opening area OA.

A protective layer 410, a first touch insulating layer 420, a second touch insulating layer 440, and/or a third touch insulating layer 460 of the touch sensor layer 400 may be sequentially formed on the encapsulation layer 300. A planarization layer 401 may be further formed between the protective layer 410 and the first touch insulating layer 420 of the touch sensor layer 400.

Thereafter, when components positioned in the opening area OA are removed along a cutting line CTL by using a laser beam or the like, an opening 10OP of the display panel 10 may be formed in the opening area OA, as shown in FIG. 11.

Figure 14:
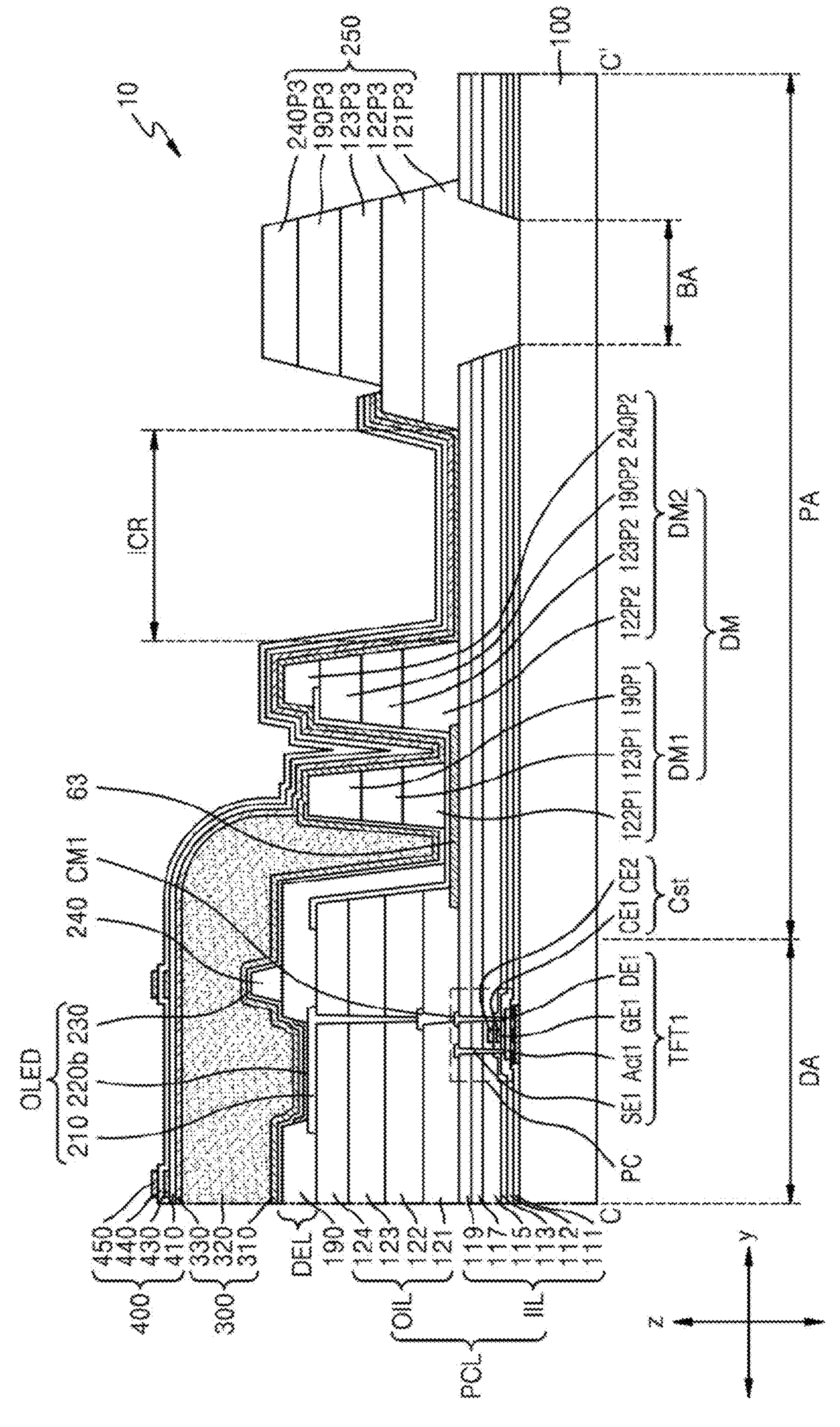
FIG. 14 is a schematic cross-sectional view of a portion of a display panel according to some embodiments, taken along the line C-C' of FIG. 3.

FIG. 14 is a schematic cross-sectional view of a portion of a display panel 10 according to some embodiments, and is a cross-sectional view of the display panel 10 taken along the line C-C' of FIG. 3.

Referring to FIG. 14, the display panel 10 may include a display area DA and a peripheral area PA. The structure of the display area DA is the same as described with reference to FIG. 8.

The display panel 10 may include a substrate 100, a pixel circuit layer PCL, and a display element layer DEL. The pixel circuit layer PCL may be located on the substrate 100. The pixel circuit layer PCL may include a sub-pixel circuit PC, a first connection electrode CM1, a second connection electrode CM2, an inorganic insulating layer IIL, and an organic insulating layer OIL. The inorganic insulating layer IIL may include a buffer layer 111, a first gate insulating layer 112, a second gate insulating layer 113, a first inorganic insulating layer 115, a second inorganic insulating layer 117, and an interlayer insulating layer 119. The organic insulating layer OIL may include a first organic insulating layer 121, a second organic insulating layer 122, a third organic insulating layer 123, and a fourth organic insulating layer 124.

The sub-pixel circuit PC may include a first thin-film transistor TFT1 and a capacitor Cst. The first thin-film transistor TFT1 may include a first semiconductor layer Act1, a first gate electrode GE1, a first source electrode SE1, and a first drain electrode DE1. The capacitor Cst may include a first capacitor electrode CE1 and a second capacitor electrode CE2.

The display element layer DEL may be located on the pixel circuit layer PCL. The display element layer DEL may include a first bank layer 190 and a display element, for example, an organic light-emitting diode OLED. The organic light-emitting diode OLED may include a sub-pixel electrode 210, an emission layer **220*b*, and an opposite electrode 230**.

A spacer 240 may be located on the first bank layer 190. The spacer 240 may include an organic insulating material, such as polyimide. Alternatively, the spacer may include an inorganic insulating material, such as silicon oxide, silicon nitride, or silicon oxynitride, or may include an organic insulating material and an inorganic insulating material. According to some embodiments, the spacer 240 may include the same material as the first bank layer 190. In this case, the first bank layer 190 and the spacer 240 may be formed together in a mask process using a halftone mask or the like. According to some embodiments, the spacer 240 and the first bank layer 190 may include different materials.

The display element layer DEL and the pixel circuit layer PCL may be covered by an encapsulation layer 300. The encapsulation layer 300 may include first and second inorganic encapsulation layers 310 and 330 and an organic encapsulation layer 320 therebetween. The encapsulation layer 300 may entirely cover the display area DA and may extend toward the peripheral area PA to cover a portion of the peripheral area PA.

According to some embodiments, a touch sensor layer 400 may be located on the encapsulation layer 300. The touch sensor layer 400 may include a protective layer 410, a first touch conductive layer 430, a second touch insulating layer 440, and a second touch conductive layer 450.

A dam DM may be located in the peripheral area PA adjacent to the display area DA. The dam DM may be arranged to surround the display area DA, as described with reference to FIG. 3. Although FIG. 11 illustrates an example in which the dam DM includes a first dam DM1 and a second dam DM2 outside the first dam DM1, the dam DM may include only the first dam DM1 or may further include a partition wall adjacent to the second dam DM2.

Valleys may be respectively provided between the first dam DM1 and the display area DA and between the first dam DM1 and the second dam DM2. The first dam DM1, the second dam DM2, and a valley structure formed therethrough may prevent or reduce instances of the organic encapsulation layer 320 of the encapsulation layer 300 overflowing toward the edge of the substrate 100. Formation of an edge tail of the organic encapsulation layer 320 may be prevented or reduced.

The organic encapsulation layer 320 may be in contact with the inner surface of the first dam DM1 facing the display area DA. In this case, the fact that the organic encapsulation layer 320 is in contact with the inner surface of the first dam DM1 means that the first inorganic encapsulation layer 310 is located between the organic encapsulation layer 320 and the first dam DM1 and the organic encapsulation layer 320 directly contacts the first inorganic encapsulation layer 310. The first inorganic encapsulation layer 310 and the second inorganic encapsulation layer 330 may be located on the first dam DM1 and the second dam DM2. The first inorganic encapsulation layer 310 and the second inorganic encapsulation layer 330 may extend toward the edge of the substrate 100.

The first dam DM1 may include a portion 122P1 of the second organic insulating layer 122, a portion 123P1 of the third organic insulating layer 123, and a portion 190P1 of the first bank layer 190, and the second dam DM2 may include a portion 122P2 of the second organic insulating layer 122, a portion 123P2 of the third organic insulating layer 123, a portion 190P2 of the first bank layer 190, and a portion 240P2 of the spacer 240. According to some embodiments, each of the first dam DM1 and the second dam DM2 may further include portions of other layers, or some of the aforementioned layers may be omitted.

A driving voltage supply line 60 may be arranged to at least partially overlap the dam DM. For example, the third driving voltage supply line 63 may be arranged to overlap the first dam DM1 and the second dam DM2. According to some embodiments, the third driving voltage supply line 63 may include the same material as the first source electrode SE1 and the first drain electrode DE1 of the first thin-film transistor TFT1, or the first connection electrode CM1. For example, the third driving voltage supply line 63 may include a conductive material including Mo, Al, Cu, Ti, or the like, and may have a multi-layered or single-layered structure including the conductive material. According to some embodiments, the third driving voltage supply line 63 may have a triple-layered structure including Ti/Al/Ti layers.

As described above with reference to FIG. 3, at least a portion of the peripheral area PA may include a bending area BA. The bending area BA may be arranged to be spaced apart from the first dam DM1 and the second dam DM2. According to some embodiments, the inorganic insulating layer IIL may have an opening corresponding to the bending area BA. That is, the inorganic insulating layer IIL arranged to correspond to the bending area BA may be removed from the bending area BA. Although FIG. 3 illustrates an example in which the inorganic insulating layer IIL corresponding to the bending area BA is completely removed, according to some embodiments, a portion of the inorganic insulating layer IIL, for example, the buffer layer 111 may remain without being removed. As described above, by removing a portion or all of the inorganic insulating layer IIL located on the bending area BA, propagation of cracks by the inorganic insulating layer IIL when the substrate 100 bends may be prevented or reduced.

According to some embodiments, a bank 250 may be arranged in the peripheral area PA. The bank 250 may be arranged to be spaced apart from the first dam DM1 and the second dam DM2. The bank 250 may support masks used when the emission layer 220*b* and/or the opposite electrode 230 of the organic light-emitting diode OLED are formed in the process of manufacturing the display panel 10, and may prevent or reduce damage to underlying components by a mask.

According to some embodiments, the bank 250 may be arranged to at least partially overlap the bending area BA. When an inorganic layer is located on the bending area BA, cracks may occur in the inorganic layer, and thus, the bank 250 may generally include an organic insulating material. According to some embodiments, the bank 250 may include a portion 121P3 of the first organic insulation layer 121, a portion 122P3 of the second organic insulation layer 122, a portion 123P3 of the third organic insulation layer 123, a portion 190P3 of the first bank layer 190, and a portion 240P3 of the spacer 240. In other embodiments, the bank 250 may further include portions of other layers, or some of the aforementioned layers may be omitted. According to some embodiments, the portion 121P3 of the first organic insulating layer 121 and the portion 122P3 of the second organic insulating layer 122, which constitute the bank 250, may extend further in a direction (e.g., a y direction) from the bending area BA toward the display area DA than the portion 123P3 of the third organic insulation layer 123, the portion 190P3 of the first bank layer 190, and the portion 240P3 of the spacer 240.

The first inorganic encapsulation layer 310 and the second inorganic encapsulation layer 330 of the encapsulation layer 300 may extend toward the bank 250. According to some embodiments, the edges of the first inorganic encapsulation layer 310 and the second inorganic encapsulation layer 330 may be located on the bank 250. However, the disclosure is not limited thereto. According to some embodiments, the edges of the first inorganic encapsulation layer 310 and the second inorganic encapsulation layer 330 may be located between the second dam DM2 and the bank 250.

At least one of the protective layer 410, the second touch insulating layer 440, and the third touch insulating layer 460 of the touch sensor layer 400 may extend to the peripheral area PA. For example, the protective layer 410, the second touch insulating layer 440, and/or the third touch insulating layer 460 may extend toward the bank 250. The protective layer 410, the second touch insulating layer 440, and/or the third touch insulating layer 460 may extend up to the bending area BA. According to some embodiments, an end of the protective layer 410, an end of the second touch insulating layer 440, and/or an end of the third touch insulating layer 460 may be located on the bank 250. However, the disclosure is not limited thereto. According to some embodiments, an end of the protective layer 410, an end of the second touch insulating layer 440, and/or an end of the third touch insulating layer 460 may be located between the second dam DM2 and the bank 250.

According to some embodiments, the peripheral area PA may include a first area ICR. The first area ICR may be located between the second dam DM2 and the bank 250. The organic insulating layer OIL of the pixel circuit layer PCL including an organic material, the first bank layer 190, and/or the spacers 240 may not be arranged in the first area ICR. The first area ICR may include an area in which the inorganic insulating layer IIL and the first inorganic encapsulation layer 310 contact each other. In the first area ICR, the first inorganic encapsulation layer 310 includes an area in direct contact with the second inorganic encapsulation layer 330 and another inorganic insulating layer IIL thereunder, thereby improving bonding strength, and thus may more effectively prevent or reduce the penetration of moisture and oxygen.

Figure 15:
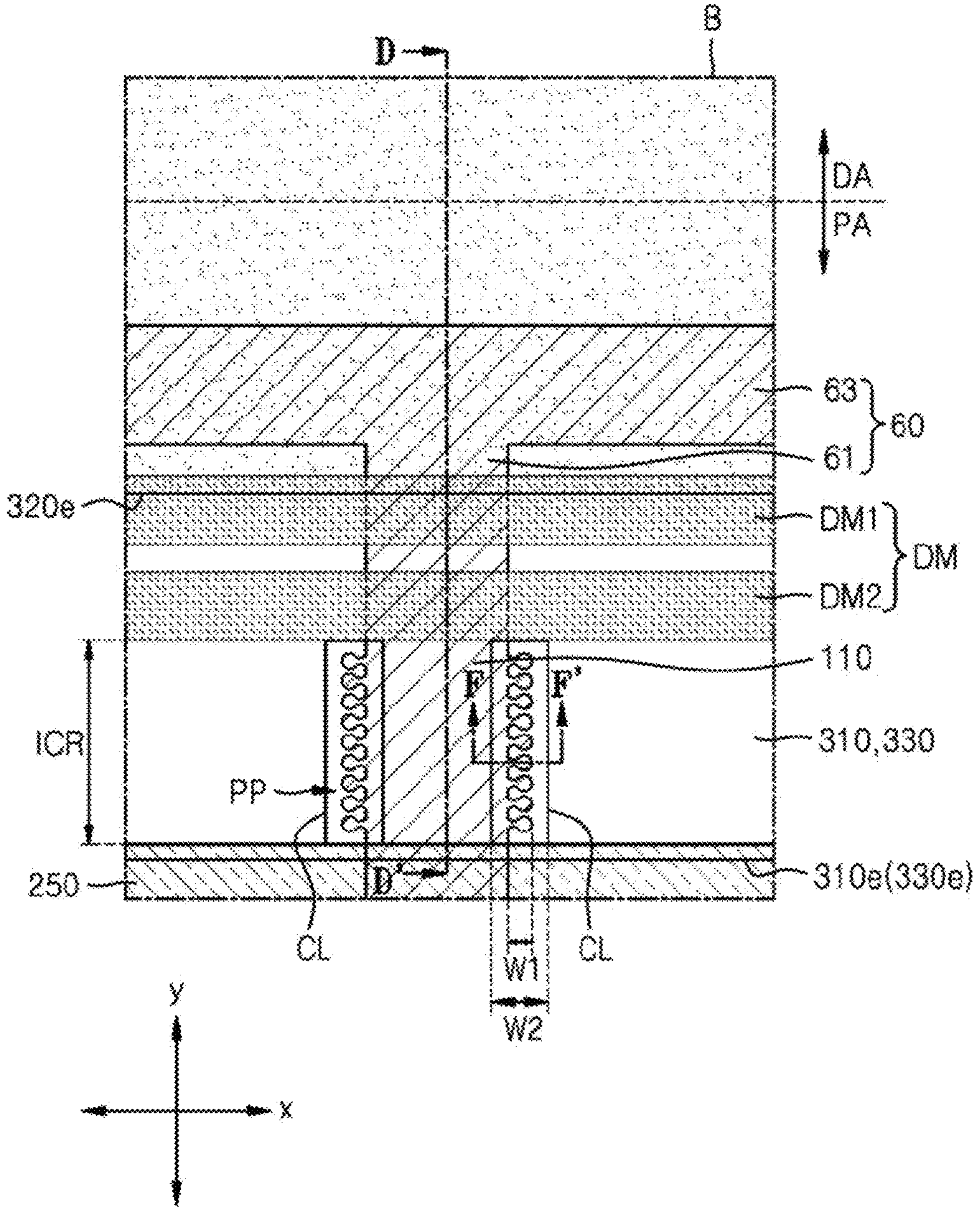
FIG. 15 is a schematic plan view of a portion of a display panel according to some embodiments, and is an enlarged plan view of a region B of FIG. 3.
Figure 16:
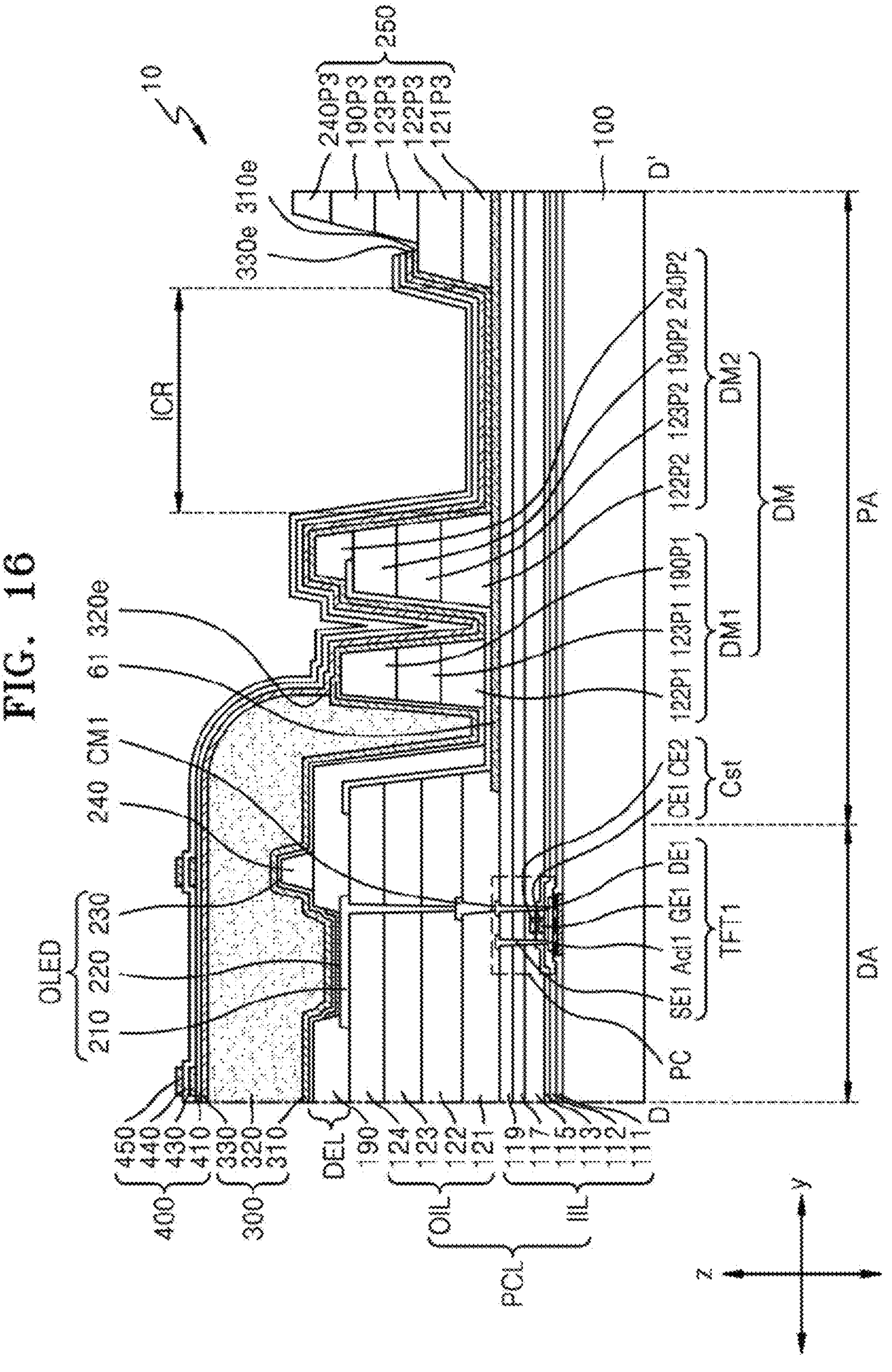
FIG. 16 is a schematic cross-sectional view of a portion of a display panel according to some embodiments, taken along the line D-D' of FIG. 15.

FIG. 15 is a schematic plan view of a portion of a display panel according to some embodiments, and is an enlarged plan view of a region B of FIG. 3. FIG. 16 is a schematic cross-sectional view of a portion of a display panel 10 according to some embodiments, and is a cross-sectional view of the display panel 10 taken along the line D-D' of FIG. 15. The display panel 10 of FIG. 16 is different from that of FIG. 15 in that the display panel 10 of FIG. 16 shows a first driving voltage supply line 61, and a redundant description thereof is omitted.

Referring to FIGS. 15 and 16, a driving voltage supply line 60 may be arranged in a peripheral area PA of the display panel 10. Also, a dam DM and a bank 250 may be arranged in the peripheral area PA of the display panel 10.

The dam DM may include a first dam DM1 and a second dam DM2, which are spaced apart from each other. The first dam DM1 may surround the display area DA, and the second dam DM2 may be arranged to surround the first dam DM1 from the outside of the first dam DM1. Because the first dam DM1 is arranged along the circumference of the display area DA, it may be understood that the second dam DM2 is also arranged along the circumference of the display area DA.

A portion of the driving voltage supply line 60 may be located closer to the display area DA than the first dam DM1. FIG. 15 illustrates an example in which a third driving voltage supply line 63 is arranged inside the first dam DM1 and is located closer to the display area DA than the first dam DM1. A portion of the driving voltage supply line 60, for example, the first driving voltage supply line 61, may extend in a direction crossing the first dam DM1 and the second dam DM2 and may overlap the first dam DM1 and the second dam DM2. The first driving voltage supply line 61 may extend from the third driving voltage supply line 63.

The first driving voltage supply line 61 may extend in a second direction (e.g., a y direction) toward the edge of the substrate 100. The first driving voltage supply line 61 may overlap a first area ICR. In other words, the first driving voltage supply line 61 may pass through the first area ICR.

The bank 250 may be further located outside the second dam DM2. The bank 250 may at least partially surround the second dam DM2. The bank 250 may overlap a portion of the driving voltage supply line 60, for example, the first driving voltage supply line 61.

According to some embodiments, an edge 320*e* of an organic encapsulation layer 320 may be located on the first dam DM1. Alternatively, according to some embodiments, the edge 320*e* of the organic encapsulation layer 320 may be located between the display area DA and the first dam DM1.

First and second inorganic encapsulation layers 310 and 330 may extend to the outside of the driving voltage supply line 60. The first and second inorganic encapsulation layers 310 and 330 may overlap the first driving voltage supply line 61, the third driving voltage supply line 63, the first dam DM1, and the second dam DM2. As shown in FIGS. 15 and 16, the first and second inorganic encapsulation layers 310 and 330 may extend to the first area ICR through the edge 320*e* of the organic encapsulation layer 320. The first and second inorganic encapsulation layers 310 and 330 may be arranged to cover the first area ICR. According to some embodiments, edges 310*e* and 330*e* of the first and second inorganic encapsulation layers 310 and 330 may be located on the bank 250.

According to some embodiments, a conductive line 110 may be arranged in the first area ICR. In this case, the conductive line 110 may be the first driving voltage supply line 61. For example, the first driving voltage supply line 61 overlapping the first area ICR may correspond to the conductive line 110.

According to some embodiments, the conductive line 110 may include a protrusion pattern PP extending in the second direction (e.g., the y direction) and protruding in a first direction (e.g., an x direction) crossing the second direction. That is, the first driving voltage supply line 61 may include protrusion patterns PP protruding in the first direction (e.g., the x direction) in a portion overlapping the first area ICR. The protrusion patterns PP may be formed on the edge of the conductive line 110 and may have a shape protruding outward on an x-y plane.

The edge of the conductive line 110 (e.g., the first driving voltage supply line 61) may be a path through which external moisture and oxygen move. When the length of the edge of the conductive line 110 increases, a path through which external moisture and oxygen move may increase. According to some embodiments, when the protrusion patterns PP are provided on the edge of the conductive line 110, the length of the edge of the conductive line 110 increases, and thus, propagation of external moisture and oxygen to the display area DA may be prevented or reduced, and thus, damage to the organic light-emitting diode OLED (see FIG. 13) may be prevented or reduced. However, the disclosure is not limited thereto. The edge of the conductive line 110 may be formed in various shapes. For example, in some embodiments, the edge of the conductive line 110 may have a straight shape in a plan view.

The first and second inorganic encapsulation layers 310 and 330 may extend to the first area ICR and may cover a portion of the conductive line 110 (e.g., the first driving voltage supply line 61). The first and second inorganic encapsulation layers 310 and 330 may be continuously arranged on a portion of the upper surface of the conductive line 110, a portion of the side surface corresponding to the edge of the conductive line 110, and a portion of the upper surface of the inorganic insulating layer IIL located just below the conductive line 110. The first inorganic encapsulation layer 310 may be located in direct contact with a portion of the conductive line 110 and a portion of the inorganic insulating layer IIL located below the conductive line 110.

A cover conductive layer CL may be located in the first area ICR. The cover conductive layer CL may overlap the edge of the conductive line 110 (e.g., the first driving voltage supply line 61) between the second dam DM2 and the bank 250. The cover conductive layer CL may be located on the second inorganic encapsulation layer 330. That is, the cover conductive layer CL may overlap the edge of the conductive line 110 covered by the first and second inorganic encapsulation layers 310 and 330. The cover conductive layer CL may be arranged to overlap at least one edge of the conductive line 110. According to some embodiments, the cover conductive layer CL may be arranged to cover both edges of the conductive line 110.

A width W2 of the cover conductive layer CL may be greater than a width W1 of the protrusion pattern PP of the conductive line 110 (e.g., the first driving voltage supply line 61). That is, the cover conductive layer CL may overlap all of the protrusion patterns PP of the conductive line 110.

The cover conductive layer CL may cover a portion of the encapsulation layer 300 (i.e., the first and second inorganic encapsulation layers 310 and 330) covering the edge of the conductive line 110, and thus may prevent, reduce, or minimize cracks, which may occur in the first and second inorganic encapsulation layers 310 and 330 due to the undercut structure of the conductive line 110, from propagating to other layers or external moisture or oxygen from being introduced through the cracks.

Figure 17:
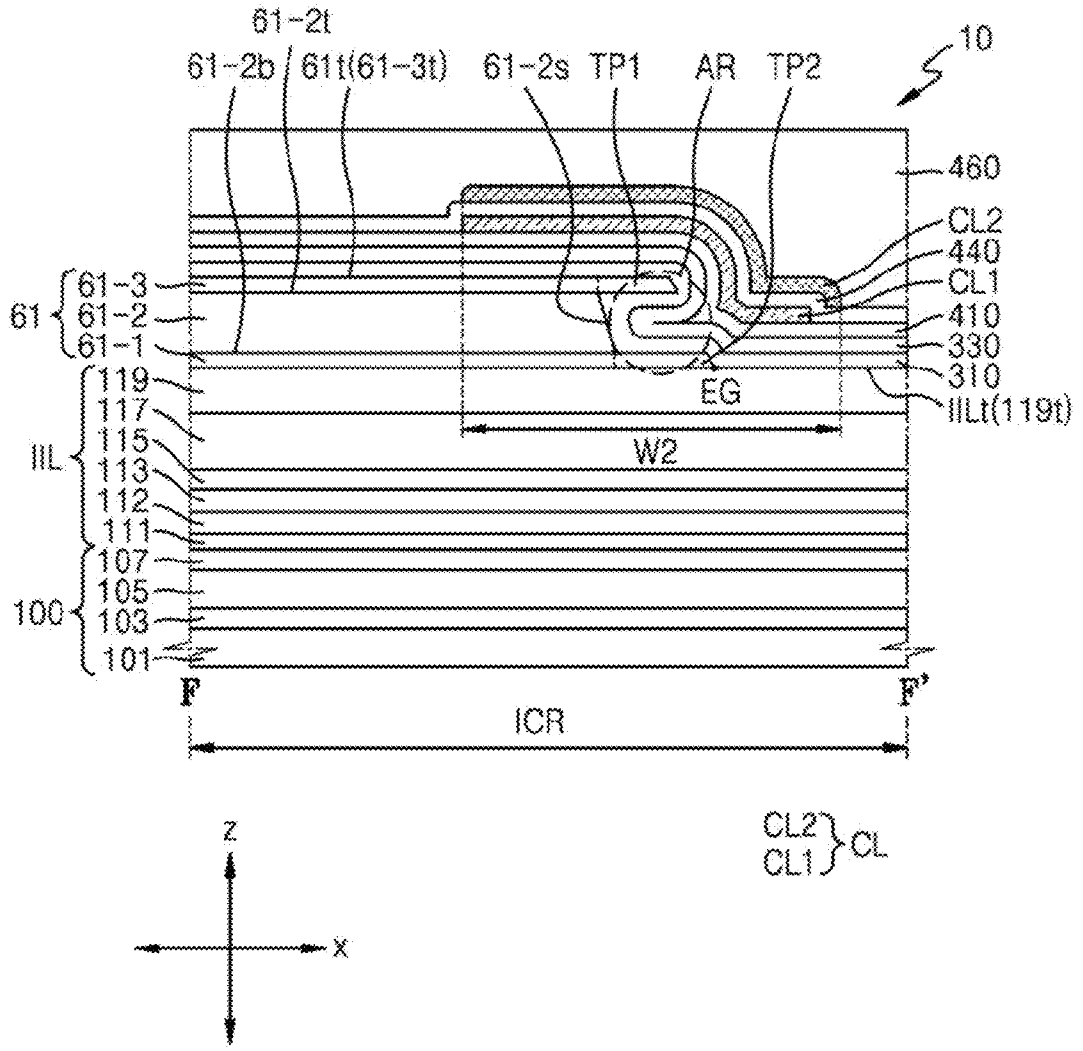
FIG. 17 is a schematic cross-sectional view of a portion of a display panel according to some embodiments, taken along the line F-F' of FIG. 15.
Figure 18:
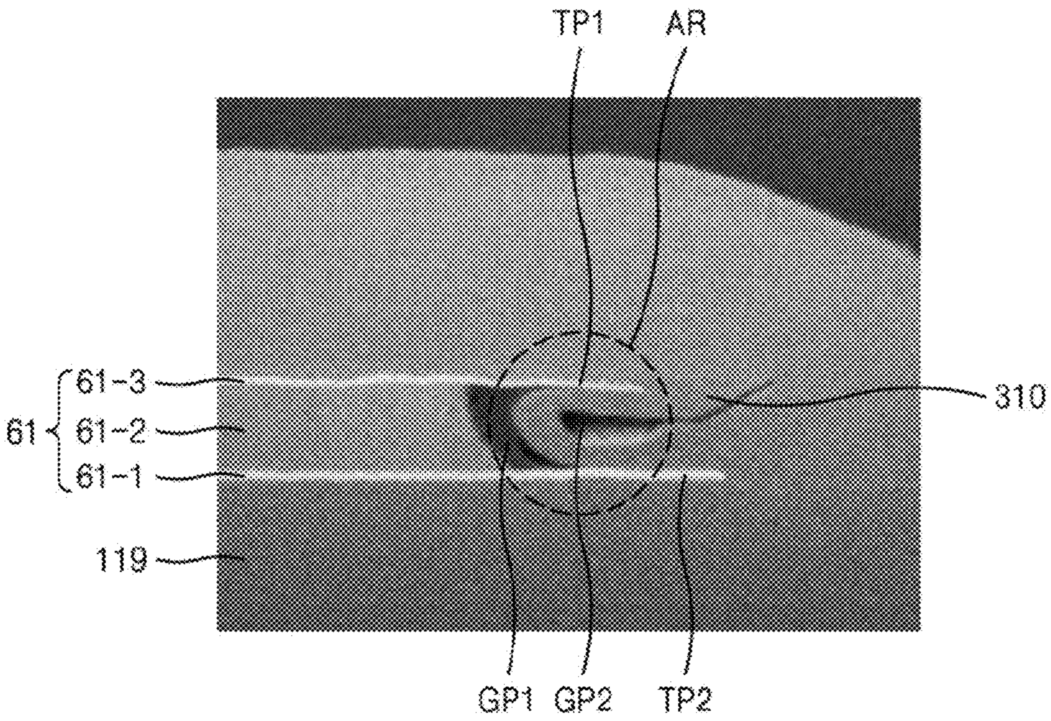
FIG. 18 is an image of a portion of a display panel observed by a scanning electron microscope (SEM), according to some embodiments.

FIG. 17 is a schematic cross-sectional view of a portion of a display panel 10 according to some embodiments, taken along the line F-F' of FIG. 15. FIG. 18 is an image of a portion of a display panel observed by a scanning electron microscope (SEM), according to some embodiments.

Referring to FIG. 17, a substrate 100 may be arranged in a first area ICR. According to some embodiments, the substrate 100 may include a first base layer 101, a first barrier layer 103, a second base layer 105, and a second barrier layer 107.

An inorganic insulating layer IIL may be located on the substrate 100. The inorganic insulating layer IIL may include a buffer layer 111, a first gate insulating layer 112, a second gate insulating layer 113, a first inorganic insulating layer 115, a second inorganic insulating layer 117, and an interlayer insulating layer 119, which are sequentially stacked.

The conductive line 110 (see FIG. 15), for example, a first driving voltage supply line 61, may be arranged between the inorganic insulating layer IIL and the encapsulation layer 300.

According to some embodiments, the first driving voltage supply line 61 may have a triple-layered structure including a first sub-layer 61-1, a second sub-layer 61-2, and a third sub-layer 61-3, which are sequentially stacked. According to some embodiments, each of the first to third sub-layers 61-1, 61-2, and 61-3 may include a conductive material including Mo, Al, Cu, Ti, or the like. According to some embodiments, the first sub-layer 61-1 and the third sub-layer 61-3 may include the same material. For example, the first sub-layer 61-1 and the third sub-layer 61-3 may include Ti. According to some embodiments, the second sub-layer 61-2 may include a material that is different from those of the first sub-layer 61-1 and the third sub-layer 61-3. For example, the second sub-layer 61-2 may include Al.

The width of the third sub-layer 61-3 may be greater than the width of an upper surface 61-2*t* of the second sub-layer 61-2. In a cross-sectional view, the third sub-layer 61-3 may include a tip TP1 protruding laterally from a point where a side surface 61-2*s* and the upper surface 61-2*t* of the second sub-layer 61-2 meet each other. Also, the width of the first sub-layer 61-1 may be greater than the width of a lower surface 61-2*b* of the second sub-layer 61-2. In a cross-sectional view, the first sub-layer 61-1 may include a tip TP2 protruding laterally from a point where the side surface 61-2*s* of the second sub-layer 61-2 and the lower surface 61-2*b* of the second sub-layer 61-2 meet each other.

Such a structure may be formed as the second sub-layer 61-2 is over-etched compared to the first sub-layer 61-1 and the third sub-layer 61-3 by an etchant used in an etching process. In addition, when a time of exposure by the etchant increases according to a process of manufacturing the display panel 10, the tip TP2 of the first sub-layer 61-1 and the tip TP1 of the third sub-layer 61-3 may be formed to be longer.

For example, as described with reference to FIGS. 10A to 10C, when an etching process is performed in the process of forming the sacrificial layer 1000 (see FIG. 10A), the first driving voltage supply line 61 arranged in the first area ICR may also be exposed to an etchant. Alternatively, as described with reference to FIGS. 13A to 13C, when an etching process is performed in the process of forming the separator MD, the first driving voltage supply line 61 arranged in the first area ICR may also be exposed to an etchant. In this case, compared to the case where the sacrificial layer 1000 and/or the separator MD is not formed in the process of manufacturing the display panel 10, the first driving voltage supply line 61 may be exposed to the etchant for a longer period of time, and thus, the tip TP2 of the first sub-layer 61-1 and the tip TP1 of the third sub-layer 61-3 may be formed to be longer.

In some embodiments, the tip TP1 of the third sub-layer 61-3 may be partially or entirely removed by an external force in a subsequent process. Alternatively, in some embodiments, the tip TP1 of the third sub-layer 61-3 may bend in an upward direction (e.g., a diagonal direction with respect to x and z directions) with respect to a protruding direction (e.g., the x direction).

According to some embodiments, the first inorganic encapsulation layer 310 and the second inorganic encapsulation layer 330 of the encapsulation layer 300 may extend to the first area ICR and cover the edge of the first driving voltage supply line 61. The first inorganic encapsulation layer 310 and the second inorganic encapsulation layer 330 may be arranged to cover the tips TP1 and TP2 of the first driving voltage supply line 61. For example, the first inorganic encapsulation layer 310 may be continuously arranged to cover an upper surface 61-3*t* of the third sub-layer 61-3 of the first driving voltage supply line 61, a lower surface of the third sub-layer 61-3 exposed by the tip TP2, the side surface 61-2*s* of the second sub-layer 61-2, an upper surface of the first sub-layer 61-1 exposed by the tip TP1, and at least a portion of an upper surface 119*t* of the interlayer insulating layer 119.

Referring to FIGS. 17 and 18, due to an undercut structure of the first driving voltage supply line 61, gaps GP1 and GP2 (see FIG. 18) may be generated in an area AR between a side surface of the first driving voltage supply line 61, for example, the side surface 61-2*s* of the second sub-layer 61-2, and the first inorganic encapsulation layer 310 or between the first inorganic encapsulation layer 310 and the second inorganic encapsulation layer 330. The generated gaps GP1 and GP2 may function as a movement path for external moisture and oxygen. In addition, the tip TP1 of the first driving voltage supply line 61 may generate a crack in the encapsulation layer 300 thereon and form a moisture permeable path.

According to some embodiments, a cover conductive layer CL may be arranged to overlap the edge of the first driving voltage supply line 61 covered by the encapsulation layer 300. That is, the cover conductive layer CL may be arranged to cover a portion of the encapsulation layer 300 covering the edge of the first driving voltage supply line 61, for example, a portion of the first inorganic encapsulation layer 310 and/or the second inorganic encapsulation layer 330. The cover conductive layer CL may prevent or reduce cracks from propagating to other layers or external moisture or oxygen from being introduced through the cracks, the cracks occurring in the first inorganic encapsulation layer 310 and the second inorganic encapsulation layer 330 due to the tip TP1 of the first driving voltage supply line 61 and the undercut structure thereof.

Referring to FIG. 17, the cover conductive layer CL may overlap the tips TP1 and TP2 of the first driving voltage supply line 61. A width W2 of the cover conductive layer CL may be greater than the protruding lengths of the tips TP1 and TP2 of the first driving voltage supply line 61. That is, the cover conductive layer CL may be arranged to completely cover the tips TP1 and TP2 of the first driving voltage supply line 61. According to some embodiments, the distance from the tip of the first driving voltage supply line 61, for example, an end EG of the tip TP2 of the first sub-layer 61-1, to one end of the cover conductive layer CL may be 1 μm or more. In some embodiments, the distance from the end EG of the tip TP2 of the first sub-layer 61-1 to one end of the cover conductive layer CL may be 2 μm or more.

According to some embodiments, the cover conductive layer CL may be continuously arranged to overlap an upper surface 61*t* of the first driving voltage supply line 61, a side surface corresponding to the edge of the first driving voltage supply line 61, and an upper surface IILt of the inorganic insulating layer IIL positioned below the first driving voltage supply line 61.

The cover conductive layer CL may include at least one conductive layer. According to some embodiments, the cover conductive layer CL may include a plurality of conductive layers. For example, the cover conductive layer CL may include a first conductive layer CL1 and a second conductive layer CL2.

According to some embodiments, at least one of the protective layer 410, the second touch insulating layer 440, and the third touch insulating layer 460 of the touch sensor layer 400 may extend to the first area ICR and may be located above the first driving voltage supply line 61 covered by the first inorganic encapsulation layer 310 and the second inorganic encapsulation layer 330.

Referring to FIG. 17, a protective layer 410 may be arranged to cover the second inorganic encapsulation layer 330. The first conductive layer CL1 may be located on the protective layer 410. The first conductive layer CL1 may overlap an edge of the first driving voltage supply line 61. A second touch insulating layer 440 may be located on the first conductive layer CL1 and the protective layer 410 to cover the first conductive layer CL1. The second conductive layer CL2 may be located on the second touch insulating layer 440. The second conductive layer CL2 may overlap an edge of the first driving voltage supply line 61. A third touch insulating layer 460 may be located on the second conductive layer CL2 and the second touch insulating layer 440 to cover the second conductive layer CL2.

According to some embodiments, the cover conductive layer CL may include the same material as at least one of the first touch conductive layer 430 and the second touch conductive layer 450 of the touch sensor layer 400 described above with reference to FIG. 8. According to some embodiments, the first conductive layer CL1 may include the same material as the first touch conductive layer 430 and may be formed in the same process as the first touch conductive layer 430. The second conductive layer CL2 may include the same material as the second touch conductive layer 450 and may be formed in the same process as the second touch conductive layer 450. For example, each of the first conductive layer CL1 and the second conductive layer CL2 may include at least one of Mo, Al, Cu, and Ti.

According to some embodiments, by simultaneously (or concurrently) forming the first conductive layer CL1 and the second conductive layer CL2 in a process of forming the first and second touch conductive layers 430 and 450 of the touch sensor layer 400, the cover conductive layer CL overlapping the edge of the first driving voltage supply line 61 may be formed without adding a separate process. Therefore, there is an economical advantage in the process.

Figure 19:
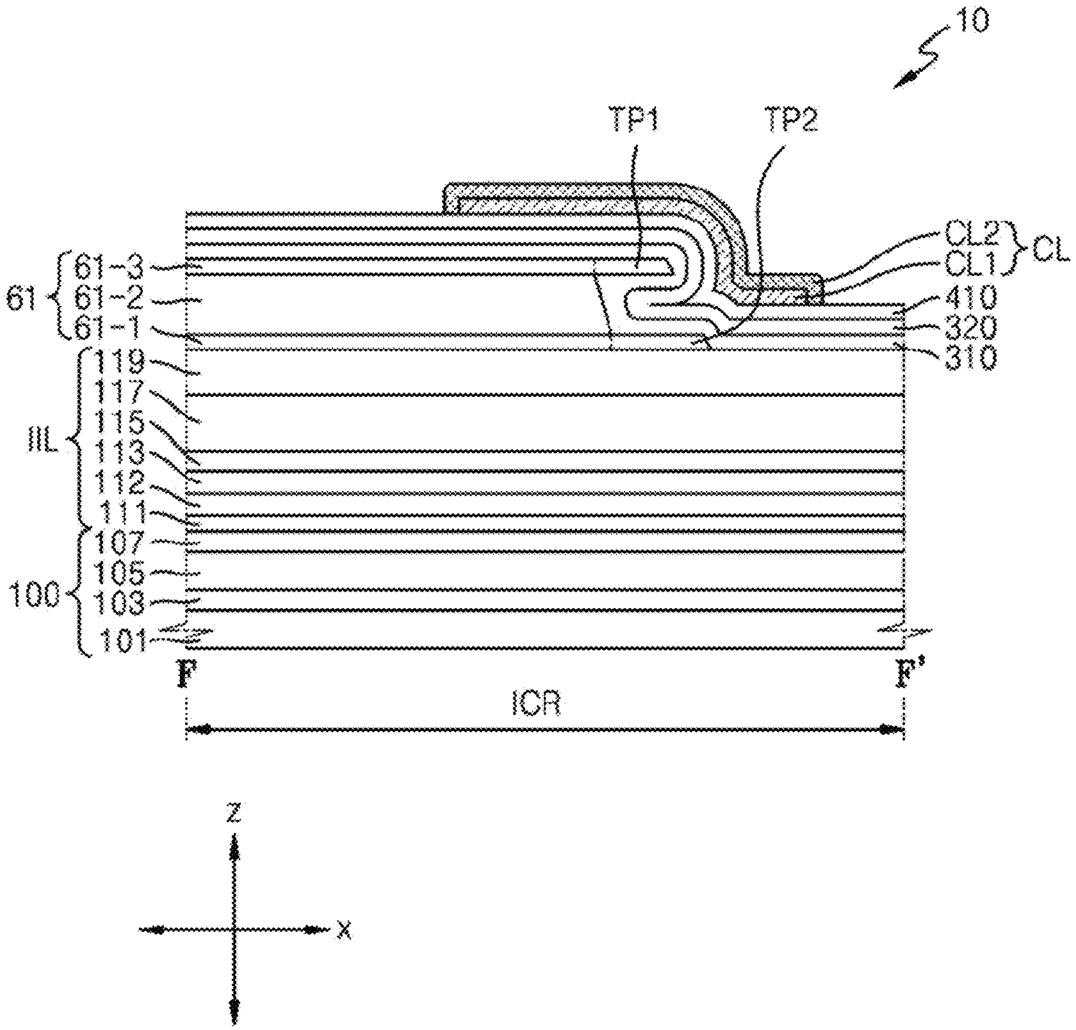
FIG. 19 is a schematic cross-sectional view of a portion of a display panel according to some embodiments.
Figure 20:
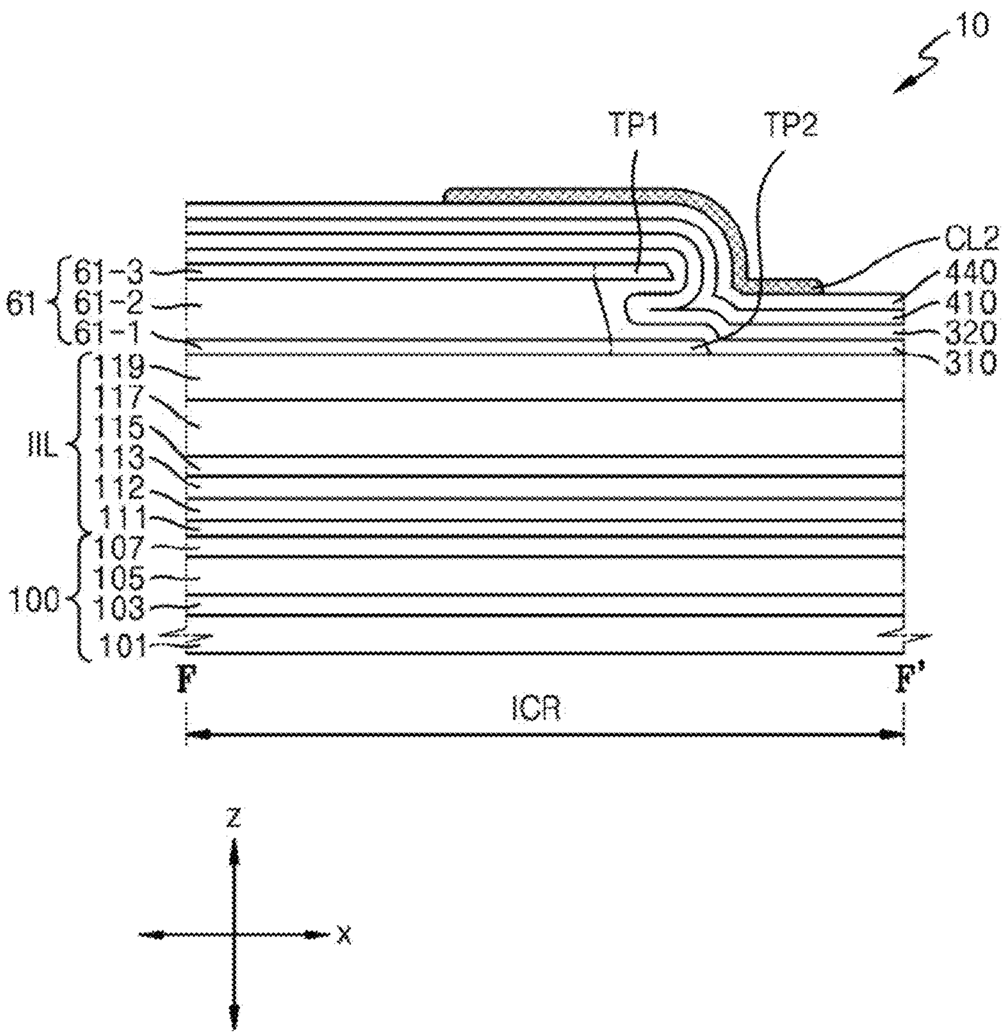
FIG. 20 is a schematic cross-sectional view of a portion of a display panel according to some embodiments.

FIGS. 19 and 20 are schematic cross-sectional views of a portion of a display panel 10 according to some embodiments as modifications of FIG. 17.

Referring to FIGS. 19 and 20, at least one of the protective layer 410, the second touch insulating layer 440, and the third touch insulating layer 460 of the touch sensor layer 400 may not be extended to the first area ICR. For example, at least one of the protective layer 410, the second touch insulating layer 440, and the third touch insulating layer 460 may not be located above the first driving voltage supply line 61 covered by the first inorganic encapsulation layer 310 and the second inorganic encapsulation layer 330 in the first area ICR.

According to some embodiments, the second touch insulating layer 440 and/or the third touch insulating layer 460 may not be arranged in the first area ICR. When the second touch insulating layer 440 is not arranged in the first area ICR, the first conductive layer CL1 and the second conductive layer CL2 constituting the cover conductive layer CL may be in direct contact with each other.

According to some embodiments, the cover conductive layer CL may include only one of the first conductive layer CL1 and the second conductive layer CL2. FIG. illustrates an example in which the cover conductive layer CL does not include the first conductive layer CL1 but includes the second conductive layer CL2. However, the disclosure is not limited thereto. According to some embodiments, the cover conductive layer CL may include only the first conductive layer CL1 without including the second conductive layer CL2.

With reference to FIGS. 15 to 20, as an example of the conductive line 110, the first driving voltage supply line 61 and its surrounding structure have been described. However, the disclosure is not limited thereto. The second driving voltage supply line 62, the first common voltage supply line 71, and the second common voltage supply line 73, which extend in a direction (e.g., the y direction) crossing the dam DM like the first driving voltage supply line 61, may each have a structure that is the same as or similar to the structure described with reference to FIGS. 15 to 20. For example, the cover conductive layer CL may be arranged to overlap the edge of each of the second driving voltage supply line 62, the first common voltage supply line 71, and the second common voltage supply line 73, which overlap the first area ICR.

According to one or more embodiments, by arranging at least one conductive layer on an encapsulation layer covering a portion of a power supply line to overlap the edge of a portion of the power supply line, a moisture permeable path may be prevented from being formed along the edge of the power supply line, and thus, a display apparatus with relatively improved reliability may be realized. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
- a substrate having a display area and a peripheral area outside the display area;
- an inorganic insulating layer in the display area and the peripheral area;
- a light-emitting diode in the display area;
- an encapsulation layer disposed on the light-emitting diode and including a first inorganic encapsulation layer, a second inorganic encapsulation layer on the first inorganic encapsulation layer, and an organic encapsulation layer between the first inorganic encapsulation layer and the second inorganic encapsulation layer;
- a dam disposed in the peripheral area and surrounding the display area; and a power supply line on the inorganic insulating layer in the peripheral area, wherein a portion of the power supply line overlaps the dam, the first inorganic encapsulation layer and the second inorganic encapsulation layer extend to the peripheral area and cover the portion of the power supply line, and an edge of the portion of the power supply line overlaps at least one conductive layer on the second inorganic encapsulation layer, wherein the at least one conductive layer is continuously arranged to overlap an upper surface of the portion of the power supply line, a side surface corresponding to the edge of the portion of the power supply line, and an upper surface of the inorganic insulating layer located below the portion of the power supply line.

2. The display apparatus of claim 1, wherein the edge of the portion of the power supply line overlaps the at least one conductive layer between the dam and an edge of the substrate.

3. The display apparatus of claim 1, wherein the power supply line has a triple-layered structure including a first sub-layer, a third sub-layer on the first sub-layer, and a second sub-layer between the first sub-layer and the third sub-layer, wherein the first sub-layer and the third sub-layer include a same material.

4. The display apparatus of claim 3, wherein the first sub-layer and the third sub-layer of the power supply line include titanium, and the second sub-layer of the power supply line includes aluminum.

5. The display apparatus of claim 3, wherein the third sub-layer of the power supply line includes a tip protruding laterally from a point where a side surface and an upper surface of the second sub-layer meet each other.

6. The display apparatus of claim 5, wherein the at least one conductive layer overlaps the tip of the power supply line.

7. The display apparatus of claim 1, wherein the edge of the portion of the power supply line includes protrusion patterns protruding in a direction crossing a direction in which the portion of the power supply line extends in a plan view.

8. A display apparatus comprising:

a substrate having a display area and a peripheral area outside the display area;

an inorganic insulating layer in the display area and the peripheral area;

a light-emitting diode in the display area;

an encapsulation layer disposed on the light-emitting diode and including a first inorganic encapsulation layer, a second inorganic encapsulation layer on the first inorganic encapsulation layer, and an organic encapsulation layer between the first inorganic encapsulation layer and the second inorganic encapsulation layer;

a dam disposed in the peripheral area and surrounding the display area;

a power supply line on the inorganic insulating layer in the peripheral area, wherein a portion of the power supply line overlaps the dam, the first inorganic encapsulation layer and the second inorganic encapsulation layer extend to the peripheral area and cover the portion of the power supply line, and an edge of the portion of the power supply line overlaps at least one conductive layer on the second inorganic encapsulation layer; and a touch sensor layer on the encapsulation layer, wherein the touch sensor layer includes:

a protective layer;

a first touch conductive layer on the protective layer;

a first touch insulating layer covering the first touch conductive layer;

a second touch conductive layer on the first touch insulating layer; and a second touch insulating layer covering the second touch conductive layer.

9. The display apparatus of claim 8, wherein the at least one conductive layer includes a first conductive layer, wherein the first conductive layer includes a same material as the first touch conductive layer or the second touch conductive layer.

10. The display apparatus of claim 8, wherein the at least one conductive layer includes a first conductive layer and a second conductive layer on the first conductive layer, wherein the first conductive layer includes a same material as the first touch conductive layer, and the second conductive layer includes a same material as the second touch conductive layer.

11. The display apparatus of claim 10, wherein the second conductive layer is in direct contact with the first conductive layer.

12. The display apparatus of claim 8, wherein at least one of the protective layer, the first touch insulating layer, and the second touch insulating layer extends to the peripheral area and is above the portion of the power supply line covered by the first inorganic encapsulation layer and the second inorganic encapsulation layer.

13. A display apparatus comprising:

a substrate having a display area and a peripheral area outside the display area;

an inorganic insulating layer in the display area and the peripheral area;

a light-emitting diode in the display area;

an encapsulation layer disposed on the light-emitting diode and including a first inorganic encapsulation layer, a second inorganic encapsulation layer on the first inorganic encapsulation layer, and an organic encapsulation layer between the first inorganic encapsulation layer and the second inorganic encapsulation layer; and a conductive line on the peripheral area, wherein the first inorganic encapsulation layer and the second inorganic encapsulation layer pass an edge of the organic encapsulation layer in the peripheral area and cover a portion of the conductive line, the first inorganic encapsulation layer in the peripheral area is in direct contact with a portion of the conductive line and a portion of the inorganic insulating layer, and an edge of the portion of the conductive line in the peripheral area overlaps at least one conductive layer on the second inorganic encapsulation layer, wherein the conductive line has a triple-layered structure including a first sub-layer, a third sub-layer on the first sub-layer, and a second sub-layer between the first sub-layer and the third sub-layer, wherein the first sub-layer and the third sub-layer include a same material.

14. The display apparatus of claim 13, wherein the conductive line includes a power supply line.

15. The display apparatus of claim 13, further comprising:
a dam in the peripheral area; and
a bank in the peripheral area, the bank being spaced apart from the dam,
wherein the edge of the portion of the conductive line overlaps the at least one conductive layer between the dam and the bank.

16. The display apparatus of claim 13, wherein the first sub-layer and the third sub-layer of the conductive line include titanium, and the second sub-layer of the conductive line includes aluminum.

17. The display apparatus of claim 13, wherein the third sub-layer of the conductive line includes a tip protruding laterally from a point where a side surface and an upper surface of the second sub-layer meet each other.

18. The display apparatus of claim 13, further comprising a touch sensor layer on the encapsulation layer,
wherein the touch sensor layer includes:
a protective layer;
a first touch conductive layer on the protective layer;
a first touch insulating layer covering the first touch conductive layer;
a second touch conductive layer on the first touch insulating layer; and
a second touch insulating layer covering the second touch conductive layer.

19. The display apparatus of claim 18, wherein the at least one conductive layer includes a first conductive layer,
wherein the first conductive layer includes a same material as the first touch conductive layer or the second touch conductive layer.

20. The display apparatus of claim 18, wherein the at least one conductive layer includes a first conductive layer and a second conductive layer on the first conductive layer,
wherein the first conductive layer includes a same material as the first touch conductive layer, and the second conductive layer includes a same material as the second touch conductive layer.

21. The display apparatus of claim 18, wherein at least one of the protective layer, the first touch insulating layer, and the second touch insulating layer extends to the peripheral area and is above the portion of the conductive line covered by the first inorganic encapsulation layer and the second inorganic encapsulation layer.

* * * * *